(12) United States Patent
Ishimi et al.

(10) Patent No.: US 11,750,210 B2
(45) Date of Patent: Sep. 5, 2023

(54) SEMICONDUCTOR DEVICE AND DECODING METHODS

(71) Applicant: RENESAS ELECTRONICS CORPORATION, Tokyo (JP)

(72) Inventors: Koichi Ishimi, Tokyo (JP); Akio Fujii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/319,832

(22) Filed: May 13, 2021

(65) Prior Publication Data

US 2021/0384917 A1 Dec. 9, 2021

(30) Foreign Application Priority Data

Jun. 3, 2020 (JP) .............................. JP2020-096553

(51) Int. Cl.
| | | |
|---|---|---|
| *H03M 5/12* | (2006.01) | |
| *H04L 1/00* | (2006.01) | |
| *H04L 7/00* | (2006.01) | |
| *H04L 25/49* | (2006.01) | |
| *H02M 1/00* | (2006.01) | |

(52) U.S. Cl.
CPC ............ *H03M 5/12* (2013.01); *H04L 1/0061* (2013.01); *H04L 7/0016* (2013.01); *H04L 25/4904* (2013.01); *H02M 1/0012* (2021.05)

(58) Field of Classification Search
CPC ..... H02M 1/0012; H03M 5/12; H04L 1/0061; H04L 25/4904; H04L 7/0016; H04L 7/0338
See application file for complete search history.

(56) References Cited

U.S. PATENT DOCUMENTS 6,873,642 B1 * 3/2005 Fey ........................ H04L 25/069
375/342

FOREIGN PATENT DOCUMENTS

JP 2011-061525 A 3/2011

\* cited by examiner

*Primary Examiner* — Nader Bolourchi
(74) *Attorney, Agent, or Firm* — McDermott Will & Emery LLP

(57) ABSTRACT

The present invention is to reduce detection of an erroneous edge caused by variation in a case of a sampling frequency that is not larger than a data transmission frequency. A semiconductor device includes: a data reception circuit configured to receive first data at first time and receive second data at second time; and an edge recognition circuit configured to set a range and detect an edge contained in the range. The edge recognition circuit includes a measurement circuit configured to measure a first period taken from the reception of the first data to the reception of the second data, and is configured to determine the range in which the edge contained in the data that is received by the data reception circuit is detected, on the basis of the first period.

20 Claims, 27 Drawing Sheets

FIG. 27

| IN | D | Q1 | Q2 |
|---|---|---|---|
| -3 | -1 | 0 | +2 |
|  | 0 | -1 | +1 |
|  | +1 | 0 | +1 |
| -2 | -1 | -1 | +1 |
|  | 0 | 0 | +1 |
|  | +1 | -1 | +1 |
| -1 | -1 | 0 | +1 |
|  | 0 | -1 | 0 |
|  | +1 | 0 | 0 |
| 0 | -1 | -1 | 0 |
|  | 0 | 0 | 0 |
|  | +1 | +1 | 0 |
| +1 | -1 | 0 | 0 |
|  | 0 | +1 | 0 |
|  | +1 | 0 | -1 |
| +2 | -1 | +1 | -1 |
|  | 0 | 0 | -1 |
|  | +1 | +1 | -1 |
| +3 | -1 | 0 | -1 |
|  | 0 | +1 | -1 |
|  | +1 | 0 | -2 | ns
SEMICONDUCTOR DEVICE AND DECODING METHODS

CROSS-REFERENCE TO RELATED APPLICATIONS

The disclosure of Japanese Patent Application No. 2020-096553 filed on Jun. 3, 2020, including the specification, drawings and abstract is incorporated herein by reference in its entirety.

BACKGROUND

The present application relates to a semiconductor device, and is applicable to a semiconductor device including, for example, a decoding circuit using Manchester coding or others.

When certain or more differences occur between transmission and reception reference clocks, a communication system has an issue of failure to receive the normal data or others.

As one method for preventing this issue, a high-speed data sampling is exemplified. This is a method of setting a plurality of sampling timings in one time slot and determining the data from results of the sampling timings. The time slot is time taken for transmission of one-bit data.

And, the Manchester coding is adopted as a method for preventing the issue of failure to receive the normal data when certain or more differences occur between the transmission and reception reference clocks due to difference in a frequency or a phase therebetween. In the Manchester coding, for example, a potential is set to definitely change in one time slot so that a logical value becomes "1" when the potential changes from a high potential to a low potential while the logical value becomes "0" when the voltage changes from a low potential to a high potential in one time slot (to create a middle edge).

There are disclosed techniques listed below.

[Patent Document 1] Japanese Unexamined Patent Application Publication No. 2011-61525

SUMMARY

At the time of the data transmission, the data is delayed by noises such as a jitter that is signal waveform fluctuation in a direction of a time axis. An amount of the delay is not constant but varies. When a sampling frequency is not larger than a frequency of the data transmission, there is a possibility of detection of an incorrect edge because of the variation. If clock synchronization can be taken between the transmission and the reception sides, or if a sufficiently-large sampling frequency can be set, the issue as described above does not arise. However, it is often difficult to take the synchronization due to limitation of circuit design.

According to an aspect of the present application, a semiconductor device includes: a data reception circuit configured to receive first data at first time and receive second data at second time; and an edge recognition circuit configured to set a range and detect an edge within the range. The edge recognition circuit includes a measurement circuit configured to measure a first period taken from reception of the first data to reception of the second data, and is configured to determine the range for detecting the edge contained in the data received by the data reception circuit, on the basis of the first period.

According to the semiconductor device, when the sampling frequency is not larger than the frequency of the data transmission, the detection of the incorrect edge due to the variation can be reduced.

BRIEF DESCRIPTION OF THE DRAWINGS

FIG. 27 is a diagram showing a truth-value table of a correction circuit shown in FIG. 26.

DETAILED DESCRIPTION

Embodiments and working examples will be described below with reference to the accompanying drawings. In the following description, the same reference symbols are attached to the same elements, and the repetitive description thereof will be omitted.

Figure 1:
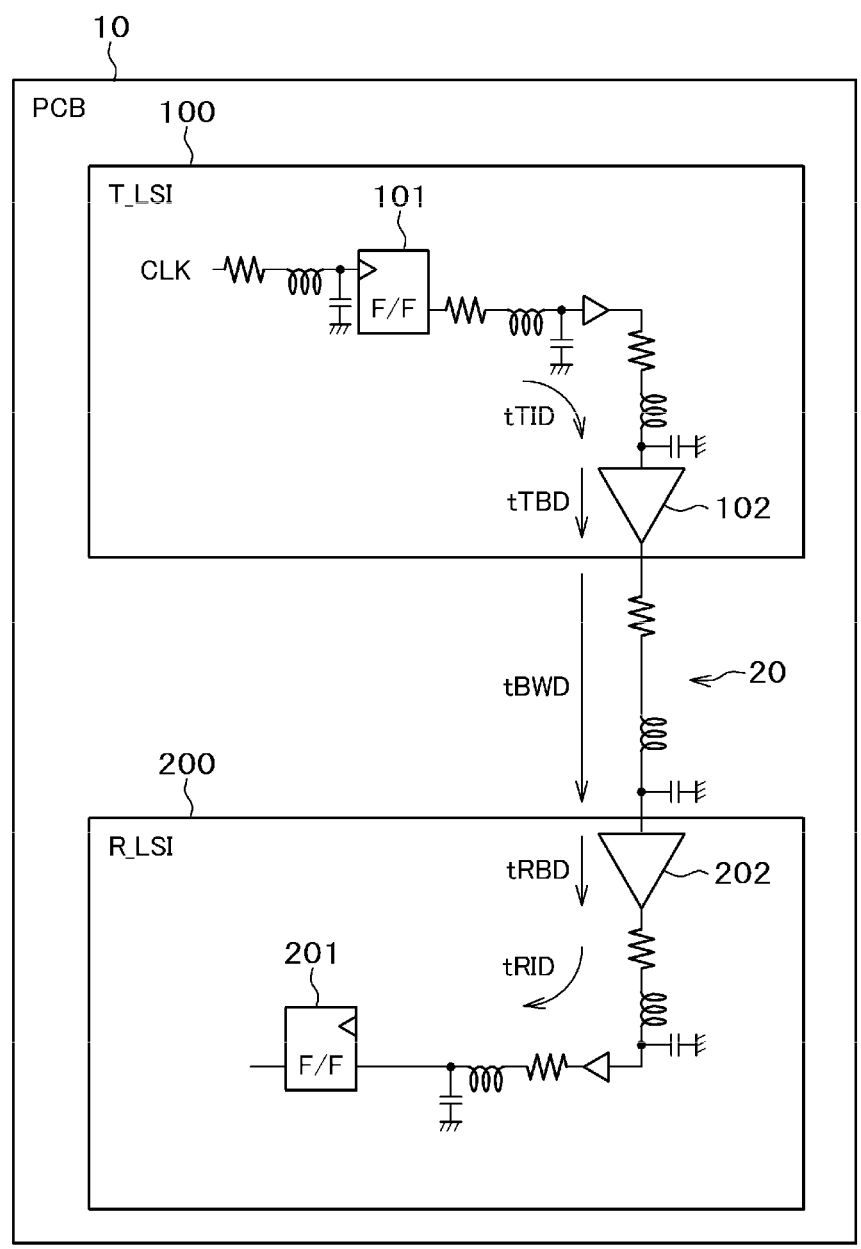
FIG. 1 is a diagram showing a propagation delay model of a signal to be a target of the present application.
Figure 2:
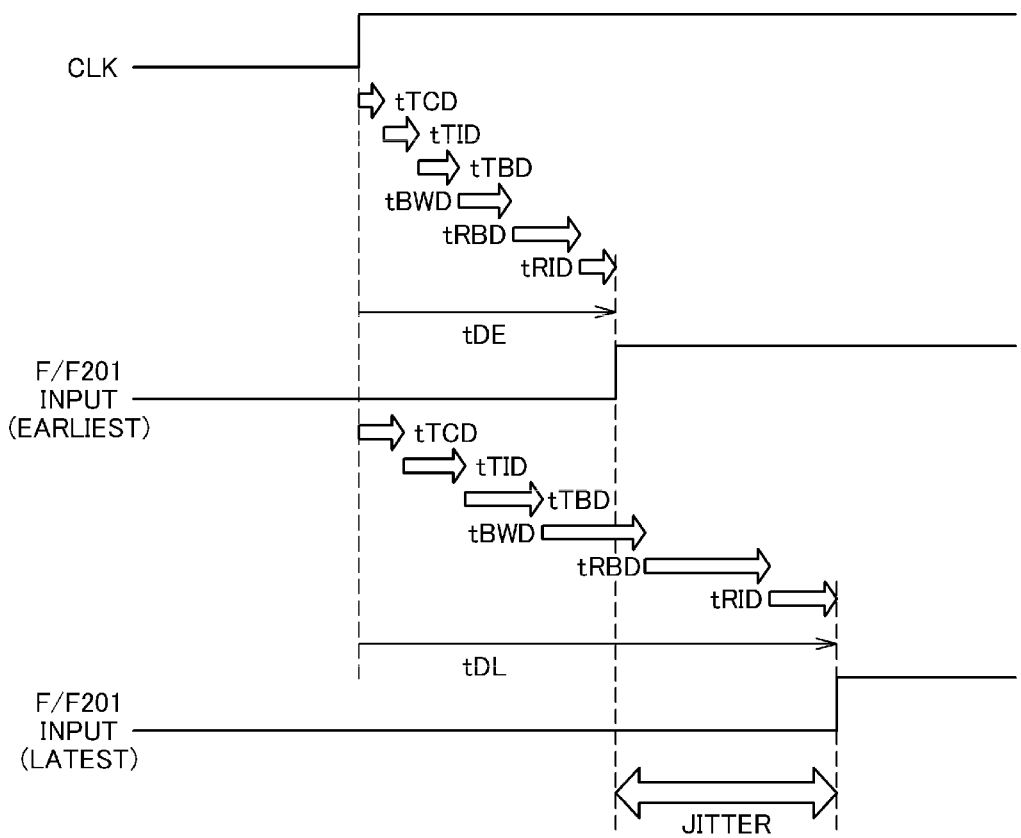
FIG. 2 is a diagram showing propagation delay in the signal propagation delay model shown in FIG. 1.

First, the jitter will be explained with reference to FIGS. 1 and 2. FIG. 1 is a diagram showing a propagation delay model of a signal to be a target of the present application. FIG. 2 is a diagram showing the propagation delay of the signal propagation delay model shown in FIG. 1.

As shown in FIG. 1, a transmitter semiconductor device (T LSI) 100 and a receiver semiconductor device (R LSI) 200 are mounted on a printed circuit board (PCB) 10. The semiconductor device 100 and the semiconductor device 200 are connected to each other by a wiring 20 that is formed in the printed board 10. In this case, a signal is transmitted from the semiconductor device 100 to the semiconductor device 200 through the wiring 20.

In consideration of a clock (CLK) on the transmitter side as a start point, the following delays are generated until the clock reaches a flip flop (F/F) 201 functioning as an input logic circuit on the receiver side.

Jitter of Clock (CLK): tTCD

Internal Propagation Delay of Semiconductor Device 100: tTID

Delay of Output Buffer 102 of Semiconductor Device 100: tTBD Delay of Wiring 20 of PCB 10: tBWD Delay of Input Buffer 202 of Semiconductor Device 200: tRBD Internal Propagation Delay of Semiconductor Device 200: tRID In this case, "tBWD" includes delay due to each package of the semiconductor devices 100 and 200. Each of the delays varies depending on conditions such as a temperature, a voltage, variation of manufacturing or ambient noises. As shown in FIG. 2, a difference between delay (tDE) in a case of the smallest value of a total sum (tD) of these delays and delay (tDL) in a case of the largest value of the same is the jitter of the input signal.

Figure 3:
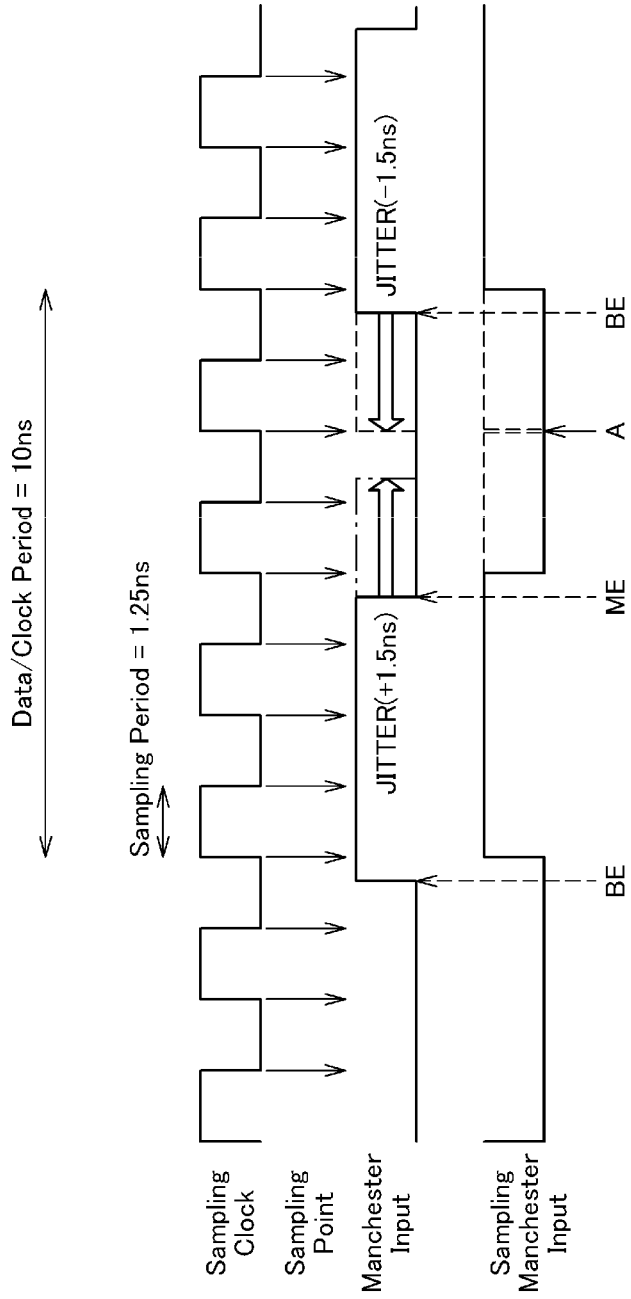
FIG. 3 is a diagram showing a timing example in a case of occurrence of a jitter that is equal to or larger than ⅛ of a data cycle.

Next, influence of the jitter in the Manchester coding studied by the present inventors will be explained with reference to FIGS. 1 and 3. FIG. 3 is a diagram showing a timing example in a case of occurrence of jitter that is equal to or larger than ⅛ of a data cycle. A case of the reception of the Manchester coding at a communication speed of 100 Mbps (bit per second) will be explained below.

When a clock having the fastest frequency generated in the semiconductor device 200 is 400 MHz, only 8 sampling are performed for one data cycle even if both rise and fall edges of the clock are used. Therefore, sampling is 1.25 ns (nanoseconds) that is very coarser in accuracy than that of a specification of 100 Mbps.

Meanwhile, in a case of usage of a LVDS (Low Voltage Differential Signaling) interface for a terminal to which a Manchester-coded signal is input, the signal is input as a differential input from outside of the semiconductor device 200 to the input buffer 202. Therefore, when an electric current amount is reduced in order to reduce power consumption, the jitter of the input buffer 202 increases. And, when a CMOS (Complementary Metal Oxide Semiconductor) process having a low leakage electric current is used in order to reduce the power consumption and a cost, an electric current amount of a power supply is also reduced. Therefore, the case is susceptible to be influenced by noises, and has a large jitter in the internal propagation of the semiconductor device 200. And, there is a jitter of a clock source such as a PLL (Phase Locked Loop) circuit supplying a clock. In addition to them, there are jitters of the wiring 20 out of the semiconductor device 200 and a circuit of the transmitter semiconductor device 100, and therefore, a total jitter value exceeds ±1.25 ns often.

For example, when the sampling accuracy for the Manchester-coded signal having a 10-ns cycle is 1.25 ns while the jitter exceeding ±1.25 ns is caused, the middle edge and the border edge are possibly sampled at the same position. The border edge is an edge generated at a border of the data/clock cycle (at a data border) at the time of the coding, and the middle edge is an edge generated at middle of the data/clock cycle (at a data middle). Therefore, difference between the middle edge and the border edge cannot be recognized, decoding cannot be correctly made. For example, when the jitter of ±1.5 ns is caused as shown in FIG. 3 and the edge is sampled at an "A" point, this edge cannot be recognized as either an edge (illustrated with a dashed dotted line) resulted from delay of a middle edge ME because of the jitter or an edge (illustrated with a broken line) resulted from advance of a border edge BE.

As described above, the data transmission is delayed by the noises such as the jitter. The amount of this delay is not constant but varies. When the sampling frequency is not larger than the frequency of the data transmission, there is a possibility of detection of the incorrect edge because of the variation.

The above-described issue does not arise if the clock synchronization is made between the transmission and reception sides or if the sufficiently-large sampling frequency is set by usage of a PLL dedicated to the transmission/reception. However, it is difficult to make the synchronization because of limitation of a circuit design in some cases. And, in the case of the usage of the PLL dedicated to the transmission/reception, cost disadvantage is very large, and a period (preamble period) for making only oscillation to lock the PLL is also necessary.

Next, an embodiment of the present application will be explained below. A shift value between adjacent cycles due to the jitter varies depending on whether the delay of a previous cycle is large or small. For example, in a case of a jitter of 2 ns, when the total sum (tD) of the delays of the previous cycle is an average, both a delay direction and an advance direction of a next cycle can vary by 1 ns (±1 ns). In this case, a state in which the total sum (tD) is the average means a middle state between the earliest delay (tDE) and the latest delay (tDL).

Meanwhile, when the total sum (tD) of the delays of the previous cycle is smaller than the average by 0.5 ns (when the signal transmission is early), the advance amount of the next cycle may be possibly −0.5 ns, and the delay amount of the next cycle may be possibly +1.5 ns. When the total sum (tD) of the delays of the previous cycle is the smallest (the earliest case (tDE)), the next cycle cannot be earlier while the delay amount can be up to +2 ns.

On the other hand, when the total sum (tD) of the delays of the previous cycle is larger than the average (when the signal transmission is late), the opposite to the case of the smaller one than the average can be said. That is, when the delay amount of the previous cycle is small, the shift of the next cycle is large in the delay direction but is small in the advance direction. Conversely, when the delay amount of the previous cycle is large, the shift of the next cycle is large in the advance direction, but is small in the delay direction.

In the embodiment, in order to receive this Manchester-coded signal containing the jitter, a data detection range is corrected on the basis of the middle edge that is necessarily generated in the Manchester-coded signal. In this case, correction of setting an end of the data detection range to be earlier than a normal one is referred to as "advance correction". And, correction of setting a beginning of the data detection range to be later than a normal one is referred to as "delay correction".

By the correction for the data detection range of the next cycle, it is predicted whether the delay of the previous cycle is large or small. In the case of the advance correction for the correction for the data detection range of the next cycle, it can be determined that the delay of the previous cycle is not at least the latest delay, and it can be determined that the next cycle is later than the previous cycle. In the case of the delay correction for the correction for the data detection range of the next cycle, it can be determined that the delay of the previous cycle is not at least the earliest delay, and it can be determined that the next cycle is earlier than the previous cycle.

The embodiment utilizes the characteristics, a result of the correction for the data detection range of the previous cycle is previously stored, and then, the data detection range (W) of the next cycle is corrected on the basis of the result of the correction.

Figure 4A:
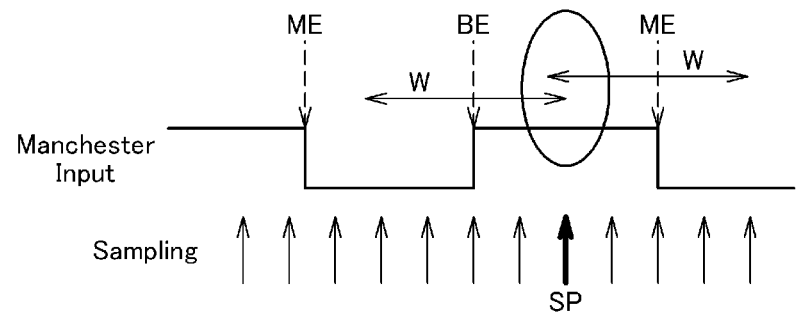
FIG. 4A is a timing chart in a case of no change of a data detection range.
Figure 4B:
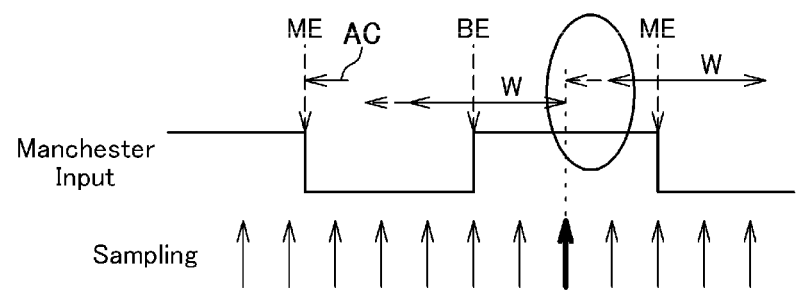
FIG. 4B is a timing chart in a case of delay correction in correction for the data detection range.
Figure 4C:
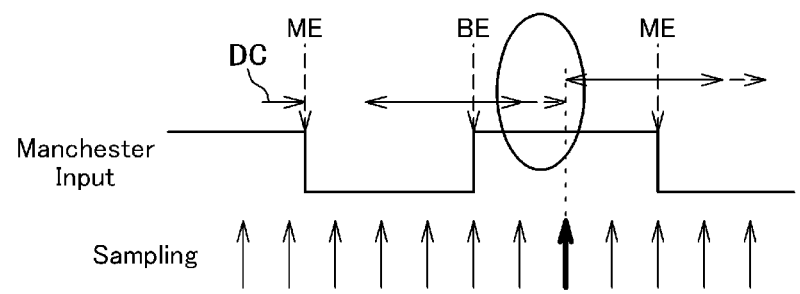
FIG. 4C is a timing chart in a case of advance correction in correction for the data detection range.

The correction for the data detection range will be explained with reference to FIGS. 4A to 4C. FIG. 4A is a timing chart in a case of no change of the data detection range. FIG. 4B is a timing chart in the case of the delay correction for the correction for the data detection range. FIG. 4C is a timing chart in the case of the advance correction for the correction for the data detection range.

As shown in FIG. 4A, in the case of no correction for the data detection range (W), an edge at a sampling point "SP" illustrated with a thick arrow cannot be recognized to be either the middle edge ME or the border edge BE.

Accordingly, in the case of the advance correction (AC) for the edge detection of the previous cycle as shown in FIG. 4B, the delay correction is made for the next cycle. That is, in the edge detection of the next cycle, a center of the data detection range (W) is delayed, or a scope of the data detection range (W) on the advance side is shortened. In this manner, the edge at the sampling point "SP" illustrated with the thick arrow can be determined as the border edge BE.

Accordingly, in the case of the delay correction (DC) for the edge detection of the previous cycle as shown in FIG. 4C, the advance correction is made for the next cycle. That is, in the edge detection of the next cycle, a center of the data detection range (W) is advanced, or a scope of the data detection range (W) on the delay side is shortened. In this manner, the edge at the sampling point "SP" illustrated with the thick arrow can be determined as the middle edge ME.

Next, an embodiment in a point of view that is different from the above-described point of view will be explained. In order to set the data detection range, the receiver semiconductor device according to the embodiment measures time taken for, for example, reception of two continuous data, and sets the data detection range on the basis of the measured time. If time interval between the data receptions is short, next coming data possibly comes after elapse of longer time interval than that of a case of normal data reception interval. Therefore, the delay correction for setting the beginning of the data detection range to be later than the normal one is made. If the time interval between the data receptions is long, next coming data possibly comes after elapse of shorter time interval than that of the case of normal data reception interval. Therefore, the advance correction for setting the end of the data detection range to be earlier than the normal one is made.

Figure 5:
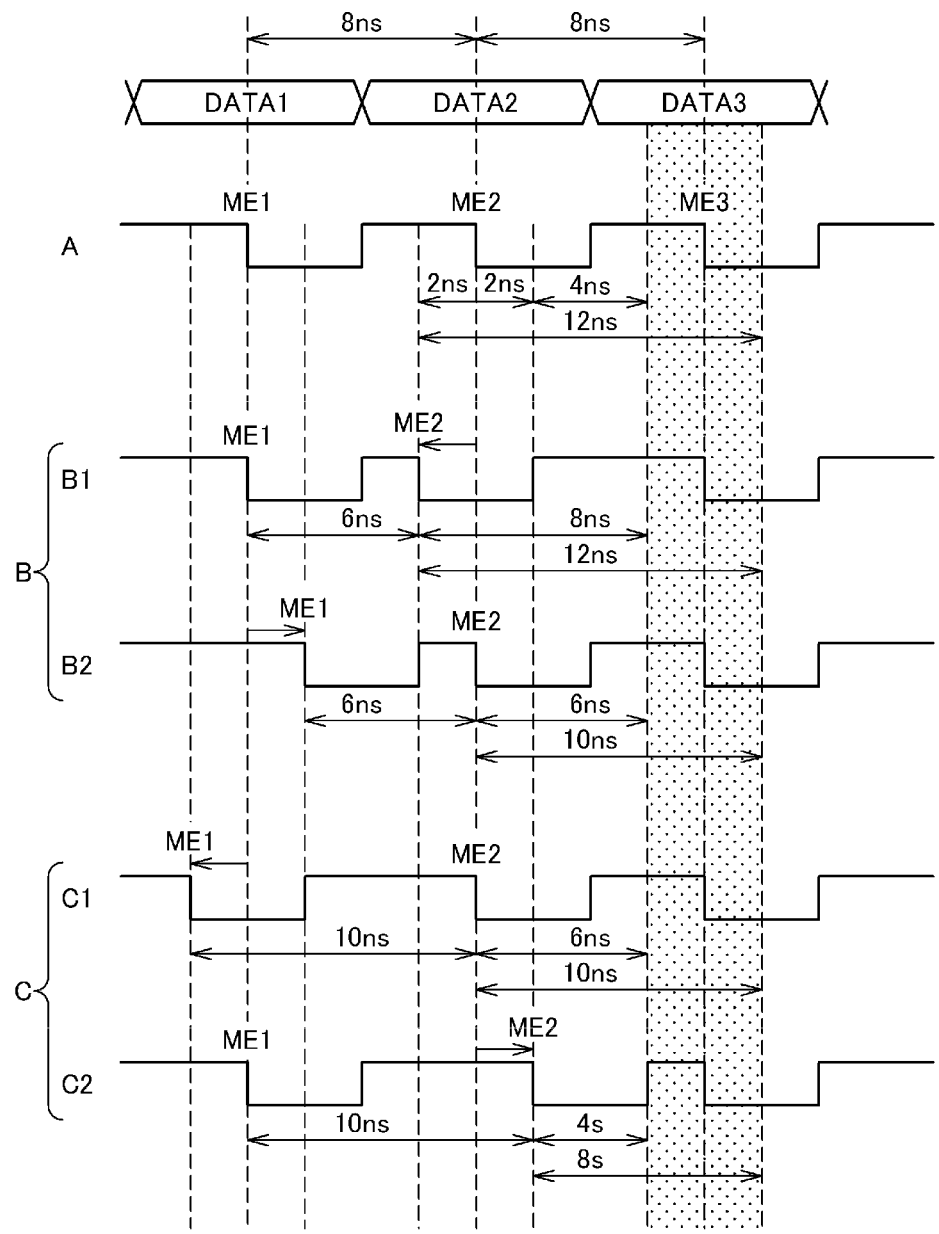
FIG. 5 is a timing chart for explaining the delay correction and the advance correction.

Specific examples of the delay correction and the advance correction will be explained with reference to FIG. 5. FIG. 5 is a timing chart for explaining the delay correction and the advance correction. FIG. 5 is on an assumption that the data reception is made at 8 ns cycle and shifts by about ±2 ns because of the jitter in some cases.

First, the case (case "A") of no delay correction and no advance correction will be explained. A second middle edge ME2 shifts by about ±2 ns because of the jitter. A data detection range for a third middle edge ME3 needs to be set in a range of 4 to 12 ns with reference to the shift second middle edge ME2 in consideration of the jitter.

Next, a processing of the delay correction in the case (case "B") of the short data interval will be explained. In the communication having the cycle of 8 ns, when the data interval between the first middle edge ME1 and the second middle edge ME2 is 6 ns, the following causes mainly arise.

B1: DATA2 advances by 2 ns.

B2: DATA1 delays by 2 ns.

In the case B1, the third middle edge ME3 of DATA3 possibly comes in a range of 8 to 12 ns with reference to the second middle edge ME2 of DATA2. In the case B2, the third middle edge ME3 of DATA3 possibly comes in a range of 6 to 10 ns with reference to the second middle edge ME2 of DATA2. Therefore, in order to support both possibilities, a range of 6 to 12 ns may be set as the edge detection range. This data detection range can be narrower than the range of 4 to 12 ns in the case A because of the delay correction for setting the beginning of the data detection range to delay by 2 ns, and therefore, the error detection can be prevented.

Next, the advance correction in the case (case "C") of the long data interval will be explained. When the data interval between the first middle edge ME1 and the second middle edge ME2 is 10 ns, the following causes mainly arise.

C1: DATA1 advances by 2 ns.

C2: DATA2 delays by 2 ns.

In the case C1, the DATA3 possibly comes in a range of 6 to 10 ns with reference to the second middle edge ME2 of the DATA2. In the case C2, the DATA3 possibly comes in a range of 4 to 8 ns with reference to the second middle edge ME2 of the DATA2. Therefore, in order to support both possibilities, a range of 4 to 10 ns may be set as the edge detection range. This data detection range can be narrower than the range of 4 to 12 ns in the case A because of the advance correction for setting the end of the data detection range to advance by 2 ns, and therefore, the error detection can be prevented.

In the embodiment, the receiver measures the time taken for reception of two continuous data. The data detection range is set on the basis of the time interval between the data receptions. If the time interval between the data receptions is short, next coming data possibly comes after elapse of longer time interval than that of a case of normal data reception interval. Therefore, the beginning of the data detection range is set to be later than the normal one. If the time interval between the data receptions is long, next coming data possibly comes after elapse of shorter time interval than that of the case of normal data reception interval. Therefore, the end of the data detection range is set to be earlier than the normal one.

According to the embodiment, even when the jitter containing the sampling accuracy (timer accuracy) is equal to or larger than ±⅛ cycle, the clock and the data can be correctly restored. In the manner, even when the jitter is equal to or larger than ±⅛ cycle, the data can be correctly received by a circuit having a low power and a low cost without usage of the PLL dedicated to the transmission/reception. In the present embodiment, the reception of the Manchester-coded signal is exemplified. However, for example, the present embodiment is also applicable to, for example, superimposing communication of the clock and the data signal such as 8b/10b coding, RLL (Run Length Limited) coding and WFM, and asynchronous communication using, for example, asynchronous signal.

Some typical working examples of the embodiment will be explained below. In the following explanation for the working examples, parts having the similar configurations and function to those of the above-described embodiments are denoted with the same symbols as those of the above-described embodiments. For the explanation for the parts, the explanation for the embodiment can be appropriately utilized within the technically-uncontradictable scope. A part of the above-described embodiment and a part or entire of a plurality of working examples can be appropriately utilized in combination within the technically-uncontradictable scope.

First Working Example

Figure 6:
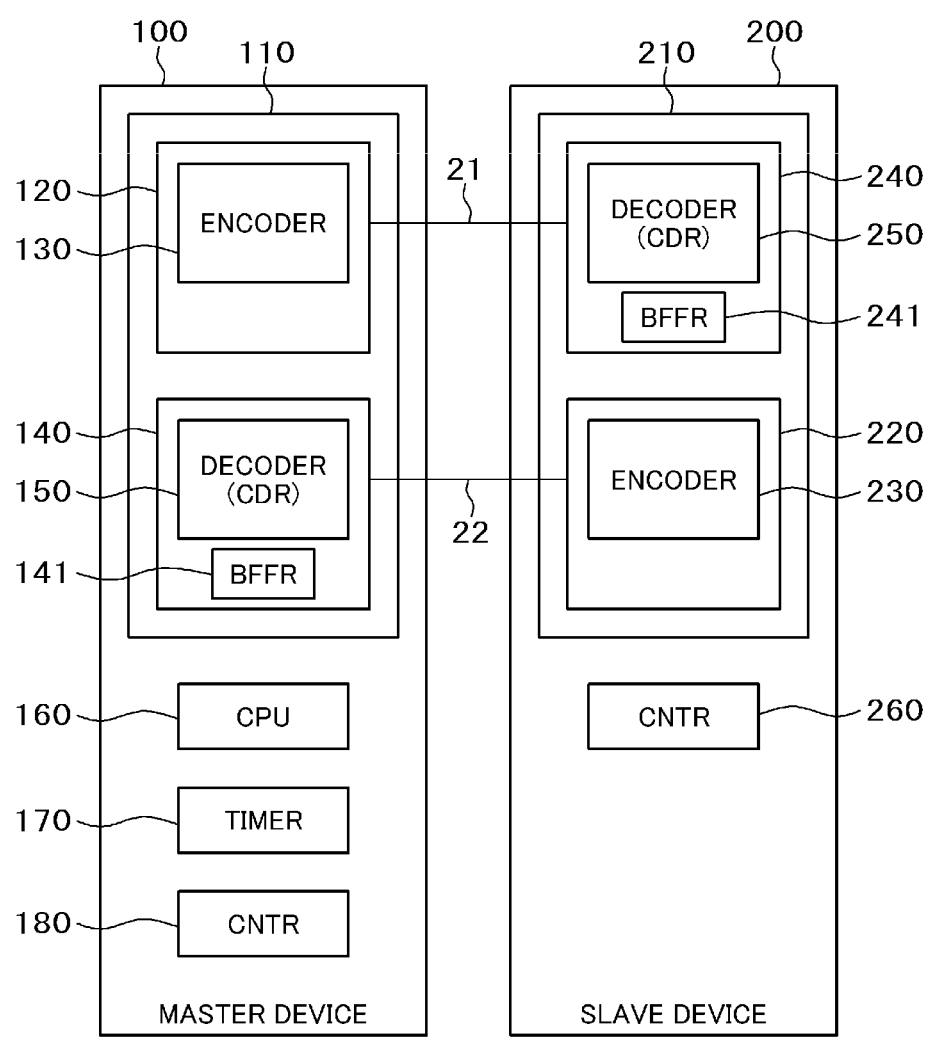
FIG. 6 is a block diagram showing a configuration of a communication system according to a first working example.

FIG. 6 is a block diagram showing a configuration of a communication system according to a first working example.

In the communication system 1 according to the first working example, communication between the semiconductor device 100 and the semiconductor device 200 is made in the Manchester coding. The semiconductor device 100 is also called master device, and is made of, for example, a MCU (Micro Controller Unit). The semiconductor device 200 is also called slave device, and is connected to, for example, a sensor or a controlling device. The communication is controlled by respective communication modules 110 and 210 of the semiconductor devices 100 and 200. The communication modules 110 and 210 include transmission circuits 120 and 220 and reception circuit 140 and 240, respectively. The transmission circuits 120 and 220 include encoders 130 and 230 for the Manchester coding, and the reception circuit 140 and 240 include decoders 150 and 250 for the Manchester coding, respectively. The encoders 130 and 230 for the Manchester coding are connected to the decoders 150 and 250 for the Manchester coding through communication lines 21 and 22, respectively. Each of the decoders 150 and 250 for the Manchester coding is called CDR (Clock Data Recovery) because of regenerating the clock and the data from the Manchester-coded signal.

The asynchronous serial communication is made between the transmission circuit 120 and the reception circuit 240 and between the transmission circuit 220 and the reception circuit 140. In the asynchronous serial communication, character information of single character is transmitted while being sandwiched by a "start bit" meaning start and a "stop bit" meaning end. And, a "parity bit" for use in checking whether the data has been correctly transmitted is added before the stop bit. Note that the above explanation has been made in the example of full-duplex communication securing the signal line for each direction of the data flow. However, half-duplex communication using one signal line, a communication direction of which is switched, may be appliable.

Note that a setting signal or a control signal for the sensor or the controlling device is transmitted from the semiconductor device 100 to the semiconductor device 200. From the semiconductor device 200, data, status information or error information of the sensor or the controlling device is transmitted.

The semiconductor device 100 includes a CPU 160, a timer 170 and another control circuit (CNTR) 180 in addition to the communication module 110. The communication module 110 makes the communication in response to the data and the control from these circuits. The semiconductor device 200 includes a control circuit (CNTR) 260 controlling the sensor or the controlling device not illustrated, and the communication module 210 makes the communication in response to the data and the control from the control circuit 260. The semiconductor device 200 may be made of the MCU.

Figure 7:
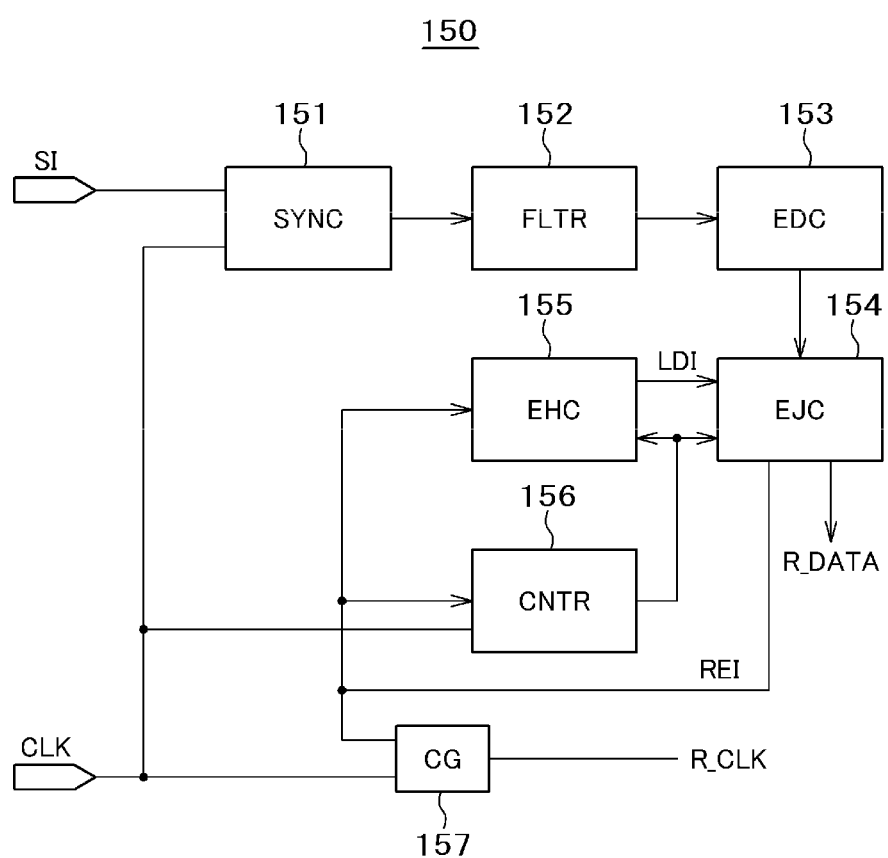
FIG. 7 is a block diagram showing a configuration of a decoder shown in FIG. 6.

Next, the decoders 150 and 250 for the Manchester coding will be explained with reference to FIG. 7. FIG. 7 is a block diagram showing a configuration of the decoder shown in FIG. 6. While the decoder 150 will be explained below, the decoder 250 has the similar configuration to that of the decoder 150 and similarly operates to that.

The decoder 150 includes a data reception circuit having a synchronous circuit (SYNC) 151, a noise filter (FLTR) 152 and an edge detection circuit (EDC) 153, and a clock generation circuit (CG) 157. The decoder 150 further includes an edge recognition circuit having an edge determination circuit (EJC) 154, an edge history circuit (EHC) 155 and a counter (CNTR) 156.

A Manchester-coded serial input signal (SI) passes the synchronous circuit 151 and the noise filter 152, and is input to the edge detection circuit 153. In this case, the synchronous circuit 151 is made of, for example, a multi-level flip flop (F/F) circuit for use in avoiding occurrence of a metastable state. The noise filter 152 is made of, for example, a three-input majority decision circuit.

The clock signal (CLK) is a clock that is generated in the semiconductor device 100, and is obtained by division of a clock that is generated in the PLL or others. However, the division is not always necessary, and the clock may not be divided. For the clock signal (CLK), only either the rise edge or the fall edge may be used, or both the rise edge and the fall edge may be used. Alternatively, two-phase clock signals (CLK), phases of which reverse to each other by 180 degrees, may be used. In this case, the number of the clock signals (CLK) is two.

The edge determination circuit 154 generates reception data (R_DATA) based on the edge that is detected by the edge detection circuit 153. The edge history circuit 155 is a storage circuit for storing phase shift (delay) information (LDI) of the previous cycle on the basis of reception edge information (REI) that is an output of the edge determination circuit 154. The counter 156 is initialized on the basis of the reception edge information (REI), and counts the clock signal (CLK).

The clock generation circuit 157 generates reception clock (R_CLK) based on the reception edge information (REI).

Figure 8:
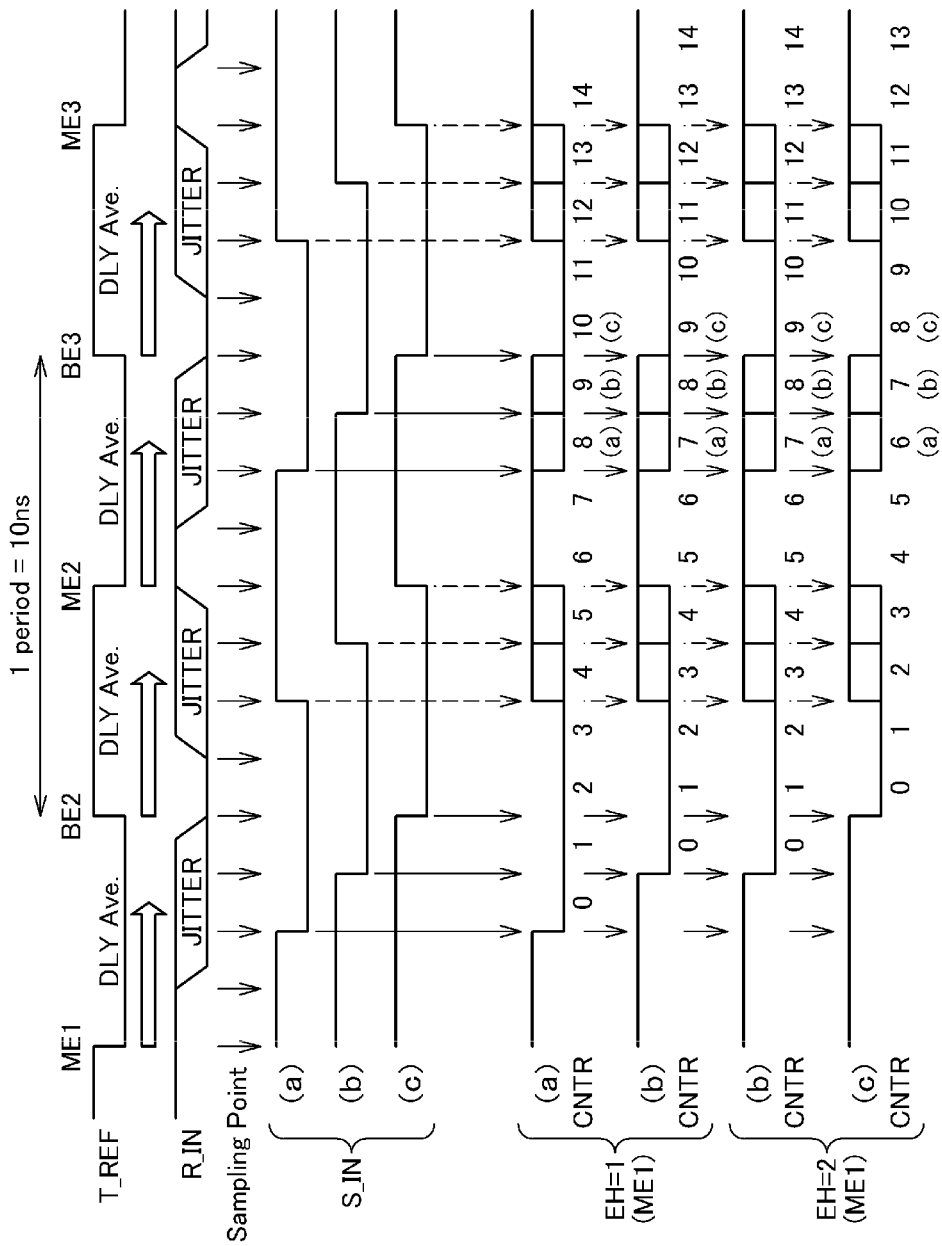
FIG. 8 is a timing chart showing operational waveforms of the decoder shown in FIG. 7.

A method of detecting the middle edge will be explained with reference to FIG. 8. FIG. 8 is a timing chart showing operational waveforms of the decoder shown in FIG. 7. When the input cycle of the Manchester coding is 10 ns (100 Mbps), the operation is achieved in the jitter that is smaller than ±1.875 ns (that is "sampling cycle"×3/2). A system having a sampling cycle of 1.25 ns and a jitter of ±1.5 ns will be explained below.

A transmission reference signal (T_REF) corresponds to the transmission clock (CLK) functioning as a start point of FIG. 1. A reception input signal (R_IN) corresponds to a Manchester-coded input in FIG. 3 and an input signal of the flip flop 201 functioning as an input first-level logic in FIG. 1. The reception input signal (R_IN) is a serial input signal (SI) of the synchronous circuit 151 in FIG. 7 or an input signal of the edge detection circuit 153.

An input signal (S_IN) is a signal obtained after sampling the reception input signal (R_IN), and corresponds to a Manchester-coded input of FIG. 3. The input signal (S_IN) is an output signal of the synchronous circuit 151 of FIG. 7, an output signal of the noise filter 152 or the F/F circuit inside the edge detection circuit 153. The input signal (S_IN) is the Manchester-coded signal, and therefore, this signal has always the middle edge but has no border edge often.

In this case, (a) to (c) of the input signal (S_IN) of FIG. 8 show signal waveforms in the following cases.
  (a) Small Delay (−1.875 ns to −0.625 ns from the average)
  (b) Medium Delay (within ±0.625 ns from the average)
  (c) Large Delay (+0.625 ns to +1.875 ns from the average)
And, the cases (a) to (c) depend on the jitter, and therefore, possibly change for every edge. For example, even when the first middle edge ME1 is in the case (a), the second border edge BE2 is not limited to the case (a) but may be in any of the cases (a) to (c). And, when the first middle edge ME1 is in the case (b) or (c), the second border edge BE2 may be similarly in any of the cases (a) to (c).

A solid-line arrow in FIG. 8 indicates the sampling of the middle edge, and a broken-line arrow indicates the sampling for the border edge. In order to extract the clock and the data from the Manchester-coded signal, difference between this middle edge and this border edge need to be recognized.

A value of the counter (CNTR) 156 is cleared to be "0" when the edge determination circuit 154 detects the edge, and is incremented by one for every sampling cycle. However, FIG. 8 shows a case of continuously-incremented values (a case of no detection for the second middle edge ME2) for the understandable explanation.

A method of detecting the second middle edge ME2 as an example of a detection-target middle edge will be explained.

First, the delay information (LDI) that is stored in the edge history circuit 155 will be explained. Values of the delay information (LDI) that is stored in the edge history circuit 155 are made of three values of "0", "1" and "2".

The case of the delay information (LDI) of "0" is the unknown delay case, and shows that the input signal (R_IN) is in the case (a), (b) or (c) of FIG. 8. The data detection range of the second middle edge ME2 is set so that the counter value of the counter 156 is 6 to 10. The case of the delay information (LDI) of "0" is referred to as "edge history 0", and is expressed as "EH=0".

The case of the delay information (LDI) of "1" is the small or medium delay case, and shows that the input signal (R_IN) is in the case (a) or (b) of FIG. 8. The data detection range of the second middle edge ME2 is set so that the counter value is 7 to 10. The case of the delay information (LDI) of "1" is referred to as "edge history 1", and is expressed as "EH=1". The case of the delay information (LDI) of "2" is the medium or large delay case, and shows that the input signal (R_IN) is in the case (b) or (c) of FIG. 8. The data detection range of the second middle edge ME2 is set so that the counter value is 6 to 9. The case of the delay information (LDI) of "2" is referred to as "edge history 2", and is expressed as "EH=2".

A detecting operation and an update of the edge history of the second middle edge ME2 that is the middle edge of the next cycle for each edge history of the first middle edge ME1 that is the middle edge of the previous cycle will be explained.

Operation in Edge History 1 (EH=1):

In the case (EH=1) in which the first middle edge ME1 is in the case (a) or (b), the second middle edge ME2 occurs when the counter value of the counter 156 is any of 7 to 10. Although the edge may occur when the counter value is 3 to 6 or 11 to 14, these edges are ignorable because of being the border edges (a second border edge BE2 or a third border edge BE3). The edge determination circuit 154 detects the edge in the range of 7 to 10 of the counter value.

The edge determination circuit 154 outputs the reception data (R_DATA) to be "1" when this edge changes from the high level (H) to the low level (L) or "0" when this edge changes from the low level (L) to the high level (H), and outputs the reception clock (R_CLK). Hereinafter, the change from the high level (H) to the low level (L) is referred to as "H→L", and the change from the low level (L) to the high level (H) is referred to as "L→H".

When the counter value at the edge detection is 7 or 8, the second middle edge ME2 is in the case (a) or (b) (EH=1), the edge determination circuit 154 stores the value "1" into the edge history circuit 155, and updates the edge history. When the counter value at the edge detection is 9 or 10, the second middle edge ME2 is in the case (b) or (c) (EH=2), the edge determination circuit 154 stores the value "2" into the edge history circuit 155, and updates the edge history.

Operation in Edge History 2 (EH=2):

In the case (EH=2) in which the first middle edge ME1 is in the case (b) or (c), the second middle edge ME2 occurs when the counter value of the counter 156 is any of 6 to 9. Although the edge may occur when the counter value is 2 to 5 or 10 to 13, these edges are ignorable because of being the border edges (the second border edge BE2 or the third border edge BE3). The edge determination circuit 154 detects the edge in the range of 6 to 9 of the counter value.

The edge determination circuit 154 outputs the reception data (R_DATA) to be "1" when the change of this edge is "H→L" or "0" when the change of this edge is "L→H", and outputs the reception clock (R_CLK).

When the counter value at the edge detection is 6 or 7, the second middle edge ME2 is in the case (a) or (b) (EH=1), and the edge determination circuit 154 stores the value "1" into the edge history circuit 155, and updates the edge history. When the counter value at the edge detection is 8 or 9, the second middle edge ME2 is in the case (b) or (c) (EH=2), the edge determination circuit 154 stores the value "2" into the edge history circuit 155, and updates the edge history.

Operation in Edge History 0 (EH=0):

In the case of the edge in the first cycle, when the start bit is assumed to be "1", the change of middle edge is necessarily "H→L". Therefore, the counter value in the first cycle is cleared to be "0" at the time of the shift of "H→L", "1" is output as the reception data (R_DATA), and the reception clock (R_CLK) is output. In the first cycle, it cannot be determined which of the cases (a) to (c) the middle edge is in, and therefore, "EH=0" is set In the case of "EH=0" including the first cycle, the acceptable counter values for the second middle edge ME2 are 6 to 10. If only single edge is detected in the range of 6 to 10 of the counter value, the edge determination circuit 154 calculates the edge history as follows on the basis of the counter value at the time of the edge detection.

When the counter value is 6 or 7, the edge determination circuit 154 determines that the second middle edge ME2 is in the case (a) or (b), stores the value "1" into the edge history circuit 155, and updates the edge history.

When the counter value is 8, the edge determination circuit 154 determines that the second middle edge ME2 is the same as the delay of the first middle edge ME1, stores the value "0" into the edge history circuit 155, and updates the edge history.

When the counter value is 9 or 10, the edge determination circuit 154 determines that the second middle edge ME2 is in the case (b) or (c), stores the value "2" into the edge history circuit 155, and updates the edge history.

In the case of "EH=0", it is very rare that two edges are detected at the counter values of 6 and 10. In the case of "EH=0", it cannot be determined which one of the edges is the middle edge or the border edge, and therefore, the edge determination circuit 154 generates a decoding error. When the decoding error is generated, the reception circuit 140 stops receiving after that until the reception of the next frame, and entirely discards the frame or discards bits obtained after the generation of the error. When the reception of the entire frame or a part of bits is discarded, a reception buffer (BFFR) 141 in the reception circuit 140 retains the previous value. Besides, even in other cases than the case "EH=0", two or more edges may be detected because of the erroneous operation due to the noises or others. Even in these cases, the edge determination circuit 154 generates the decoding error as similar to the above description.

Figure 9:
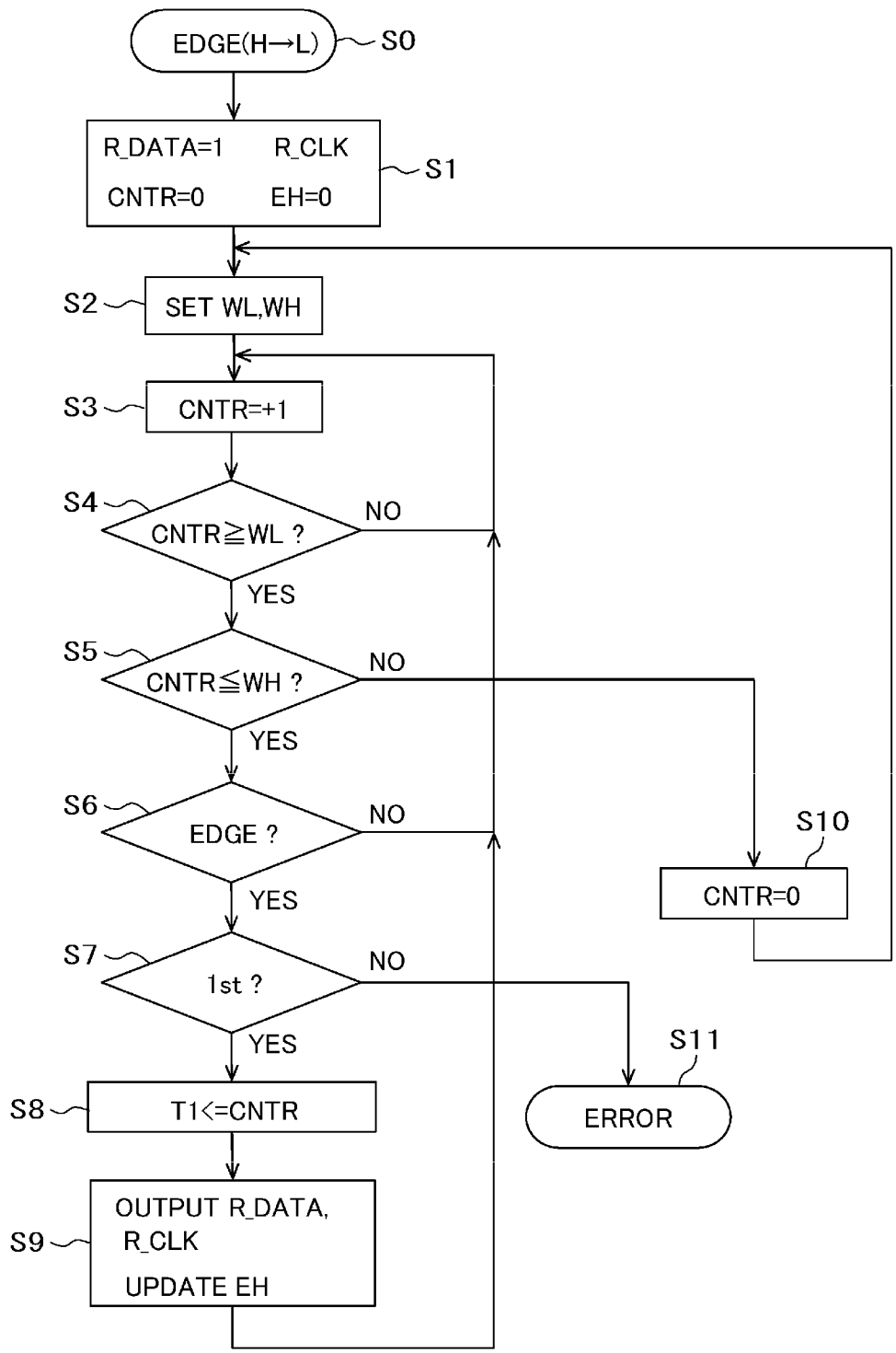
FIG. 9 is a flowchart showing a hardware processing in a case in which the decoder shown in FIG. 7 detects a fall edge.

An edge detecting operation of the decoder 150 will be explained with reference to FIG. 9. FIG. 9 is a flowchart showing a hardware processing performed when the decoder shown in FIG. 7 detects the fall edge.

(Step S0)
The edge detection circuit 153 detects the edge with the change "H→L".

(Step S1)
The edge determination circuit 154 outputs "1" as the input signal (R_DATA), and outputs the reception edge information (REI) to the edge history circuit 155, the counter 156 and the clock generation circuit 157. The clock generation circuit 156 generates and outputs the reception clock (R_CLK) on the basis of the reception edge information (REI). The counter 156 clears the counter value to be "0" on the basis of the reception edge information (REI). The edge history circuit 155 stores the edge history "0" on the basis of the reception edge information (REI).

(Step S2)
The edge determination circuit 154 sets a detection range on the basis of the edge history. In this process, a lower limit of the detection range is "WL", and an upper limit of the detection range is "WH".

(Step S3)
The counter value of the counter 156 is incremented by the clock signal (CLK).

(Step S4)
The edge determination circuit 154 determines whether the counter value of the counter 156 is equal to or larger than the lower limit (WL) of the detection range.

(Step S5)
The edge determination circuit 154 determines whether the counter value of the counter 156 is equal to or lower than the upper limit (WH) of the detection range.

(Step S6)
The edge determination circuit 154 determines whether the edge has been detected, on the basis of the output of the edge detection circuit 153.

(Step S7)
The edge determination circuit 154 determines whether the detected edge is the first detected edge.

(Step S8)
The edge determination circuit 154 sets the count value of the counter 156 at the time of the edge detection to be the first edge position.

(Step S9)
The edge determination circuit 154 outputs the input signal (R_DATA), and outputs the reception edge information (REI) to the edge history circuit 155, the counter 156 and the clock generation circuit 157. The clock generation circuit 156 generates and outputs the reception clock (R_CLK) on the basis of the reception edge information (REI). The edge history circuit 155 updates the edge history on the basis of the reception edge information (REI).

(Step S10)
In the step S5, if the count value is larger than the upper limit of the detection range, the counter 156 clears the count value to be "0".

(Step 11)
In the step S7, if the detected edge is the second detected edge, the edge determination circuit 154 outputs the decoding error.

According to the first working example, when the counter value for use in the recognition of the middle edge is changed on the basis of the previous edge history, the decoding is achieved in the sampling cycle that is ⅛ of the cycle of the Manchester-coded data and in the jitter that is less than ±(⅛×⅔) of the cycle of the Manchester-coded data.

Second Working Example

Figure 10:
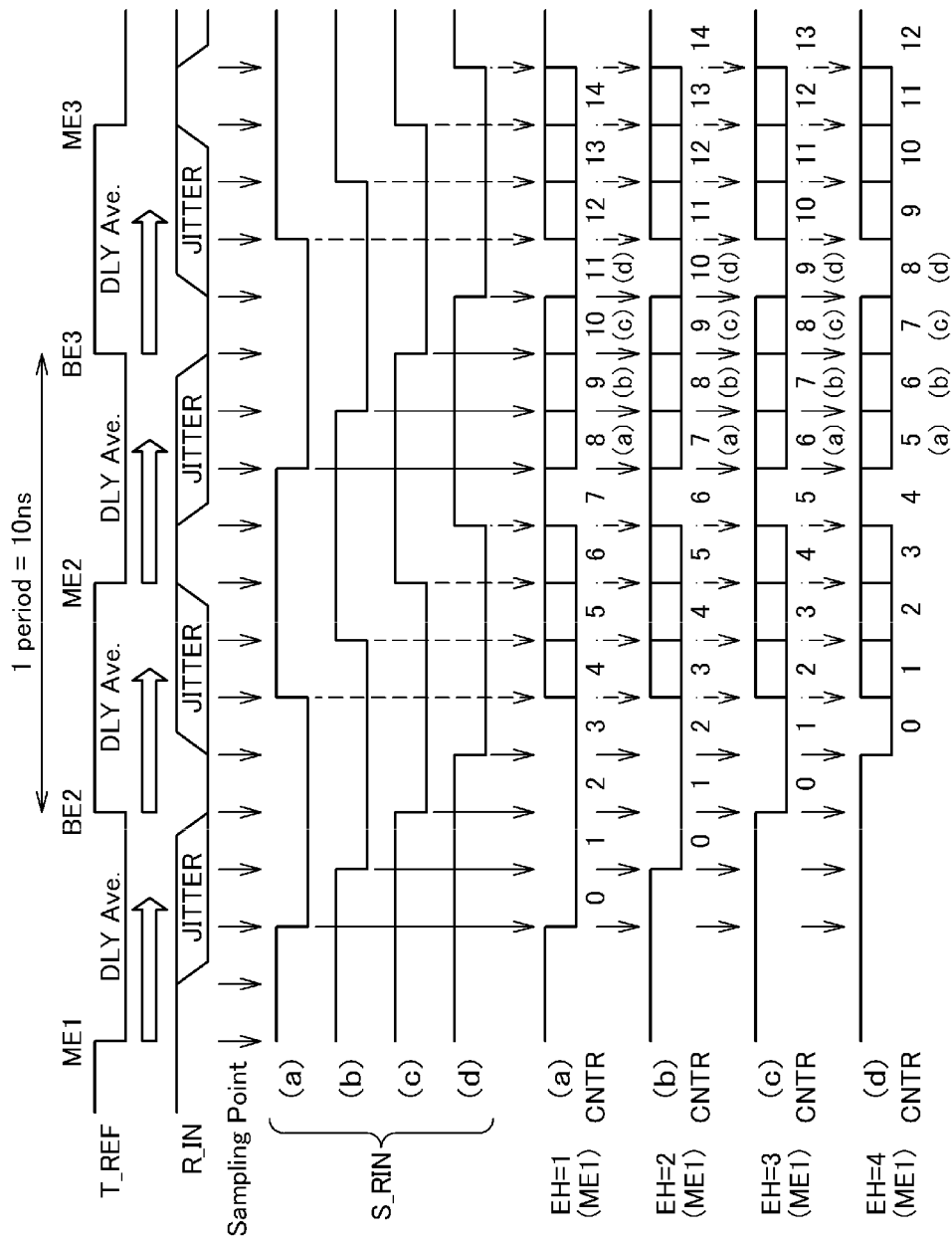
FIG. 10 is a timing chart showing operational waveforms of a decoder according to a second working example.

A method of detecting the second middle edge (ME2) according to a second working example will be explained with reference to FIG. 10. FIG. 10 is a timing chart showing operational waveforms of the decoder according to the second working example.

The decoder according to the second working example is the same in the configuration as the decoders 150 and 250 according to the first working example. However, the edge determination circuit 154 and the edge history circuit 155 are different in the operation therefrom. When the input cycle of the Manchester-coded signal is 10 ns (100 Mbps), the operation is achieved in the jitter that is less than ±2.5 ns (that is the sampling cycle×2). The following explanation will be made in a system having a jitter of ±1.5 ns.

In the second working example, (a) to (d) of the input signal (S_IN) show signal waveforms in the following cases.
(a) Small Delay (−2.5 ns to −1.25 ns from the average)
(b) Slightly Small Delay (−1.25 ns to 0 ns from the average)
(c) Slightly Large Delay (0 ns to +1.25 ns from the average)
(c) Large Delay (+1.25 ns to +2.5 ns from the average)

And, the cases (a) to (d) depend on the jitter, and therefore, possibly change for every edge. For example, even when the first middle edge ME1 is in the case (a), the second middle edge ME2 is not limited to the case (a), but may be in any of the cases (a) to (d). And, the same goes for the second middle edge ME2 being in the cases (b) to (d).

A solid-line arrow in FIG. 10 indicates the sampling of the middle edge, and a broken-line arrow indicates the sampling of the border edge. In order to extract the clock and the data from the Manchester-coded signal, difference between this middle edge and this border edge need to be recognized.

A value of the counter 156 is cleared to be "0" when the edge determination circuit 154 detects the edge, and is incremented by one for every sampling cycle. However, FIG. 10 shows a case of continuously-incremented values (a case of no detection for the second middle edge ME2) for the understandable explanation.

A method of detecting the second middle edge ME2 that is a detection target will be explained. Values of the delay information (LDI) that is stored in the edge history circuit 155 are made of ten values of "0" to "9".

The case of the delay information (LDI) of "0" is the unknown delay case, and shows that the input signal (R_IN) is in the case (a), (b), (c) or (d) of FIG. 10. The data detection range of the second middle edge ME2 is set so that the counter value is 5 to 11. The case of the delay information (LDI) of "0" is referred to as "edge history 0", and is expressed as "EH=0".

The case of the delay information (LDI) of "1" is the small delay case, and shows that the input signal (R_IN) is in the case (a) of FIG. 10. The data detection range of the second middle edge ME2 is set so that the counter value is 8 to 11. The case of the delay information (LDI) of "1" is referred to as "edge history 1", and is expressed as "EH=1".

The case of the delay information (LDI) of "2" is the slightly-small delay case, and shows that the input signal (R_IN) is in the case (b) of FIG. 10. The data detection range of the second middle edge ME2 is set so that the counter value is 7 to 10. The case of the delay information (LDI) of "2" is referred to as "edge history 2", and is expressed as "EH=2".

The case of the delay information (LDI) of "3" is the slightly-large delay case, and shows that the input signal (R_IN) is in the case (c) of FIG. 10. The data detection range of the second middle edge ME2 is set so that the counter value is 6 to 9. The case of the delay information (LDI) of "3" is referred to as "edge history 3", and is expressed as "EH=3".

The case of the delay information (LDI) of "4" is the large delay case, and shows that the input signal (R_IN) is in the case (d) of FIG. 10. The data detection range of the second middle edge ME2 is set so that the counter value is 5 to 8. The case of the delay information (LDI) of "4" is referred to as "edge history 4", and is expressed as "EH=4".

The case of the delay information (LDI) of "5" is the not-large delay case, and shows that the input signal (R_IN) is in the case (a), (b) or (c) of FIG. 10. The data detection range of the second middle edge ME2 is set so that the counter value is 6 to 11. The case of the delay information (LDI) of "5" is referred to as "edge history 5", and is expressed as "EH=5".

The case of the delay information (LDI) of "6" is the not-small delay case, and shows that the input signal (R_IN) is in the case (b), (c) or (d) of FIG. 10. The data detection range of the second middle edge ME2 is set so that the counter value is 5 to 10. The case of the delay information (LDI) of "6" is referred to as "edge history 6", and is expressed as "EH=6".

The case of the delay information (LDI) of "7" is the small delay case, and shows that the input signal (R_IN) is in the case (a) or (b) of FIG. 10. The data detection range of the second middle edge ME2 is set so that the counter value is 7 to 11. The case of the delay information (LDI) of "7" is referred to as "edge history 7", and is expressed as "EH=7".

The case of the delay information (LDI) of "8" is the large delay case, and shows that the input signal (R_IN) is in the case (c) or (d) of FIG. 10. The data detection range of the second middle edge ME2 is set so that the counter value is 5 to 9. The case of the delay information (LDI) of "8" is referred to as "edge history 8", and is expressed as "EH=6".

The case of the delay information (LDI) of "9" is the not-small delay case, and shows that the input signal (R_IN) is in the case (b) or (c) of FIG. 10. The data detection range of the second middle edge ME2 is set so that the counter value is 6 to 10. The case of the delay information (LDI) of "9" is referred to as "edge history 9", and is expressed as "EH=9".

A detecting operation and an update of the edge history of the second middle edge ME2 that is the middle edge of the next cycle for each edge history of the first middle edge ME1 that is the middle edge of the previous cycle will be explained.

Operation in Edge History 1 (EH=1):

In the case (EH=1) in which the first middle edge ME1 is in the case (a), the second middle edge ME2 occurs when the counter value of the counter 156 is any of 8 to 11. Although the edge may occur when the counter value is 4 to 7 or 12 to 15, these edges are ignorable because of being the border edges (a second border edge BE2 or a third border edge BE3). The edge determination circuit 154 detects the edge in the range of 8 to 11 of the counter value.

The edge determination circuit 154 outputs the reception data (R_DATA) to be "1" when the change of this edge is "H→L" or "0" when the change of this edge is "L→H", and outputs the reception clock (R_CLK).

The edge determination circuit 154 determines the delay state of the second middle edge ME2 on the basis of the counter value at the time of this edge detection, stores the delay information into the edge history circuit 155, and uses the delay information for the determination of the third middle edge ME3 of the further next cycle.

In a case of "the counter value=8", the edge determination circuit 154 determines that the second middle edge ME2 is in the case (a), stores the value "1" into the edge history circuit 155, and updates the edge history (EH=1).

In a case of "the counter value=9", the edge determination circuit 154 determines that the second middle edge ME2 is in the case (b), stores the value "2" into the edge history circuit 155, and updates the edge history (EH=2).

In a case of "the counter value=10", the edge determination circuit 154 determines that the second middle edge ME2 is in the case (c), stores the value "3" into the edge history circuit 155, and updates the edge history (EH=3).

In a case of "the counter value=11", the edge determination circuit 154 determines that the second middle edge ME2 is in the case (d), stores the value "4" into the edge history circuit 155, and updates the edge history (EH=4).

Operation in Edge History 2 (EH=2):

In the case (EH=2) in which the first middle edge ME1 is in the case (b), the second middle edge ME2 occurs when the counter value of the counter 156 is any of 7 to 10. The edge determination circuit 154 determines the edge that is detected in the range of 7 to 10 of the counter value to be the second middle edge ME2, and outputs the reception data (R_DATA) and the reception clock (R_CLK) on the basis of the change of the data at this time.

The edge determination circuit 154 determines the delay state of the second middle edge ME2 on the basis of the counter value at the time of this edge detection, stores the delay information into the edge history circuit 155, and uses the delay information for the determination of the third middle edge ME3 of the further next cycle.

In a case of "the counter value=7", the edge determination circuit 154 determines that the second middle edge ME2 is in the case (a), stores the value "1" into the edge history circuit 155, and updates the edge history (EH=1).

In a case of "the counter value=8", the edge determination circuit 154 determines that the second middle edge ME2 is in the case (b), stores the value "2" into the edge history circuit 155, and updates the edge history (EH=2).

In a case of "the counter value=9", the edge determination circuit 154 determines that the second middle edge ME2 is in the case (c), stores the value "3" into the edge history circuit 155, and updates the edge history (EH=3).

In a case of "the counter value=10", the edge determination circuit 154 determines that the second middle edge ME2 is in the case (d), stores the value "4" into the edge history circuit 155, and updates the edge history (EH=4).

Operation in Edge History 3 (EH=3):

In the case (Edge History 3 (EH=3)) in which the first middle edge ME1 is in the case (c), the second middle edge ME2 occurs when the counter value of the counter 156 is any of 6 to 9. The edge determination circuit 154 determines the edge that is detected in the range of 6 to 9 of the counter value to be the second middle edge ME2, and outputs the reception data (R_DATA) and the reception clock (R_CLK) on the basis of the change of the data at this time.

The edge determination circuit 154 determines the delay state of the second middle edge ME2 on the basis of the counter value at the time of this edge detection, stores the delay information into the edge history circuit 155, and uses the delay information for the determination of the third middle edge ME3 of the further next cycle.

In a case of "the counter value=6", the edge determination circuit 154 determines that the second middle edge ME2 is in the case (a), stores the value "1" into the edge history circuit 155, and updates the edge history (EH=1).

In a case of "the counter value=7", the edge determination circuit 154 determines that the second middle edge ME2 is in the case (b), stores the value "2" into the edge history circuit 155, and updates the edge history (EH=2).

In a case of "the counter value=8", the edge determination circuit 154 determines that the second middle edge ME2 is in the case (c), stores the value "3" into the edge history circuit 155, and updates the edge history (EH=3).

In a case of "the counter value=9", the edge determination circuit 154 determines that the second middle edge ME2 is in the case (d), stores the value "4" into the edge history circuit 155, and updates the edge history (EH=4).

Operation in Edge History 4 (EH=4):

In the case (EH=4) in which the first middle edge ME1 is in the case (d), the second middle edge ME2 occurs when the counter value of the counter 156 is any of 5 to 8. The edge determination circuit 154 determines the edge that is detected in the range of 5 to 8 of the counter value to be the second middle edge ME2, and outputs the reception data (R_DATA) and the reception clock (R_CLK) on the basis of the change of the data at this time.

The edge determination circuit 154 determines the delay state of the second middle edge ME2 on the basis of the counter value at the time of this edge detection, stores the delay information into the edge history circuit 155, and uses the delay information for the determination of the third middle edge ME3 of the further next cycle.

In a case of "the counter value=5", the edge determination circuit 154 determines that the second middle edge ME2 is in the case (a), stores the value "1" into the edge history circuit 155, and updates the edge history (EH=1).

In a case of "the counter value=6", the edge determination circuit 154 determines that the second middle edge ME2 is in the case (b), stores the value "2" into the edge history circuit 155, and updates the edge history (EH=2).

In a case of "the counter value=7", the edge determination circuit 154 determines that the second middle edge ME2 is in the case (c), stores the value "3" into the edge history circuit 155, and updates the edge history (EH=3).

In a case of "the counter value=8", the edge determination circuit 154 determines that the second middle edge ME2 is in the case (d), stores the value "4" into the edge history circuit 155, and updates the edge history (EH=4).

Operation in Edge History 0 (EH=0):

A case of the edge of the first cycle is "EH=0" as similar to the first working example. And, a case in which the middle edge (first middle edge ME1) of the previous cycle is unknown to be in any of the case (a) to (d) is also "EH=0".

In the case (EH=0), the acceptable counter values for the second middle edge ME2 are 5 to 11. When only single edge is detected in the range of 5 to 11 of the counter value, the edge determination circuit 154 outputs the reception data (R_DATA) and the reception clock (R_CLK) on the basis of the change of the data at this time. Then, the edge determination circuit 154 calculates the next edge history as follows on the basis of the counter value at the time of the edge detection.

In a case of "the counter value=5", the edge determination circuit 154 determines that the second middle edge ME2 is in the case (a), stores the value "1" into the edge history circuit 155, and updates the edge history (EH=1).

In a case of "the counter value=6", the edge determination circuit 154 determines that the second middle edge ME2 is in the case (a) or (b), stores the value "7" into the edge history circuit 155, and updates the edge history (EH=7).

In a case of "the counter value=7", the edge determination circuit 154 determines that the second middle edge ME2 is in the case (a), (b) or (c), stores the value "5" into the edge history circuit 155, and updates the edge history (EH=5).

In a case of "the counter value=8", the edge determination circuit 154 cannot determine that the second middle edge ME2 is in any of the cases (a) to (d), stores the value "0" into the edge history circuit 155, and updates the edge history (EH=0).

In a case of "the counter value=9", the edge determination circuit 154 determines that the second middle edge ME2 is in the case (b), (c) or (d), stores the value "6" into the edge history circuit 155, and updates the edge history (EH=6).

In a case of "the counter value=10", the edge determination circuit 154 determines that the second middle edge ME2 is in the case (c) or (d), stores the value "8" into the edge history circuit 155, and updates the edge history (EH=8).

In a case of "the counter value=11", the edge determination circuit 154 determines that the second middle edge ME2 is in the case (d), stores the value "4" into the edge history circuit 155, and updates the edge history (EH=4).

Operation in Edge History 5 (EH=5):

In the case (EH=5) in which the first middle edge ME1 is determined to be in the case (a), (b) or (c), the acceptable counter values of the counter 156 for the second middle edge ME2 are 6 to 11. When only single edge is detected in the counter value, the edge determination circuit 154 outputs the reception data (R_DATA) and the reception clock (R_CLK) on the basis of the change of the data at this time.

The edge determination circuit 154 calculates the next edge history as follows on the basis of the counter value at the time of the edge detection.

In a case of "the counter value=6", the edge determination circuit 154 determines that the second middle edge ME2 is in the case (a), stores the value "1" into the edge history circuit 155, and updates the edge history (EH=1).

In a case of "the counter value=7", the edge determination circuit 154 determines that the second middle edge ME2 is in the case (a) or (b), stores the value "7" into the edge history circuit 155, and updates the edge history (EH=7).

In a case of "the counter value=8", the edge determination circuit 154 determines that the second middle edge ME2 is in the case (a), (b) or (c), stores the value "5" into the edge history circuit 155, and updates the edge history (EH=5).

In a case of "the counter value=9", the edge determination circuit 154 determines that the second middle edge ME2 is in the case (b), (c) or (d), stores the value "6" into the edge history circuit 155, and updates the edge history (EH=6).

In a case of "the counter value=10", the edge determination circuit 154 determines that the second middle edge ME2 is in the case (c) or (d), stores the value "8" into the edge history circuit 155, and updates the edge history (EH=8).

In a case of "the counter value=11", the edge determination circuit 154 determines that the second middle edge ME2 is in the case (d), stores the value "4" into the edge history circuit 155, and updates the edge history (EH=4).

Operation in Edge History 6 (EH=6):

In the case in which the first middle edge ME1 is determined to be in the case (b), (c) or (d), the acceptable counter values of the counter 156 for the second middle edge ME2 are 5 to 10.

When only single edge is detected in the counter value, the edge determination circuit 154 outputs the reception data (R_DATA) and the reception clock (R_CLK) on the basis of the change of the data at this time.

The edge determination circuit 154 calculates the next edge history as follows on the basis of the counter value at the time of the edge detection.

In a case of "the counter value=5", the edge determination circuit 154 determines that the second middle edge ME2 is in the case (a), stores the value "1" into the edge history circuit 155, and updates the edge history (EH=1).

In a case of "the counter value=6", the edge determination circuit 154 determines that the second middle edge ME2 is in the case (a) or (b), stores the value "7" into the edge history circuit 155, and updates the edge history (EH=7).

In a case of "the counter value=7", the edge determination circuit 154 determines that the second middle edge ME2 is in the case (a), (b) or (c), stores the value "5" into the edge history circuit 155, and updates the edge history (EH=5).

In a case of "the counter value=8", the edge determination circuit 154 determines that the second middle edge ME2 is in the case (b), (c) or (d), stores the value "6" into the edge history circuit 155, and updates the edge history (EH=6).

In a case of "the counter value=9", the edge determination circuit 154 determines that the second middle edge ME2 is in the case (c) or (d), stores the value "8" into the edge history circuit 155, and updates the edge history (EH=8).

In a case of "the counter value=10", the edge determination circuit 154 determines that the second middle edge ME2 is in the case (d), stores the value "4" into the edge history circuit 155, and updates the edge history (EH=4).

Operation in Edge History 7 (EH=7):

In the case (EH=7) in which the first middle edge ME1 is determined to be in the case (a) or (b), the acceptable counter values of the counter 156 for the second middle edge ME2 are 7 to 11. When only single edge is detected in the counter value, the edge determination circuit 154 outputs the reception data (R_DATA) and the reception clock (R_CLK) on the basis of the change of the data at this time.

The edge determination circuit 154 calculates the next edge history as follows on the basis of the counter value at the time of the edge detection.

In a case of "the counter value=7", the edge determination circuit 154 determines that the second middle edge ME2 is in the case (a), stores the value "1" into the edge history circuit 155, and updates the edge history (EH=1).

In a case of "the counter value=8", the edge determination circuit 154 determines that the second middle edge ME2 is in the case (a) or (b), stores the value "7" into the edge history circuit 155, and updates the edge history (EH=7).

In a case of "the counter value=9", the edge determination circuit 154 determines that the second middle edge ME2 is in the case (b) or (c), stores the value "9" into the edge history circuit 155, and updates the edge history (EH=9).

In a case of "the counter value=10", the edge determination circuit 154 determines that the second middle edge ME2 is in the case (c) or (d), stores the value "8" into the edge history circuit 155, and updates the edge history (EH=8).

In a case of "the counter value=11", the edge determination circuit 154 determines that the second middle edge ME2 is in the case (d), stores the value "4" into the edge history circuit 155, and updates the edge history (EH=4).

Operation in Edge History 8 (EH=8):

In the case (EH=8) in which the first middle edge ME1 is determined to be in the case (c) or (d), the acceptable counter values of the counter 156 for the second middle edge ME2 are 5 to 9. When only single edge is detected in the counter value, the edge determination circuit 154 outputs the reception data (R_DATA) and the reception clock (R_CLK) on the basis of the change of the data at this time.

The edge determination circuit 154 calculates the next edge history as follows on the basis of the counter value at the time of the edge detection.

In a case of "the counter value=5", the edge determination circuit 154 determines that the second middle edge ME2 is in the case (a), stores the value "1" into the edge history circuit 155, and updates the edge history (EH=1).

In a case of "the counter value=6", the edge determination circuit 154 determines that the second middle edge ME2 is in the case (a) or (b), stores the value "7" into the edge history circuit 155, and updates the edge history (EH=7).

In a case of "the counter value=7", the edge determination circuit 154 determines that the second middle edge ME2 is in the case (b) or (c), stores the value "9" into the edge history circuit 155, and updates the edge history (EH=9).

In a case of "the counter value=8", the edge determination circuit 154 determines that the second middle edge ME2 is in the case (c) or (d), stores the value "8" into the edge history circuit 155, and updates the edge history (EH=8).

In a case of "the counter value=9", the edge determination circuit 154 determines that the second middle edge ME2 is in the case (d), stores the value "4" into the edge history circuit 155, and updates the edge history (EH=4).

Operation in Edge History 9 (EH=9):

In the case (EH=9) in which the first middle edge ME1 is determined to be in the case (b) or (c), the acceptable counter values of the counter 156 for the second middle edge ME2 are 6 to 10. When only single edge is detected in the counter value, the edge determination circuit 154 outputs the reception data (R_DATA) and the reception clock (R_CLK) on the basis of the change of the data at this time.

The edge determination circuit 154 calculates the next edge history as follows on the basis of the counter value at the time of the edge detection.

In a case of "the counter value=6", the edge determination circuit 154 determines that the second middle edge ME2 is in the case (a), stores the value "1" into the edge history circuit 155, and updates the edge history (EH=1).

In a case of "the counter value=7", the edge determination circuit 154 determines that the second middle edge ME2 is in the case (a) or (b), stores the value "7" into the edge history circuit 155, and updates the edge history (EH=7).

In a case of "the counter value=8", the edge determination circuit 154 determines that the second middle edge ME2 is in the case (b) or (c), stores the value "9" into the edge history circuit 155, and updates the edge history (EH=9).

In a case of "the counter value=9", the edge determination circuit 154 determines that the second middle edge ME2 is in the case (c) or (d), stores the value "8" into the edge history circuit 155, and updates the edge history (EH=8).

In a case of "the counter value=10", the edge determination circuit 154 determines that the second middle edge ME2 is in the case (d), stores the value "4" into the edge history circuit 155, and updates the edge history (EH=4).

In the case "EH=0" or the cases "EH=5 to 9", the edge may be detected twice. In this case, as described below, it can be determined which one of the edges is the middle edge by combination of the edge history of the middle edge of the previous cycle and two counter values at which the edge of the next cycle is detected. In this process, the reception data (R_DATA) and the reception clock (R_CLK) at the determined middle edge are output on the basis of the change of the data at this time, and the next edge history is calculated.

In the case "EH=0" and a case in which either one of the two counter values is 8, the edge at the counter value of 8 is determined to be the middle edge.

In the case "EH=5" and a case in which either one of the two counter values is 8 or 9, the edge determination circuit 154 determines that the edge at the counter value of 8 or 9 is the middle edge.

In the case "EH=6" and a case in which either one of the two counter values is 7 or 8, the edge determination circuit 154 determines that the edge at the counter value of 7 or 8 is the middle edge.

In the case "EH=7" and a case in which either one of the two counter values is 8, 9 or 10, the edge determination circuit 154 determines that the edge at the counter value of 8, 9 or 10 is the middle edge.

In the case "EH=8" and a case in which either one of the two counter values is 6, 7 or 8, the edge determination circuit 154 determines that the edge at the counter value of 6, 7 or 8 is the middle edge.

In the case "EH=9" and a case in which either one of the two counter values is 7, 8 or 9, the edge determination circuit 154 determines that the edge at the counter value of 7, 8 or 9 is the middle edge.

In the case of "EH=0" or the cases of "EH=5 to 9", it cannot be often determined which one is the middle edge even by the above-described determination. In this case, the edge determination circuit 154 generates the decoding error. When the decoding error is generated, the reception circuit 140 stops the subsequent reception until the reception of the next frame, and entirely discards the frame or discards bits obtained after the occurrence of the error. When the reception of the entire frame or a part of bits is discarded, a reception buffer 141 in the reception circuit 140 retains the previous value, and the update is not performed.

There may be the case of the detection of two or more edges because of the influence of the noises or others regardless of the edge history. Even in this case, it cannot be determined which one of the middle edge, the border edge and the false edge caused by noises the target edge is, and therefore, the edge determination circuit 154 generates the decoding error. When the decoding error is generated, the reception circuit 140 stops the subsequent reception until the reception of the next frame, and entirely discards the frame or discards bits obtained after the occurrence of the error. When the reception of the entire frame or a part of bits is discarded, the reception buffer 141 in the reception circuit 140 retains the previous value, and the update is not performed.

Figure 11:
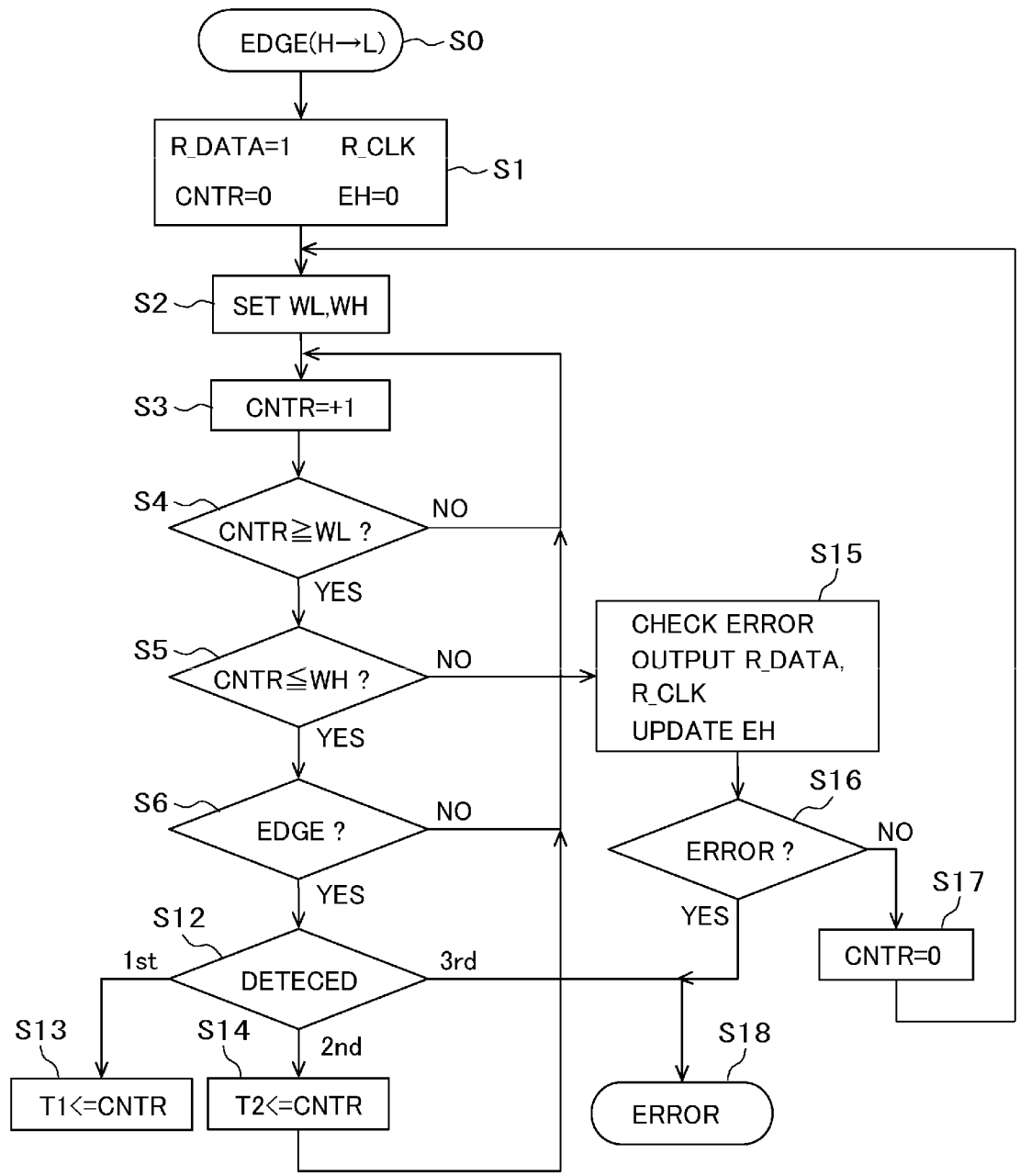
FIG. 11 is a flowchart showing a hardware processing in a case in which the decoder according to the second working example detects a fall edge.

An edge detecting operation of the decoder 150 according to the second working example will be explained with reference to FIG. 11. FIG. 11 is a flowchart showing a hardware processing performed when the decoder according to the second working example detects the fall edge.

The operations in the steps S0 to S6 according to the second working example are the same operations as those of the first working example.

(Step S12)

The edge determination circuit 154 determines how many edges have been received before the detected edge.

(Step S13) If the detected edge is the first edge, the edge determination circuit 154 sets the counter value of the counter 156 to be the first edge position (T1).

(Step S14)

If the detected edge is the second edge, the edge determination circuit 154 sets the counter value of the counter 156 to be the second edge position (T2).

(Step S15)

In the step S5, if the counter value is larger than the upper limit of the detection range, the edge determination circuit 154 executes as follows on the basis of the edge history and T1 and T2. The edge determination circuit 154 checks the decoding error. And, the edge determination circuit 154 outputs the input signal (R_DATA), and outputs the reception edge information (REI) to the edge history circuit 155, the counter 156 and the clock generation circuit 157. The clock generation circuit 156 generates and outputs the reception clock (R_CLK) on the basis of the reception edge information (REI). The edge history circuit 155 updates the edge history on the basis of the reception edge information (REI).

(Step S16 and Step S17)

In the step S16, the edge determination circuit 154 determines whether there is the decoding error. In the step S17, if the decoding error has not been detected in the step S16, the counter 156 clears the count value to be "0".

(Step 18)

If the detected edge in the step S12 is the third edge and if the error has been determined in the step S16, the edge determination circuit 154 outputs the decoding error.

According to the second working example, when the counter value for the recognition of the middle edge is changed by the previous edge history, the decoding is achieved in the sampling cycle that is ⅛ of the cycle of the Manchester-coded data and in the jitter up to ±(⅛×2) of the cycle of the Manchester-coded data. The jitter range of the second working example is 4/3 times wider than that of the first working example.

Third Working Example

Figure 12:
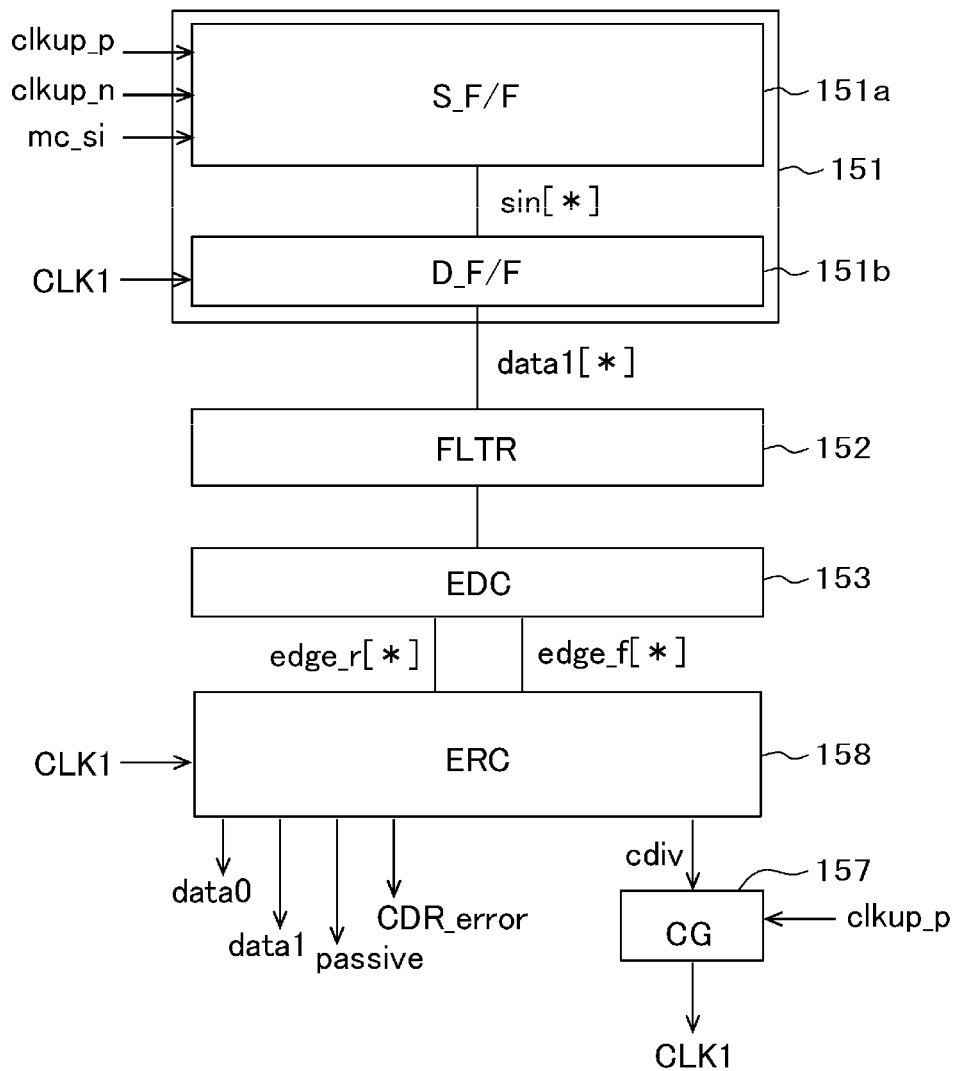
FIG. 12 is a block diagram showing a configuration of a decoder according to a third working example.
Figure 13:
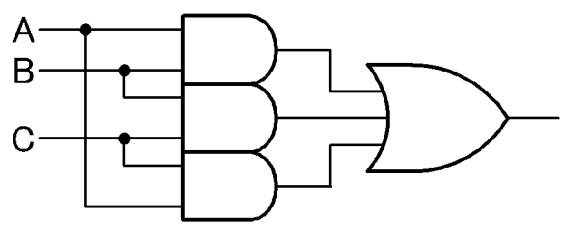
FIG. 13 is a circuit diagram showing a three-input majority decision circuit.
Figure 14:
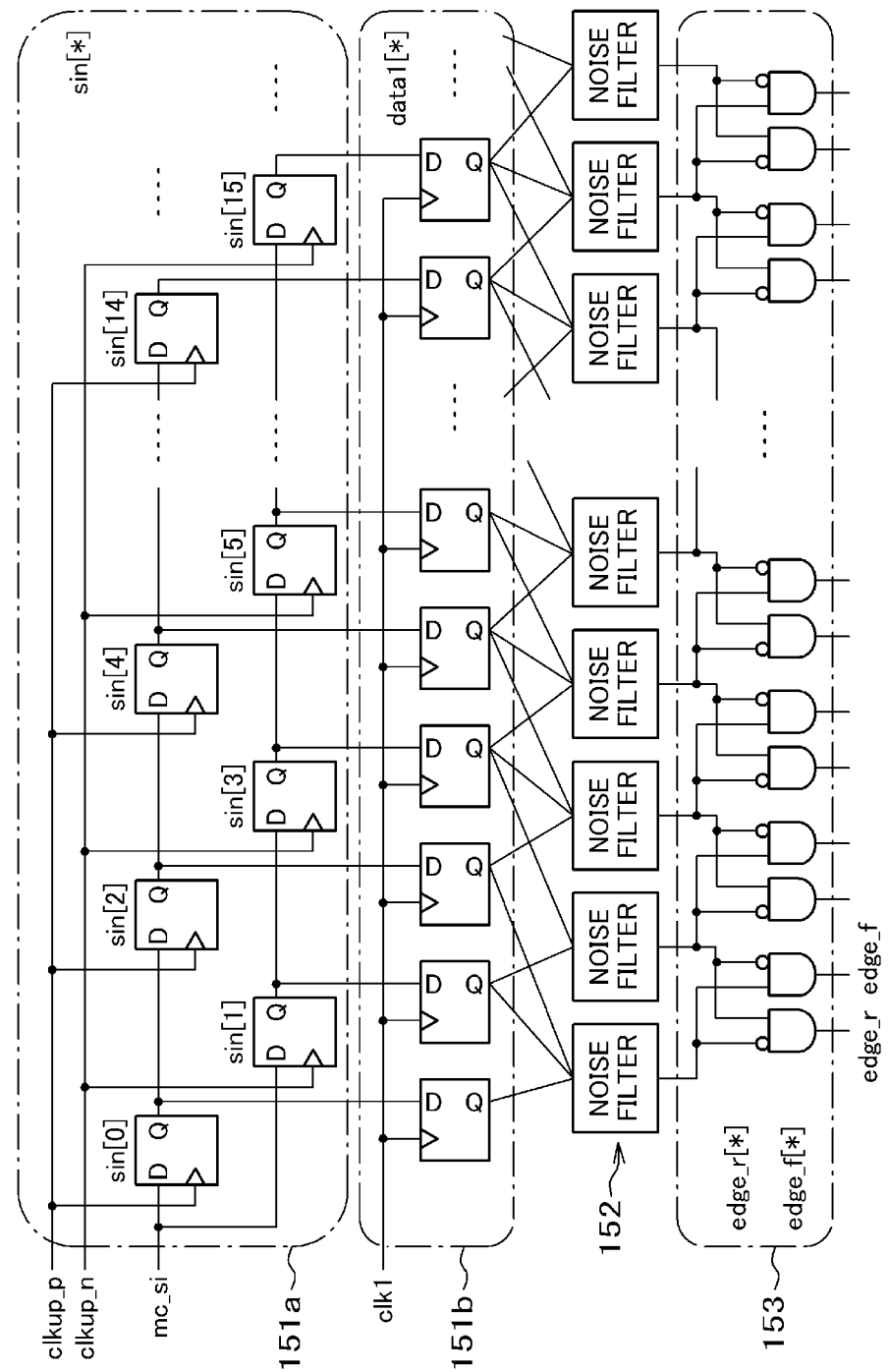
FIG. 14 is a block diagram showing configurations of a flip flop for shift, a flip flop for data sampling, a noise filter and an edge detection circuit shown in FIG. 12.
Figure 15:
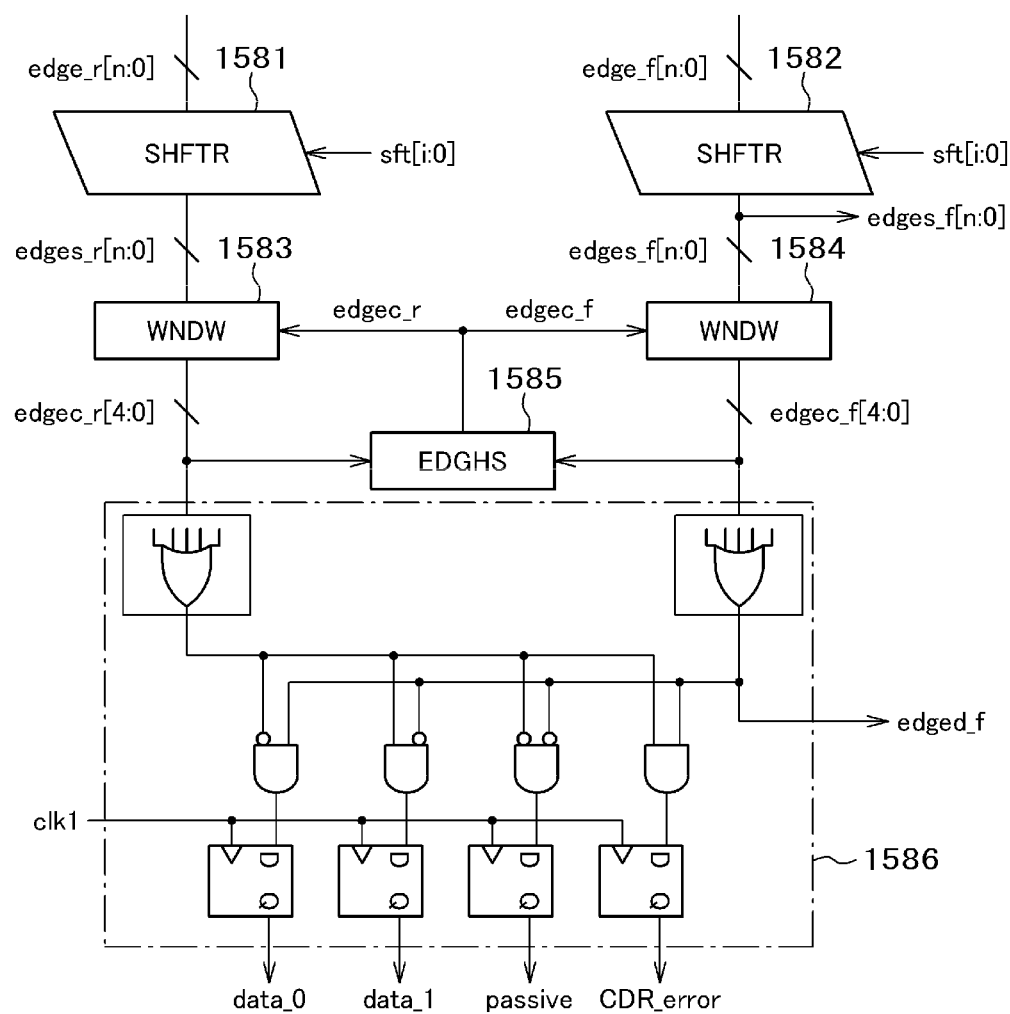
FIG. 15 is a block diagram showing a part of a configuration of an edge recognition circuit shown in FIG. 12.
Figure 16:
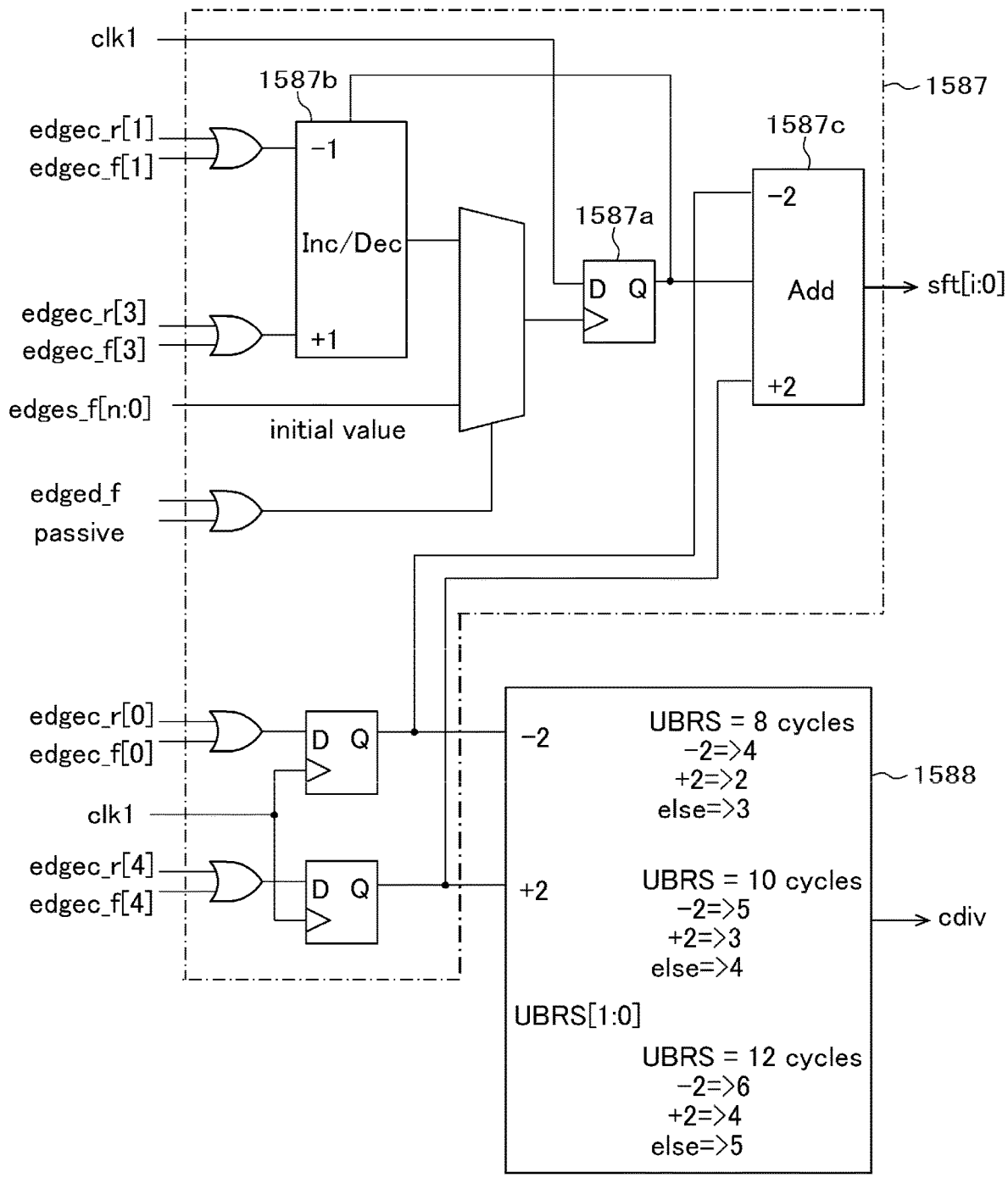
FIG. 16 is a block diagram showing a part of the configuration of the edge recognition circuit shown in FIG. 12.
Figure 17:
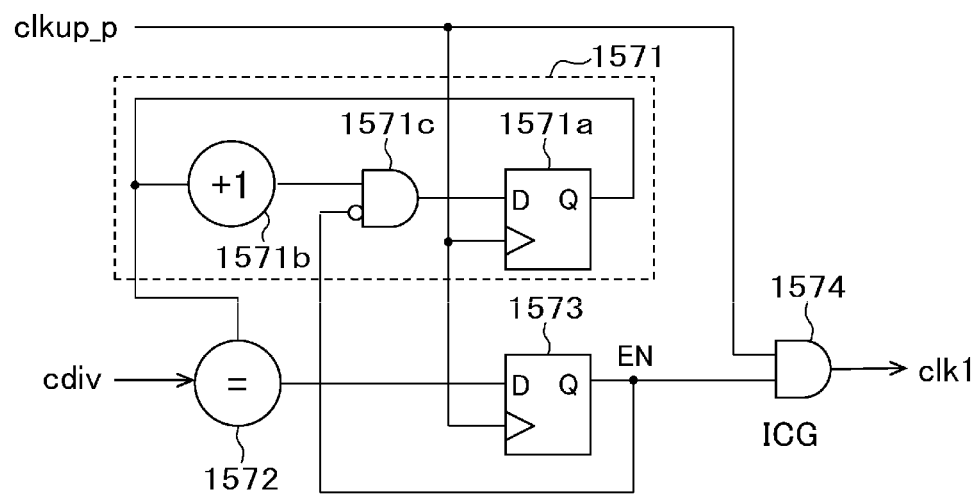
FIG. 17 is a block diagram of a clock generation circuit shown in FIG. 12.

FIG. 12 is a block diagram showing a configuration of a decoder according to the third working example. FIG. 13 is a circuit diagram showing a three-input majority decision circuit. FIG. 14 is a block diagram showing configurations of the flip flop for shift, the flip flop for data sampling, the noise filter and the edge detection circuit shown in FIG. 12. FIG. 15 is a block diagram showing a part of a configuration of the edge recognition circuit shown in FIG. 12. FIG. 16 is a block diagram showing a part of a configuration of the edge recognition circuit shown in FIG. 12. FIG. 17 is a block diagram of the clock generation circuit shown in FIG. 12.

The decoder 150 according to the third working example includes a synchronous circuit (SYNC) 151, a noise filter (FLTR) 152, an edge detection circuit (EDC) 153, and a clock generation circuit (CG) 157 as similar to the first working example. The decoder 150 according to the third working example further includes an edge recognition circuit 158 in place of the edge determination circuit (EJC) 154, the edge history circuit (EHC) 155 and the counter (CNTR) 156 according to the first working example.

As shown in FIG. 12, the synchronous circuit (SYNC) 151 is made of a shift flip flop (S_F/F) 151a and a data-sampling flip flop (D_F/F) 151b. To the synchronous circuit (SYNC) 151, two-phase clocks (clkup_p and clkup_n) of 400 MHz, a Manchester-coded signal (mc_si) and a clock (clk1) of 100 MHz are input. The clock (clk1) is a clock extracted from the Manchester-coded signal (mc_si). The sampling using the two-phase clocks (clkup_p and clkup_n) of 400 MHz is sampling using a clock of 800 MHz.

As shown in FIG. 14, the shift flip flop 151a is made of serial-connected flip flops, and sequentially receives the Manchester-coded signal (mc_si) while using the two-phase clocks (clkup_p and clkup_n). In this process, the shift flip flop 151a is made of, for example, 18 flip flops. The data received into the flip flop 151a is referred to as "sin[*]". The data-sampling flip flops (D_F/F) 151b is made of flip flops, the number of which is the same as the number of the shift flip flops 151a. The data-sampling flip flops 151b samples the data that has been received into the flip flop 151a in parallel at a rise timing of the clock (clk1). The data that has been received into the data-sampling flip flops 151b is referred to as "data1[*]".

The noise filter 152 is made of a three-input majority decision circuit as shown in FIG. 13. This circuit is a circuit for outputting "1" if two or more pieces of data is "1". The noise filter 152 is made of, for example, 16 three-input majority decision circuits.

The edge detection circuit 153 extracts data having different adjacent bit values from the data1[*] signal having passed the noise filter 152. A signal indicating the detection of the data change from "0" to "1" is "edge_r[*]", and a signal indicating the detection of the data change from "1" to "0" is "edge_f[*]". The term "edge_r[*]" is also referred to as "edge_r[n:0], and the term "edge_f[*]" is also referred to as "edge_f[n:0]. In this case, "n" is a natural number. For example, "n=14" is assumed.

The edge recognition circuit 158 includes shift circuits (SHFTR) 1581 and 1582, window cutout circuits 1583 and 1584, and an edge history circuit (EDGHS) 1585.

The shift circuits 1581 and 1582 output signals "edges_r[n:0]" and "edges_f[n:0]" obtained by shifting the respective signals "edge_r[n:0]" and "edge_f[n:0]" by a shift amount (sft[i:0]). The shift amount (sft[i:0]) is generated by a shift-amount generation circuit 1587 described later. If a value of the shift amount (sft[i:0]) is positive, the shift circuits 1581 and 1582 shift the respective signals "edge_r[n:0]" and "edge_f[n:0]" rightward (toward the low-order bit). If a value of the shift amount (sft[i:0]) is negative, the shift circuits 1581 and 1582 shift the respective signals "edge_r[n:0]" and "edge_f[n:0]" leftward (toward the high-order bit).

While the window cutout circuit 1583 will be explained below, the window cutout circuit 1584 operates as similar to the window cutout circuit 1583. The window cutout circuit 1583 extracts 5 bits from the "edges_r[n:0]", and sets "edgec_r[4:0]" that is the range where the middle edge is detected (middle-edge detection range). The middle-edge detection range is controlled by the "sft[i:0]". After the middle edge is detected, for example, any bit of the "edgec_r[4:0]" becomes "1". The edge history circuit 1585 records the "edgec_r" indicating a position of the previous cycle at which the middle edge has been detected (middle-edge position). The window cutout circuit 1583 corrects the middle-edge detection range (edgec_r[4:0]) on the basis of the middle-edge position (edgec_r) of the previous cycle recorded in the edge history circuit 1585.

More specifically, if the middle-edge position (edgec_r) of the previous cycle is at a high-order bit of the middle-edge detection range (edgec_r[4:0]), the window cutout circuit 1583 masks the highest-order bit (bit [4]). In this process, the high-order bit is a bit [3] or the bit [4]. That is, the bit [3:0] of the middle-edge detection range (edgec_r[4:0]) is set to the edge detection range. If the middle-edge position (edgec_r) of the previous cycle is at a low-order bit (a bit [0] or a bit [1]) thereof, the window cutout circuit 1583 masks the lowest-order bit (bit [0]) of the middle-edge detection range (edgec_r[4:0]). That is, the bit [4:1] of the middle-edge detection range (edgec_r[4:0]) is set to the edge detection range. If the middle-edge position (edgec_r) of the previous cycle is another bit (a bit [2]), the bit to be masked is not changed, in other words, the bit to be masked is set to be the same as the masked bit of the previous cycle.

As shown in FIG. 15, the edge recognition circuit 158 further includes a data detection circuit 1586. If any bit of the "edgec_r[4:0]" is 1, this means that the edge changing from "0" to "1" exists in the middle-edge detection range, and therefore, the data detection circuit 1586 sets the "data_1" signal to be "1". If any bit of the "edgec_f[4:0]" is 1, this means that the edge changing from "1" to "0" exists in the middle-edge detection range, and therefore, the data detection circuit 1586 sets the "data_0" signal to be "1". However, if both the "edgec_r[4:0]" and the "edgec_f[4:0]" contain "1", the deference cannot be recognized, and therefore, the data detection circuit 1586 sets the "CDR_error" signal to be "1". If all bits of both the "edgec_r[4:0]" and the "edgec_f[4:0]" are "0", the data detection circuit 1586 determines that there is no middle edge, in other words, determines that this is not the frame (frame end), and sets the "passive" signal to be "1".

As shown in FIG. 16, the edge recognition circuit 158 further includes the shift-amount generation circuit 1587 and a clock control circuit 1588.

The shift-amount generation circuit 1587 includes a flip flop 1587a that stores the "sft[*]" value indicating the shift amount. If the first fall edge in the frame is detected, the "edges_f[n:0]" contains "1". This is set to be an initial value, and the bit value having "1" in the "edges_f[n:0]" is input to the flip flop 1587a. That is, an initial sft[*] value corresponds to a phase difference between the clock superimposed on the Manchester-coded signal (mc_si) at the time of frame start and the clock (clk1) having the same frequency and generated in the decoder 150 at the time of frame start.

Then, in a case of shift by one cycle of the clock (clkup_p/clkup_n) of 800 MHz because of the jitter, an increase/decrease (Inc/Dec) circuit 1587b corrects the sft[*]

value to become the "value +1" or "value −1". In this process, the shift by one cycle corresponds to a case in which the "edgec_r[3]", the "edgec_f[3]", the "edgec_r[1]" or the "edgec_f[1]" is "1". If the "edgec_r[3]" or the "edgec_f[3]" is "1", the sft[*]value is incremented by "1" (to become "value +1"). If the "edgec_r[1]" or the "edgec_f[1]" is "1", the sft[*] value is decremented by "1" (to become "value −1").

And, in a case of shift by two cycles of the clock (clkup_p/clkup_n) of 800 MHz, an adder 1587c sets the sft[*] value for only one cycle to be a "value +2" or "value −2".

Further, in a case of shift by two cycles of the clock (clkup_p/clkup_n) of 800 MHz, the clock cycle of the clock (clk1) is controlled as described later. In this process, the shift by two cycles corresponds to a case in which the "edgec_r[4]", the "edgec_f[4]", the "edgec_r[0]" or the "edgec_f[0]" is "1". If the "edgec_r[4]" or the "edgec_f[4]" is "1", the sft[*] value is incremented by "2" (to become "value +2"). If the "edgec_r[0]" or the "edgec_f[0]" is "1", the sft[*] value is decremented by "2" (to become "value −2").

The clock control circuit 1588 generates a signal (cdiv) for controlling a frequency dividing ratio of the clock generation circuit 157. A "division-by-four" is normally set as a frequency dividing ratio of the frequency (400 MHz) of the clock (clkup_p) and a baud rate (100 MHz). In the "division-by-four" case, the cdiv value becomes "3". In a case of shift by two cycles of the clock (clkup_p/clkup_n) of 800 MHz at the time of the middle-edge detection, the clock control circuit 1588 sets the cdiv value for only one cycle of the clock (clk1) to the "value +1" or "value −1". If the "edgec_r[0]" or the "edgec_f[0]" is "1", the clock control circuit 1588 sets the cdiv value to "4". If the "edgec_r[4]" or the "edgec_f[4]" is "1", the clock control circuit 1588 sets the cdiv value to "2".

Note that the clock control circuit 1588 includes two-bit register UBRS [1:0]. The "division-by-four" (8 cycles), "division-by-five" (10 cycles) and "division-by-six" (12 cycles) can be set as the frequency dividing ratio in the register UBRS [1:0]. In the "division-by-five" case, the cdiv value normally becomes "4". If the "edgec_r[0]" or the "edgec_f[0]" is "1", the cdiv value normally becomes "5". If the "edgec_r[4]" or the "edgec_f[4]" is "1", the cdiv value normally becomes "3". In the "division-by-six" case, the cdiv value normally becomes "5". If the "edgec_r[0]" or the "edgec_f[0]" is "1", the cdiv value normally becomes "6". If the "edgec_r[4]" or the "edgec_f[4]" is "1", the cdiv value normally becomes "4".

The clock generation circuit 157 generates the clock (clk1) by dividing the frequency of the clock (clkup_p) by the cdiv value. This process will be specifically explained below. The clock generation circuit 157 includes a counter 1571, a comparator 1572 for comparing an output of the counter 1571 and the cdiv value, and a flip flop 1573 for storing a comparison result. The counter 1571 counts up the counter value from "0" to the cdiv value for every clock (clkup_p) by using the increment circuit 1571b. The comparator 1572 compares an output (counter value) of the flip flop 1571a of the counter 1571 with the cdiv value, and outputs "0" if the counter value is smaller than the cdiv value. If the counter value is equal to the cdiv value, the comparator 1572 outputs "1". The counter 1571 counts up the counter value if an enable signal (EN) that is the output of the flip flop 1573 is "0". The counter 1571 clears the counter value to be "0" if the enable signal (EN) is "1". The enable signal (EN) becomes "1" for every "value of the cdiv+1". A clock gating circuit (ICG) 1574 outputs the clock (clkup_p) if the enable signal (EN) is "1". In this process, a value obtained by adjusting one pulse to the pulse number corresponding to the cdiv value on the basis of the pulse of the clock (clkup_p) is output as the clock (clk1). By the change of the cdiv value, the number of samplings per one cycle of the clock (clk1) can be changed. The counter 1571 counts the counter value from "0" to the cdiv value, and the clock generation circuit 157 can change the cycle of the clock (clk1) by the change of the cdiv value. Note that the counter 1571 may count the counter value from a setting value other than "0" to the cdiv value to change the cycle of the clock (clk1).

An operation of the decoder according to the third working example will be explained with reference to FIGS. 18 to 24. Each of FIGS. 18 to 24 is a timing chart showing the operation of the decoder according to the third working example.

First, denotations of FIGS. 18 to 24 will be explained. A term "edgebit" indicates which bit of the "edgec_r" or "edgec_f" is "1". That is, if the "edgec_r[0]" or "edgec_f[0]" contains "1", the "edgebit" becomes "−2". If the "edgec_r [1]" or "edgec_f[1]" contains "1", the "edgebit" becomes "−1". If the "edgec_r[2]" or "edgec_f[2]" contains "1", the "edgebit" becomes "0". If the "edgec_r[3]" or "edgec_f[3]" contains "1", the "edgebit" becomes "+1". If the "edgec_r [4]" or "edgec_f[4]" contains "1", the "edgebit" becomes "+2". If the "passive" value is "1", the "edgebit" becomes "0".

A term "data2_pre" indicates which one of "dadta_0", "data_1", "passive" or "CDR_error" has been set in the data detection circuit 1586 shown in FIG. 15. The value in the case of "data_0" is "0", and the value in the case of "dadta_1" is "1". A term "data2" indicates a final data value. And, a vertical solid line of each diagram indicates a bit border of the Manchester-coded signal (mc_si), and a vertical broken line of the same indicates a bit middle point of the Manchester-coded signal (mc_si).

A vertical arrow indicates the rise edge of the clock (clk1) that is a load timing from the "sin[*]" to the "data_1". Note that a waveform of the clock (clk1) is illustrated to have a duty ratio of nearly 50%. However, in the waveform of the clock (clk1) generated in the clock generation circuit 157 shown in FIG. 17, the rise edge is at a position in the drawing, causes a clock having a pulse width of the clock (clkup_p), and a position of the fall edge is different from a position in the drawing.

Figure 18:
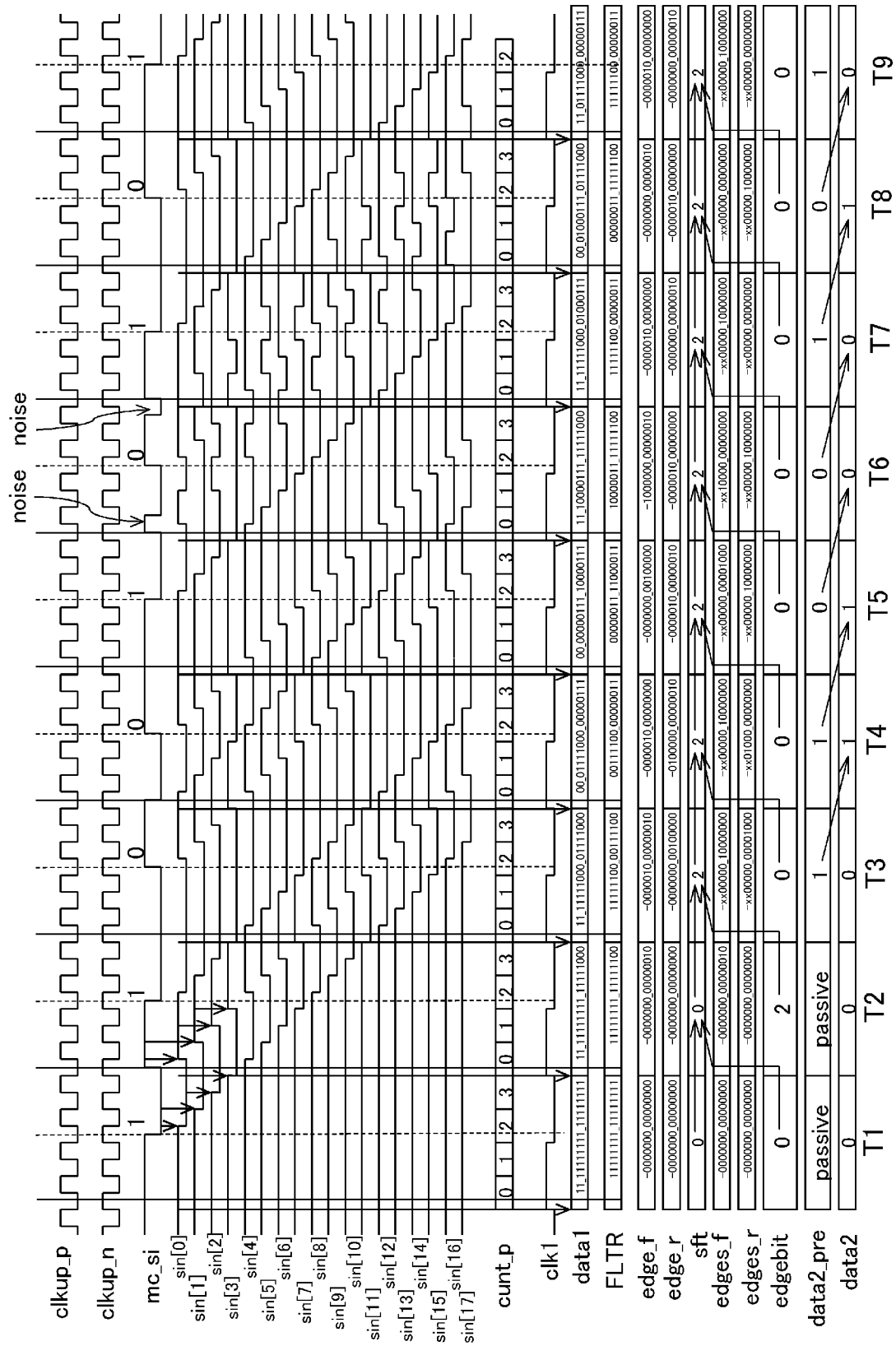
FIG. 18 is a timing chart showing an operation of the decoder according to the third working example.

FIG. 18 shows a waveform with the noise but with the jitter within ⅛ of the bit cycle (steady state), in a case in which a "H" period of the clock (clkup_n) contains a middle edge of a start bit.

In sampling in a cycle T2, the first edge of the Manchester-coded signal (mc_si) is detected, and the following data is generated. In this process, the rightmost side is the bit [0]. The "data1" is data having a 18-bit length, and the FLTR is data having a 16-bit length. Each of the "edge_f", "edge_r", "edges_f" and "edges_r" is data having a 15-bit length.

data1=11_11111111_11111000
    FLTR=11111111_11111100
    edge_f=−0000000_00000010
    edge_r=−0000000_00000000
    edges_f=−0000000_00000010
    edges_r=−0000000_00000000

In the first sampling, the flip flop 1587a is cleared to be "0" by an input signal to a not-illustrated clear terminal of the flip flop 1587a. Therefore, since the sft value is "0", the "edge_f=edges_f" is established. A bit at which the edge is detected at this time is the "edges_f[1]", and therefore, the "edgebit" becomes "2" that is the detection bit of the "edge_f". Thus, "2" is set as the initial sft value in the flip flop 1587*a*. A sft value of a next cycle T3 becomes "2". The "data2_pre" of the cycle T2 corresponds to the edge detection after the "passive" of the cycle T1, and therefore, becomes the "passive".

In cycles after the cycle T3, the shift circuits 1581 and 1582 generate the "edges_f" and the "edges_r" by shifting the "edge_f" and the "edge_r" by the sft value, respectively. The shift circuits 1581 and 1582 shift them rightward (to the low-order bit side) if the sft value is positive, and shift them leftward (to the high-order bit side) if the sft value is negative. The shift-amount generation circuit 1587 generates a sft value of a next cycle by adding the "edgebit" value of the previous cycle to the sft value of the previous cycle. In this process, the middle-edge detection range (edgec_r[4:0] and edgec_f[4:0]) corresponds to edges_r[9:5] and edges_f[9:5], respectively.

For example, in the cycle T3, the following data is generated. In this data, "x" indicates meaningless data.
data1=11_11111000_01111000
FLTR=11111100_00111100
edge_f=-0000010_00000010
edge_r=-0000000_00100000
edges_f=-xx00000_10000000
edges_r=-xx00000_00001000
edgec_f[4:0]=00100
edgec_r[4:0]=00000

In the cycle T3, "edges_f[7]" that is the middle position of "edges_f[9:5]" that shifts rightward by two bits from the "edge_f" is "1". That is, since the edgec_f[2] value is "1", the "edgebit" value becomes "0", and the correction for the middle-edge detection range in a next cycle T4 is not performed. And, the sft value of the next cycle T4 does not change and is still "2". Since "1" is detected in the "edges_f", the data_1 value becomes "1", the data2_pre value becomes "1", and the data2 value in the next cycle T4 becomes "1".

After the cycle T3, the sft value is the same as "2", and the cycles after the cycle T4 similarly proceed. When the jitter is within the ⅛ cycle, either the "edgec_r[2]" or the "edgec_f[2]" that is the middle bit of either the "edges_r" or the "edges_f" necessarily becomes "1".

In operation of a cycle T7, the "H" noise having a width that is equal to or smaller than the ⅛ cycle is superimposed on the Manchester-coded signal (mc_si). And, in an operation of a cycle T8, the "L" noise having a width that is equal to or smaller than the ⅛ cycle is superimposed on the Manchester-coded signal (mc_si). Although the noise is loaded into the "data1", the noise of 1 bit is removed by the noise filter (FLTR), and data after that is normally processed.

A waveform in the case in which the "H" period of the clock (clkup_p) contains the middle edge of the start bit is the same as the waveform of FIG. 18. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 18 is performed. The operations in the cycle T7 and the cycle T8 with the noise are also the same as the operation without the noise through the noise filter FLTR as similar to FIG. 18.

Figure 19:
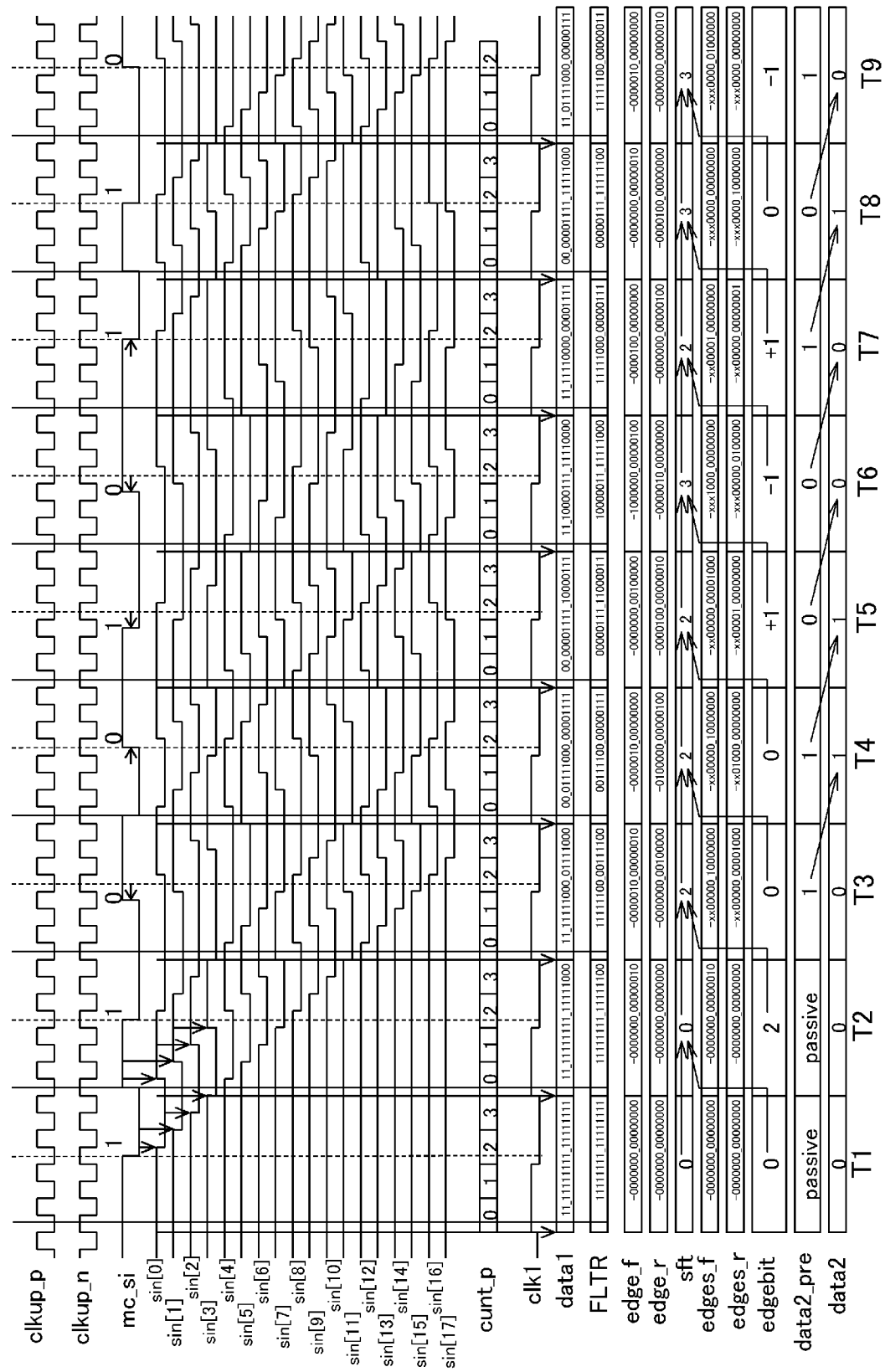
FIG. 19 is a timing chart showing the operation of the decoder according to the third working example.

FIG. 19 shows a waveform with the jitter advancing by ⅛ of the bit cycle, in the case in which the "H" period of the clock (clkup_n) contains the middle edge of the start bit. A leftward arrow of the Manchester-coded signal (mc_si) indicates the edge advancing by ⅛ cycle, and a rightward arrow of the same indicates an edge returning to the original one. The operations up to the cycle T4 are the same as those of FIG. 18. A cycle T5 is influenced by the jitter first.

In the cycle T5, the following data is generated.
data1=00_00001111_10000111
FLTR=00000111_11000011
edge_f=-0000000_00100000
edge_r=-0000100_00000010
edges_f=-xx00000_00001000
edges_r=-xx00001_00000000
edgec_f[4:0]=00000
edgec_r[4:0]=01000

In the cycle T5, "1" is detected at "edges_r[8]" that shifts leftward by one bit from the middle position of "edges_r[9:5]". That is, since "edgec_r[3]" is "1", the "edgebit" value becomes "+1", and a sft value of a next cycle T6 changes from "2" to "3". Since the "edgec_r[3]" is "1", the window cutout circuit 1583 masks the highest-order bit (bit [4]) in the next cycle T6. That is, a bit [3:0] of the middle-edge detection range ("edgec_r[4:0]", "edgec_f[4:0]") is set to be the edge detection range.

Therefore, in the cycle T6, the following data is generated. In this data, a term "M" in each of the "edgec_f" and the "edgec_r" indicates a masked bit.
data1=11_10000111_11110000
FLTR=10000011_11111000
edge_f=-1000000_00000100
edge_r=-0000010_00000000
edges_f=-xxx1000_00000000
edges_r=-xxx0000_01000000
edgec_f[4:0]=M0000
edgec_r[4:0]=M0010

In the cycle T6, "1" is detected at "edges_r[6]" that shifts rightward by one bit from the middle position of "edges_r[9:5]". That is, since "edgec_r[1]" is "1", the "edgebit" value becomes "−1", and a sft value of a next cycle T7 returns from "3" to "2". Since the "edgec_r[1]" is "1", the window cutout circuit 1583 masks the lowest-order bit (bit [0]) in the next cycle T7. That is, a bit [4:1] of the middle-edge detection range ("edgec_r[4:0]", "edgec_f[4:0]") is set to be the edge detection range.

Therefore, in the cycle T7, the following data is generated.
data1=11_11110000_00001111
FLTR=11111000_00000111
edge_f=-0000100_00000000
edge_r=-0000000_00000100
edges_f=-xx00001_00000000
edges_r=-xx00000_00000001
edgec_f[4:0]=0100M
edgec_r[4:0]=0000M In the cycle T7, "1" is detected at "edges_f[8]" that shifts leftward by one bit from the middle position of "edges_f[9:5]". That is, since "edgec_f[3]" is "1", the "edgebit" value becomes "+1", and a sft value of a next cycle T8 changes from "2" to "3" again.

Therefore, in the cycle T8, the following data is generated.
data1=00_00001111_11111000
FLTR=00000111_11111100
edge_f=-0000000_00000010
edge_r=-0000100_00000000
edges_f=-xxx0000_00000000
edges_r=-xxx0000_10000000
edgec_f[4:0]=M0000 edgec_r[4:0]=M0010

In the cycle T8, the middle edge is sampled in the same phase as that of the cycle T7. However, "1" is detected at "edges_r[7]" that is the middle bit of "edges_r[9:5]". That is, since "edgec_r[2]" is "1", the "edgebit" value becomes "0", and a sft value of a next cycle T9 does not change and is "3".

Therefore, in the cycle T9, the following data is generated.
   data1=11_01111000_00000111
   FLTR=11111100_00000011
   edge_f=-0000010_00000000
   edge_r=-0000000_00000010
   edges_f=-xxx0000_10000000
   edges_r=-xxx0000_00000000
   edgec_f[4:0]=0010M
   edgec_r[4:0]=0000M In the cycle T9, "1" is detected at "edges_f[6]" that shifts rightward by one bit from the middle position of "edges_f [9:5]". That is, since "edgec_f[1]" is "1", the "edgebit" value becomes "−1", and a sft value of a next cycle returns from "3" to "2" again.

A waveform in the case in which the "H" period of the clock (clkup_p) contains the middle edge of the start bit is the same as the waveform of FIG. 19. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 19 is performed.

Figure 20:
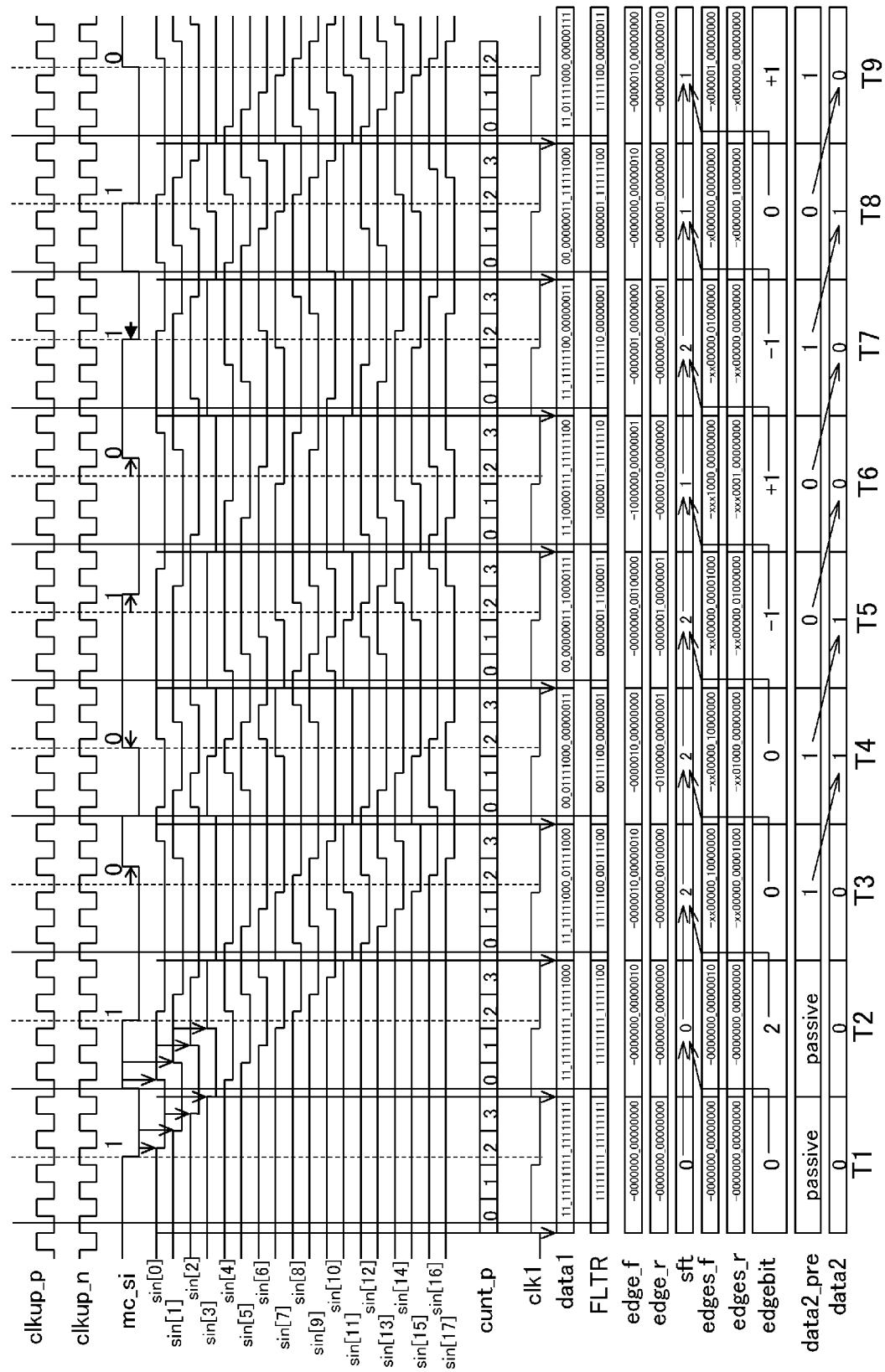
FIG. 20 is a timing chart showing the operation of the decoder according to the third working example.

FIG. 20 shows a waveform with the jitter delaying by ⅛ of the bit cycle, in the case in which the "H" period of the clock (clkup_n) contains the middle edge of the start bit. A rightward arrow of the Manchester-coded signal (mc_si) indicates the edge delaying by ⅛ cycle, and a leftward arrow of the same indicates an edge returning to the original one. The operations up to the cycle T4 are the same as those of FIG. 18. A cycle T5 is influenced by the jitter first.

In the cycle T5, the following data is generated.
   data1=00_00000011_10000111
   FLTR=00000001_11000011
   edge_f=-0000000_00100000
   edge_r=-0000001_00000001
   edges_f=-xx00000_00001000
   edges_r=-xx00000_01000000
   edgec_f[4:0]=00000
   edgec_r[4:0]=00010

In the cycle T5, "1" is detected at "edges_r[6]" that shifts rightward by one bit from the middle position of "edges_r [9:5]". That is, since "edgec_r[1]" is "1", the "edgebit" value becomes "−1", and a sft value of a next cycle T6 changes from "2" to "1".

Therefore, in the cycle T6, the following data is generated.
   data1=11_10000111_11111100
   FLTR=10000011_11111110
   edge_f=-1000000_00000001
   edge_r=-0000010_00000000
   edges_f=-xxx1000_00000000
   edges_r=-xxx0001_00000000
   edgec_f[4:0]=0000M
   edgec_r[4:0]=1000M In the cycle T6, "1" is detected at "edges_r[8]" that shifts leftward by one bit from the middle position of "edges_r[9: 5]". That is, since "edgec_r[3]" is "1", the "edgebit" value becomes "+1", and a sft value of a next cycle T7 returns from "1" to "2".

Therefore, in the cycle T7, the following data is generated.
   data1=11_11111100_00000011
   FLTR=11111110_00000001
   edge_f=-1000001_00000000
   edge_r=-0000000_00000001
   edges_f=-xxx0000_01000000
   edges_r=-xxx0000_00000000
   edgec_f[4:0]=M0001
   edgec_r[4:0]=M0000

In the cycle T7, "1" is detected at "edges_f[6]" that shifts rightward by one bit from the middle position of "edges_f [9:5]". That is, since "edgec_f[1]" is "1", the "edgebit" value becomes "−1", and a sft value of a next cycle T8 changes from "2" to "1" again.

Therefore, in the cycle T8, the following data is generated.
   data1=00_00000011_11111000
   FLTR=00000001_11111100
   edge_f=-0000000_00000010
   edge_r=-0000001_00000000
   edges_f=-x000000_00000000
   edges_r=-x000000_10000000
   edgec_f[4:0]=0000M
   edgec_r[4:0]=0010M In the cycle T8, the middle edge is sampled in the same phase as that of the cycle T7. However, "1" is detected at "edges_r[7]" that is the middle bit of "edges_r[9:5]". That is, since "edgec_r[2]" is "1", the "edgebit" value becomes "0", and a sft value of a next cycle T9 does not change and is still "1".

Therefore, in the cycle T9, the following data is generated.
   data1=11_01111000_00000111
   FLTR=11111100_00000011
   edge_f=-0000010_00000000
   edge_r=-0000000_00000010
   edges_f=-x000001_00000000
   edges_r=-x000000_00000000
   edgec_f[4:0]=1000M
   edgec_r[4:0]=0000M In the cycle T9, "1" is detected at "edges_f[8]" that shifts leftward by one bit from the middle position of "edges_f[9: 5]". That is, since "edgec_f[3]" is "1", the "edgebit" value becomes "+1", and a sft value of a next cycle returns from "1" to "2" again.

A waveform in the case in which the "H" period of the clock (clkup_p) contains the middle edge of the start bit is the same as the waveform of FIG. 20. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 20 is performed.

Figure 21:
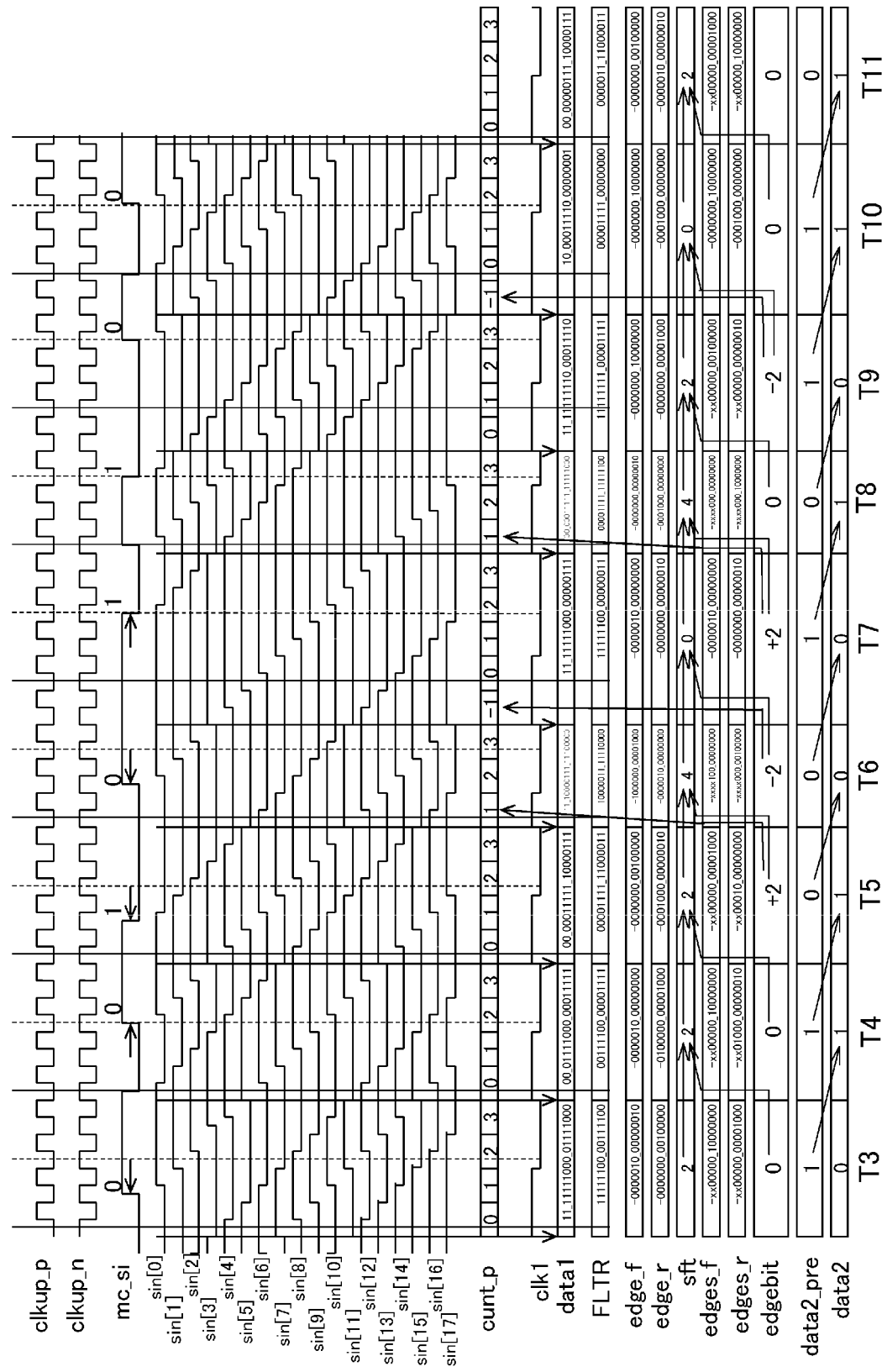
FIG. 21 is a timing chart showing the operation of the decoder according to the third working example.

FIG. 21 shows a waveform with the jitter advancing by ¼ of the bit cycle, in the case in which the "H" period of the clock (clkup_n) contains the middle edge of the start bit. A leftward arrow of the Manchester-coded signal (mc_si) indicates the edge advancing by ¼, and a rightward arrow of the same indicates an edge returning to the original one. The operations up to the cycle T4 are the same as those of FIG. 18. A cycle T5 is influenced by the jitter first.

In the cycle T5, the following data is generated.
   data1=00_00011111_10000111
   FLTR=00001111_11000011
   edge_f=-0000000_00100000
   edge_r=-0001000_00000010 edges_f=-xx00000_00001000
edges_r=-xx00010_00000000
edgec_f[4:0]=00000
edgec_r[4:0]=10000

In the cycle T5, "1" is detected at "edges_r[9]" that shifts leftward by two bits from the middle position of "edges_r [9:5]". That is, since "edgec_r[4]" is "1", the "edgebit" value becomes "+2", and a sft value of a next cycle T6 temporarily changes from "2" to "4". And, the cdiv value temporarily becomes "2" by adding "−1" to "3", and the range of the next cycle T6 decreases to three cycles of the clock (clkup_p).

Therefore, in the cycle T6, the following data is generated.

data1=11_10000111_11100000
FLTR=10000011_11110000
edge_f=-1000000_00001000
edge_r=-0000010_00000000
edges_f=-xxxx100_00000000
edges_r=-xxxx000_00100000
edgec_f[4:0]=M0000
edgec_r[4:0]=M0001

In the cycle T6, "1" is detected at "edges_r[5]" that shifts rightward by two bits from the middle position of "edges_r [9:5]". That is, since "edgec_r[0]" is "1", the "edgebit" value becomes "−2", and a sft value of a next cycle T7 temporarily changes from "2" that is the original one to "0". And, the cdiv value temporarily becomes "4" by adding "+1" to "3", and the range of the next cycle T7 increases to five cycles of the clock (clkup_p).

Therefore, in the cycle T7, the following data is generated.

data1=11_11111000_00000111
FLTR=11111100_00000011
edge_f=-0000010_00000000
edge_r=-0000010_00000010
edges_f=-0000010_00000000
edges_r=-0000000_00000000
edgec_f[4:0]=1000M
edgec_r[4:0]=0000M In the cycle T7, "1" is detected at "edges_f[9]" that shifts leftward by two bits from the middle position of "edges_f [9:5]". That is, since "edgec_f[4]" is "1", the "edgebit" value becomes "+2", and a sft value of a next cycle T8 temporarily changes from "2" to "4" again. And, the cdiv value temporarily becomes "2" by adding "−1" to "3", and the range of the next cycle T8 decreases to three cycles of the clock (clkup_p).

Therefore, in the cycle T8, the following data is generated.

data1=00_00011111_11111000
FLTR=00001111_11111100
edge_f=-0000000_00100010
edge_r=-0001000_00000000
edges_f=-xxxx000_00000000
edges_r=-xxxx000_10000000
edgec_f[4:0]=M0000
edgec_r[4:0]=M0100

In the cycle T8, the middle edge is sampled in the same phase as that of the cycle T7. "1" is detected at "edges_r[7]" that is the middle bit of "edges_r[9:5]". That is, since "edgec_r[2]" is "1", the "edgebit" value becomes "0", and a sft value of a next cycle T9 returns to "2" that is the original one. And, the cdiv value becomes "3", and the range of the next cycle T9 returns to four cycles of the clock (clkup_p).

Therefore, in the cycle T9, the following data is generated.

data1=11_11111110_00011110
FLTR=11111111_00001111
edge_f=-0000000_10000000
edge_r=-0000000_00001000
edges_f=-xx00000_00100000
edges_r=-xx00000_00000010
edgec_f[4:0]=M0001
edgec_r[4:0]=M0000

In the cycle T9, "1" is detected at "edges_f[5]" that shifts rightward by two bits from the middle position of "edges_f [9:5]". That is, since "edgec_f[0]" is "1", the "edgebit" value becomes "−2", and a sft value in a next cycle T10 temporarily changes from the "2" that is the original one to "0". And, the cdiv value temporarily becomes "4" by adding "+1" to "3", and the range of the next cycle T10 increases to five cycles of the clock (clkup_p).

Therefore, in the cycle T10, the following data is generated.

data1=10_00011110_00000001
FLTR=10001111_00000000
edge_f=-1000000_10000000
edge_r=-0001000_00000000
edges_f=-0000000_10000000
edges_r=-0001000_00000000
edgec_f[4:0]=0010M
edgec_r[4:0]=0000M In the cycle T10, "1" is detected at "edges_f[7]" that is the middle bit of "edges_f[9:5]". That is, since "edgec_f[2]" is "1", the "edgebit" value becomes "0", and a sft value of a next cycle T11 returns to "2" that is the original one. And, the cdiv value becomes "3", and the range of the next cycle T11 returns to four cycles of the clock (clkup_p).

A waveform in the case in which the "H" period of the clock (clkup_p) contains the middle edge of the start bit is the same as the waveform of FIG. 21. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 21 is performed.

Figure 22:
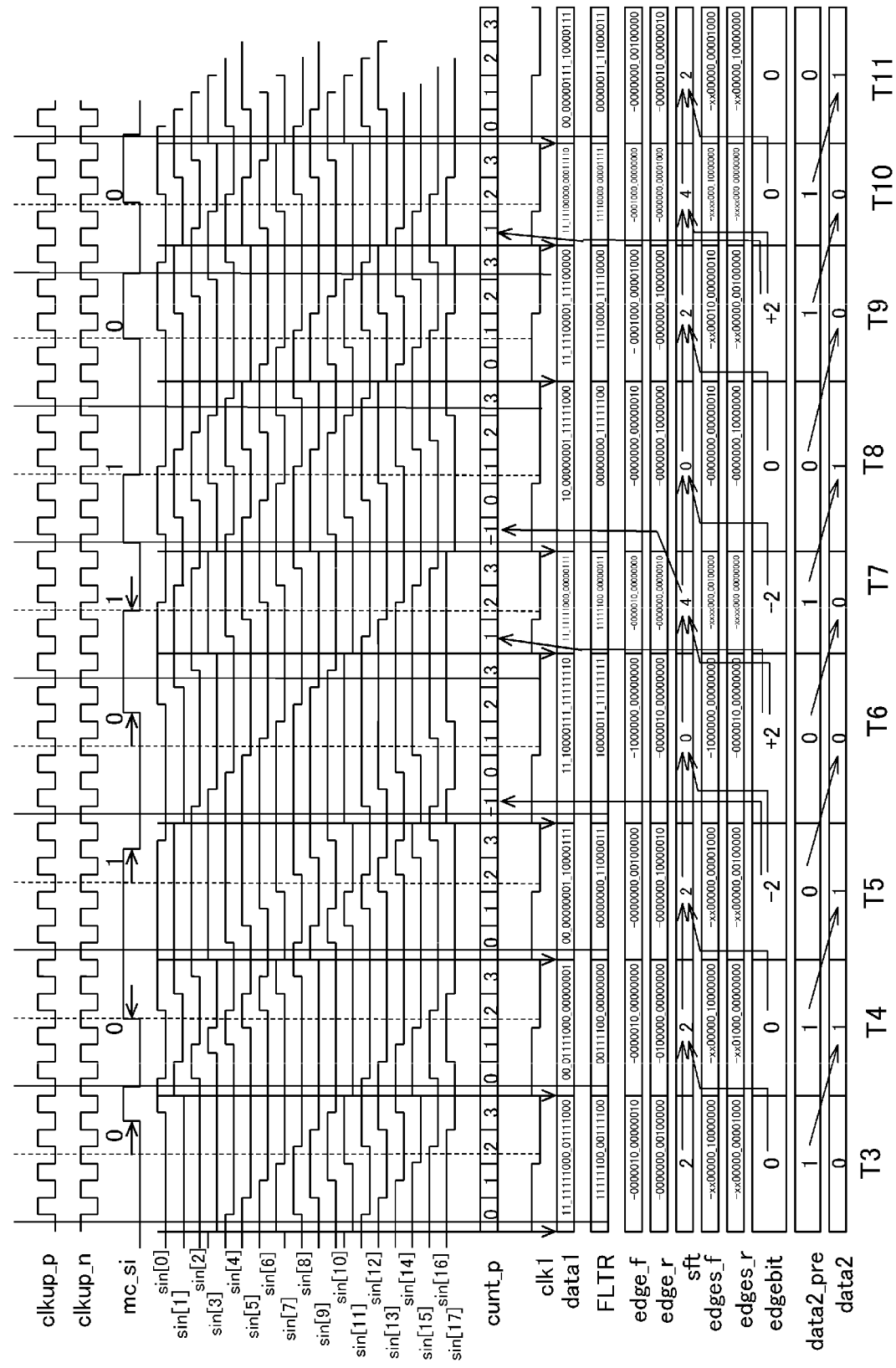
FIG. 22 is a timing chart showing the operation of the decoder according to the third working example.

FIG. 22 shows a waveform with the jitter delaying by ¼ of the bit cycle, in the case in which the "H" period of the clock (clkup_n) contains the middle edge of the start bit. A rightward arrow of the Manchester-coded signal (mc_si) indicates the edge delaying by ¼, and a leftward arrow of the same indicates an edge returning to the original one. The operations up to the cycle T4 are the same as those of FIG. 18. A cycle T5 is influenced by the jitter first.

In the cycle T5, the following data is generated.

data1=00_00000001_10000111
FLTR=00000000_11000011
edge_f=-0000000_00100000
edge_r=-0001000_10000000
edges_f=-xx00000_00001000
edges_r=-xx00000_00100000
edgec_f[4:0]=00000
edgec_r[4:0]=00001

In the cycle T5, "1" is detected at "edges_r[5]" that shifts rightward by two bits from the middle position of "edges_r [9:5]". That is, since "edgec_r[0]" is "1", the "edgebit" value becomes "−2", and a sft value of a next cycle T6 temporarily changes from "2" to "0". And, the cdiv value temporarily becomes "4" by adding "+1" to "3", and the range of the next cycle T6 increases to five cycles of the clock (clkup_p).

Therefore, in the cycle T6, the following data is generated.

data1=11_10000111_11111110

FLTR=10000011_11111111
edge_f=-1000000_00000000
edge_r=-0000010_00000000
edges_f=-1000000_00000000
edges_r=-0000010_00000000
edgec_f[4:0]=0000M
edgec_r[4:0]=1000M In the cycle T6, "1" is detected at "edges_r[9]" that shifts leftward by two bits from the middle position of "edges_r[9:5]". That is, since "edgec_r[4]" is "1", the "edgebit" value becomes "+2", and a sft value of a next cycle T7 temporarily changes from "2" to "4". And, the cdiv value temporarily becomes "2" by adding "−1" to "3", and the range of the next cycle T7 decreases to three cycles of the clock (clkup_p).

Therefore, in the cycle T7, the following data is generated.

data1=11_11111000_00000111
FLTR=11111100_00000011
edge_f=-0000010_00000000
edge_r=-0000000_00000010
edges_f=-xxxx000_00100000
edges_r=-xxxx000_00000000
edgec_f[4:0]=M0001
edgec_r[4:0]=M0000

In the cycle T7, "1" is detected at "edges_f[5]" that shifts rightward by two bits from the middle position of "edges_f[9:5]". That is, since "edgec_f[0]" is "1", the "edgebit" value becomes "−2", and a sft value of a next cycle T8 temporarily changes from "2" that is the original one to "0". And, the cdiv value temporarily becomes "4" by adding "+1" to "3", and the range of the next cycle T8 increases to five cycles of the clock (clkup_p).

Therefore, in the cycle T8, the following data is generated.

data1=10_00000001_11111000
FLTR=00000000_11111100
edge_f=-0000000_00000010
edge_r=-0000000_10000000
edges_f=-0000000_00000010
edges_r=-0000000_10000000
edgec_f[4:0]=0000M
edgec_r[4:0]=0010M In the cycle T8, the middle edge is sampled in the same phase as that of the cycle T7. "1" is detected at "edges_r[7]" that is the middle bit of "edges_r[9:5]". That is, since "edgec_r[2]" is "1", the "edgebit" value becomes "0", and a sft value of a next cycle T9 returns to "2" that is the original one. And, the cdiv value becomes "3", and the range of the next cycle T9 returns to four cycles of the clock (clkup_p).

Therefore, in the cycle T9, the following data is generated.

data1=11_11100001_11100000
FLTR=11110000_11110000
edge_f=-0001000_00000000
edge_r=-0000000_10000000
edges_f=-xx00010_00000000
edges_r=-xx00000_00100000
edgec_f[4:0]=10000
edgec_r[4:0]=00001

In the cycle T9, "1" is detected at "edges_f[9]" that shifts leftward by two bits from the middle position of "edges_f[9:5]". That is, since "edgec_f[4]" is "1", the "edgebit" value becomes "+2", and a sft value of a next cycle T10 temporarily changes from "2" to "4". And, the cdiv value temporarily becomes "2" by adding "−1" to "3", and the range of the next cycle T10 decreases to three cycles of the clock (clkup_p).

Therefore, in the cycle T10, the following data is generated.

data1=11_11100000_00011110
FLTR=11110000_00001111
edge_f=-0001000_00000000
edge_r=-0000000_00001000
edges_f=-xxxx000_10000000
edges_r=-xxxx000_00000000
edgec_f[4:0]=M0100
edgec_r[4:0]=M0000

In the cycle T10, "1" is detected at "edges_f[7]" that is the middle bit of "edges_f[9:5]". That is, since "edgec_f[2]" is "1", the "edgebit" value becomes "0", and a sft value of a next cycle T11 returns to "2" that is the original one. And, the cdiv value becomes "4", and the range of the next cycle T11 returns to four cycles of the clock (clkup_p).

A waveform in the case in which the "H" period of the clock (clkup_p) contains the middle edge of the start bit is the same as the waveform of FIG. 22. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 22 is performed.

Figure 23:
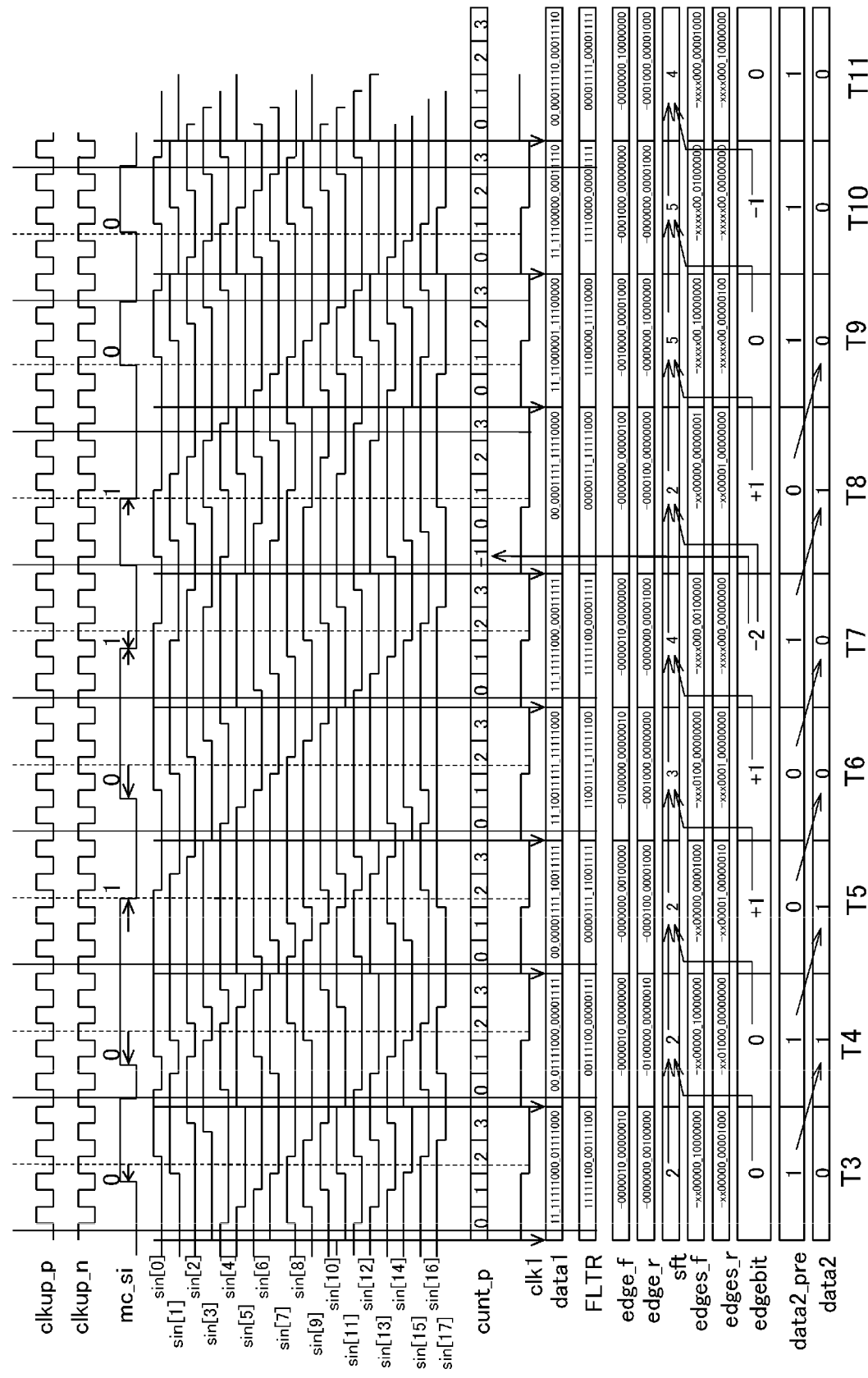
FIG. 23 is a timing chart showing the operation of the decoder according to the third working example.

FIG. 23 shows a waveform with the jitter advancing by ¼ of the bit cycle but changing by ⅛ cycle during two cycles, in the case in which the "H" period of the clock (clkup_n) contains the middle edge of the start bit. A leftward arrow of the Manchester-coded signal (mc_si) indicates the edge advancing by ⅛ or ¼ because of the jitter, and a rightward arrow of the same indicates an edge returning to the original one by ⅛ or ¼. The operations up to the cycle T4 are the same as those of FIG. 18. A cycle T5 is influenced by the jitter first.

In the cycle T5, the following data is generated.

data1=00_00001111_10011111
FLTR=00000111_11001111
edge_f=-0000000_00100000
edge_r=-0000100_00001000
edges_f=-xx00000_00001000
edges_r=-xx00001_00000010
edgec_f[4:0]=00000
edgec_r[4:0]=01000

In the cycle T5, "1" is detected at "edges_r[8]" that shifts leftward by one bit from the middle position of "edges_r[9:5]". That is, since "edgec_r[3]" is "1", the "edgebit" value becomes "+1", and a sft value of a next cycle T6 changes from "2" to "3".

Therefore, in the cycle T6, the following data is generated.

data1=11_10011111_11111000
FLTR=11001111_11111100
edge_f=-0100000_00000010
edge_r=-0001000_00000000
edges_f=-xxx0100_00000000
edges_r=-xxx0001_00000000
edgec_f[4:0]=M0000
edgec_r[4:0]=M1000

In the cycle T6, the determination is made in the jitter secondly-advancing by ¼ cycle. "1" is detected at "edges_r[8]" that shifts leftward by one bit from the middle position of "edges_r[9:5]". That is, since "edgec_r[3]" is "1", the "edgebit" value becomes "+1", and a sft value of a next cycle T7 changes from "3" to "4".

Therefore, in the cycle T7, the following data is generated.

data1=11_11111000_00011111
FLTR=11111100_00001111
edge_f=-0000010_00000000
edge_r=-0000000_00001000
edges_f=-xxxx000_00100000
edges_r=-xxxx000_00000000
edgec_f[4:0]=M0001
edgec_r[4:0]=M0000

In the cycle T7, the determination is made in a case of return by the first ⅛ cycle at one time. "1" is detected at "edges_f[5]" that shifts rightward by two bits from the middle position of "edges_f[9:5]". That is, since "edgec_f[0]" is "1", the "edgebit" value becomes "−2", and a sft value of a next cycle T8 temporarily changes from "4" to "2". And, the cdiv value temporarily becomes "4" by adding "+1" to "3", and the range of the next cycle T8 increases to five cycles of the clock (clkup_p). Therefore, in the cycle T8, the following data is generated.

data1=00_00001111_11110000
FLTR=00000111_11111000
edge_f=-0000000_00000100
edge_r=-0000100_00000000
edges_f=-xx00000_00000001
edges_r=-xx00001_00000000
edgec_f[4:0]=0000M
edgec_r[4:0]=0100M In the cycle T8, the determination is made in a case of return by the second ⅛ cycle. "1" is detected at "edges_r[8]" that shifts leftward by one bit from the middle position of "edges_r[9:5]". That is, since "edgec_r[3]" is "1", the "edgebit" value becomes "+1", and a sft value of a next cycle T9 changes from "4" that is the original one to "5". And, the cdiv value becomes "3", and the range of the next cycle T9 returns to four cycles of the clock (clkup_p).

Therefore, in the cycle T9, the following data is generated.

data1=11_11000001_11100000
FLTR=11100000_11110000
edge_f=-0010000_00001000
edge_r=-0000000_10000000
edges_f=-xxxxx00_10000000
edges_r=-xxxxx00_00000100
edgec_f[4:0]=M0100
edgec_r[4:0]=M0000

In the cycle T9, "1" is detected at "edges_f[7]" that is the middle position of "edges_f[9:5]". That is, since "edgec_f[2]" is "1", the "edgebit" value becomes "0", and a sft value of a next cycle T10 does not change and is still "5". The cdiv value does not change and is still "3", and the cycle T10 does not change and still corresponds to four cycles of the clock (clkup_p).

Therefore, in the cycle T10, the following data is generated.

data1=11_11100000_00011110
FLTR=11110000_00001111
edge_f=-0001000_00000000
edge_r=-0000000_00001000
edges_f=-xxxxx00_01000000
edges_r=-xxxxx00_00000000
edgec_f[4:0]=M0010
edgec_r[4:0]=M0000

In the cycle T10, "1" is detected at "edges_f[6]" that shifts rightward by one bit from the middle position of "edges_f[9:5]". That is, since "edgec_f[1]" is "1", the "edgebit" value becomes "−1", and a sft value of a next cycle T11 changes from "5" to "4".

A waveform in the case in which the "H" period of the clock (clkup_p) contains the middle edge of the start bit is the same as the waveform of FIG. 23. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 23 is performed.

Figure 24:
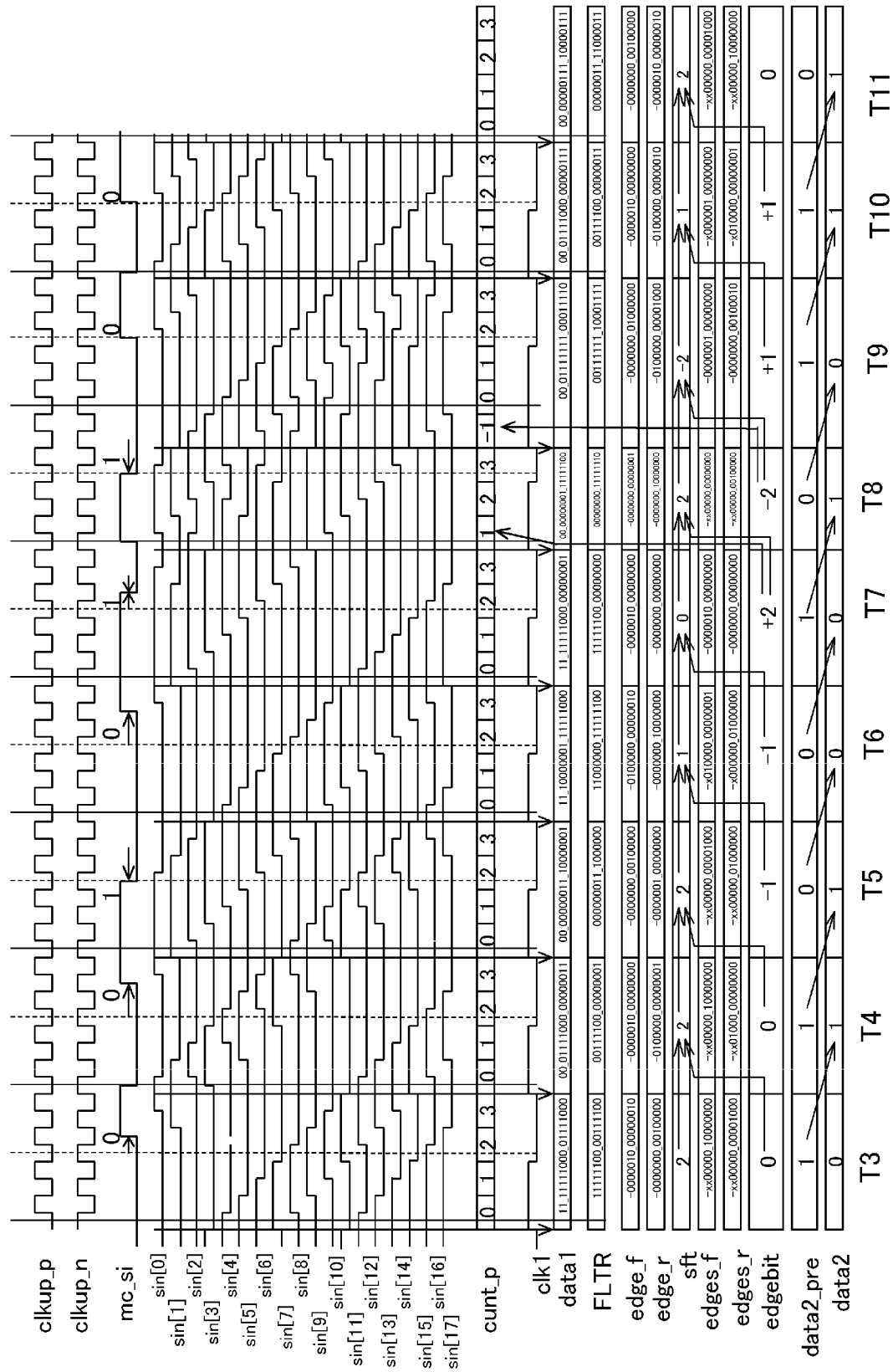
FIG. 24 is a timing chart showing the operation of the decoder according to the third working example.

FIG. 24 shows a waveform with the jitter delaying by ¼ of the bit cycle but changing by ⅛ cycle during two cycles, in the case in which the "H" period of the clock (clkup_n) contains the middle edge of the start bit. A rightward arrow of the Manchester-coded signal (mc_si) indicates the edge delaying by ⅛ or ¼ because of the jitter, and a leftward arrow of the same indicates an edge returning by ⅛ or ¼. The operations up to the cycle T4 are the same as those of FIG. 18. A cycle T5 is influenced by the jitter first.

In the cycle T5, the following data is generated.

data1=00_00000011_10000001
FLTR=00000001_11000000
edge_f=-0000000_00100000
edge_r=-0000001_00000000
edges_f=-xx00000_00001000
edges_r=-xx00000_01000000
edgec_f[4:0]=00000
edgec_r[4:0]=00010

In the cycle T5, the determination is made in a case of return by the first ¼ cycle at one time. "1" is detected at "edges_r[6]" that shifts rightward by one bit from the middle position of "edges_r[9:5]". That is, since "edgec_r[1]" is "1", the "edgebit" value becomes "−1", and a sft value of a next cycle T6 changes from "2" to "1".

Therefore, in the cycle T6, the following data is generated.

data1=11_10000001_11111000
FLTR=11000000_11111100
edge_f=-0100000_00000010
edge_r=-0000000_10000000
edges_f=-x010000_00000001
edges_r=-x000000_01000000
edgec_f[4:0]=0000M
edgec_r[4:0]=0001M In the cycle T6, the determination is made in an edge delaying by the second ¼ cycle. "1" is detected at "edges_r[6]" that shifts rightward by one bit from the middle position of "edges_r[9:5]". That is, since "edgec_f[1]" is "1", the "edgebit" value becomes "−1", and a sft value of a next cycle T7 changes from "1" to "0".

Therefore, in the cycle T7, the following data is generated.

data1=11_11111000_00000001
FLTR=11111100_00000000
edge_f=-0000010_00000000
edge_r=-0000000_00000000
edges_f=-0000010_00000000
edges_r=-0000000_00000000
edgec_f[4:0]=1000M
edgec_r[4:0]=0000M In the cycle T7, the determination is made in a case of return by ⅛ cycle. "1" is detected at "edges_f[9]" that shifts leftward by two bits from the middle position of "edges_f[9:5]". That is, since "edgec_f[4]" is "1", the "edgebit" value becomes "+2", and a sft value of a next cycle T8 temporarily changes from "0" to "2". And, the cdiv value temporarily becomes "2" by adding "−1" to "3", and the range of the next cycle T10 decreases to three cycles of the clock (clkup_p).

Therefore, in the cycle T8, the following data is generated.
data1=00_00000001_11111100
FLTR=00000000_11111110
edge_f=−0000000_00000001
edge_r=−0000000_10000000
edges_f=−xx00000_00000000
edges_r=−xx00000_00100000
edgec_f[4:0]=M0000
edgec_r[4:0]=M0001

In the cycle T8, the determination is made in a case of return by the next ¼ cycle. "1" is detected at "edges_r[5]" that shifts rightward by two bits from the middle position of "edges_r[9:5]". That is, since "edgec_r[0]" is "1", the "edgebit" value becomes "−2", and a sft value of a next cycle T9 temporarily changes from "0" that is the original one to "−2". And, the cdiv value temporarily becomes "4" by adding "+1" to "3", and the range of the next cycle T9 increases to five cycles of the clock (clkup_p).

Therefore, in the cycle T9, the following data is generated.
data1=00_01111111_00011110
FLTR=00111111_10001111
edge_f=−0000000_01000000
edge_r=−0100000_00001000
edges_f=−0000001_00000000
edges_r=−0000000_00100010
edgec_f[4:0]=0100M
edgec_r[4:0]=0000M In the cycle T9, "1" is detected at "edges_f[8]" that shifts leftward by one bit from the middle position of "edges_f[9:5]". That is, since "edgec_f[3]" is "1", the "edgebit" value becomes "+1", and a sft value of a next cycle T10 changes from "0" that is the original one to "1". And, the cdiv value becomes "3", and the range of the next cycle T10 returns to four cycles of the clock (clkup_p).

Therefore, in the cycle T10, the following data is generated.
data1=00_01111000_00000111
FLTR=00111100_00000011
edge_f=−0000010_00000000
edge_r=−0000000_00000010
edges_f=−x000001_00000000
edges_r=−x000000_00000001
edgec_f[4:0]=M1000
edgec_r[4:0]=M0000

In the cycle T10, "1" is detected at "edges_f[8]" that shifts leftward by one bit from the middle position of "edges_f[9:5]". That is, since "edgec_f[3]" is "1", the "edgebit" value becomes "+1", and a sft value of a next cycle T11 changes from "1" to "2".

A waveform in the case in which the "H" period of the clock (clkup_p) contains the middle edge of the start bit is the same as the waveform of FIG. 24. Although the waveforms of the odd bit and the even bit of the "sin[*]" are switched, an order in the sampled "data1" is corrected by the clock (clk1), the timing of which is the same as that of the clock (clkup_p). After the "data1", the same operation as that of FIG. 24 is performed.

In comparison with the first and second working examples, the third working example includes only the shift flip flop 151a as the circuit that operates at the high-speed sampling clock, and includes no calculators for the addition, the shift, the comparison and others that operate at the high-speed sampling clock. Therefore, the operation at the higher frequency and higher baud rate than those of the first and second working examples is achieved. In other words, in the case of the same frequency and baud rate, the operation is achieved at a lower power by an inexpensive manufacturing technique without microfabrication.

Fourth Working Example

Figure 25:
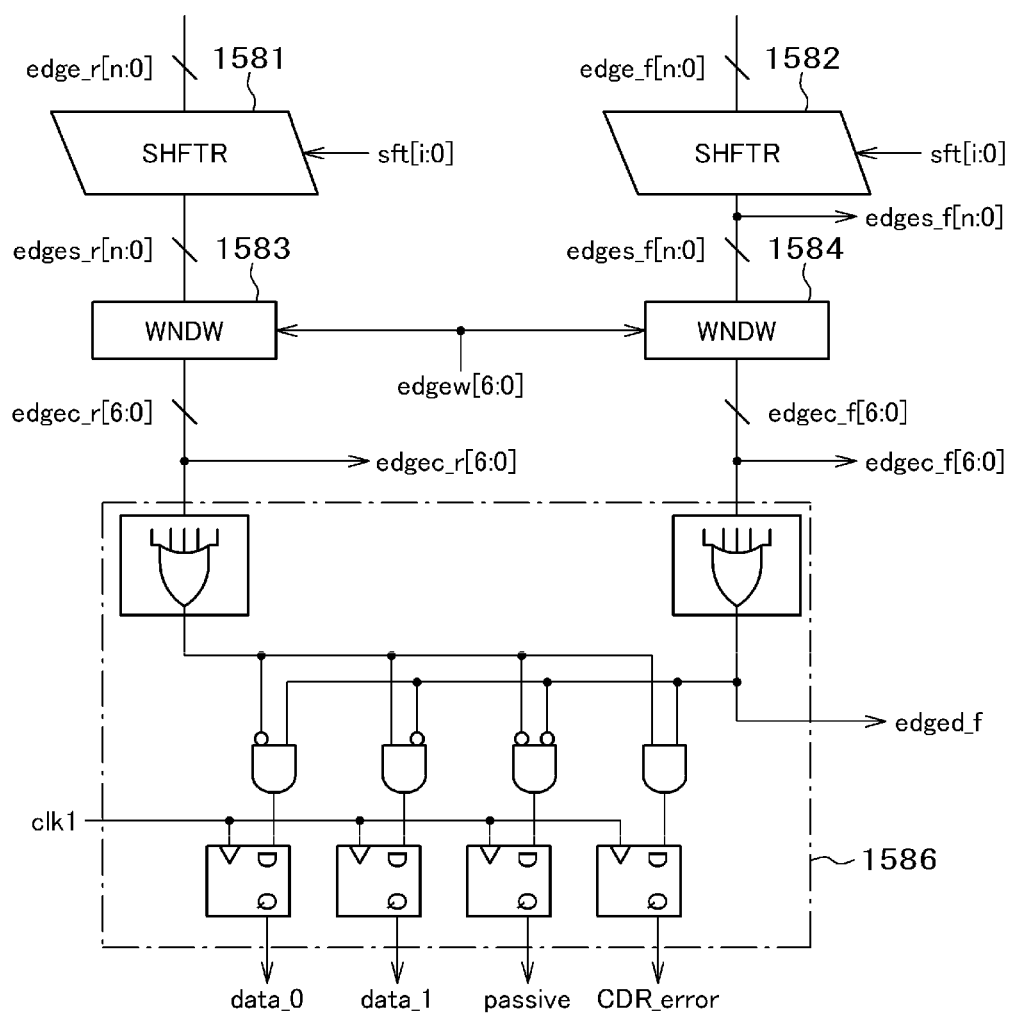
FIG. 25 is a block diagram showing a part of a configuration of an edge recognition circuit according to a fourth working example.
Figure 26:
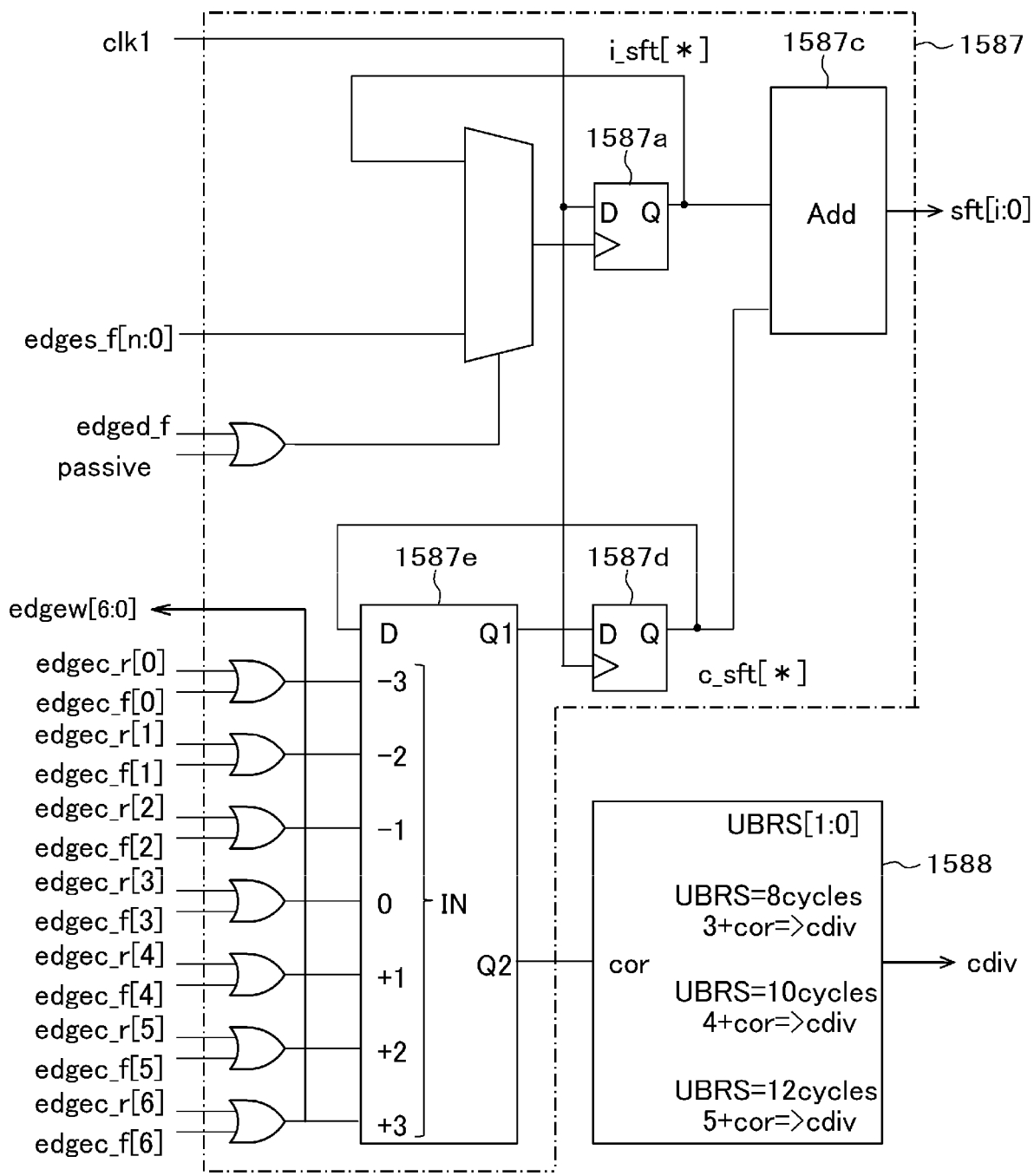
FIG. 26 is a block diagram showing a part of the configuration of the edge recognition circuit according to the fourth working example.

FIG. 25 is a block diagram showing a part of a configuration of an edge recognition circuit according to a fourth working example. FIG. 26 is a block diagram showing a part of a configuration of the edge recognition circuit according to the fourth working example. FIG. 27 is a truth-value table of a correction circuit shown in FIG. 26.

A configuration of a decoder 150 according to the fourth working example is the same as the configuration of the third working example except for an edge recognition circuit 158. Therefore, explanation for the synchronization circuit (SYNC) 151, the noise filter (FLTR) 152, the edge detection circuit (EDC) 153 and the clock generation circuit (CG) 157 will be omitted.

The edge recognition circuit 158 according to the fourth working example includes shift circuits (SHFTR) 1581 and 1582 and window cutout circuits (WNDW) 1583 and 1584. The shift circuits 1581 and 1582 are the same in the configuration and perform the same operations as the configuration and operations of the shift circuits 1581 and 1582 according to the third working example.

While the window cutout circuit 1583 will be explained below, the window cutout circuit 1584 operates as similar to the window cutout circuit 1583. The window cutout circuit 1583 extracts 7 bits from the "edges_r[n:0]", and sets "edgec_r[7:0]" that is the middle-edge detection range. The middle-edge detection range according to the fourth working example is wider than that of the third working example. The window cutout circuit 1583 corrects the middle-edge detection range (edgec_r[6:0]) on the basis of the middle-edge position (edgec_r) of the previous cycle.

More specifically, if the middle-edge position (edgec_r) of the previous cycle is at a high-order bit of the middle-edge detection range (edgec_r[6:0]), the window cutout circuit 1583 masks the high-order bit (bit [5] or bit [6]). In this process, the high-order bit is a bit [4], the bit [5] or the bit [6]. That is, the bit [4:0] of the middle-edge detection range (edgec_r[6:0]) is set to the edge detection range. If the middle-edge position (edgec_r) of the previous cycle is at a low-order bit of the middle-edge detection range (edgec_r [6:0]), the window cutout circuit 1583 masks the low-order bit (bit [0] or bit [1]) of the middle-edge detection range (edgec_r[6:0]). In this process, the low-order bit is the bit [0], the bit [1] or a bit [2]. That is, the bit [6:2] of the middle-edge detection range (edgec_r[6:0]) is set to the edge detection range. If the middle-edge position (edgec_r) of the previous cycle is at another bit (bit [3]), the bit to be masked is not changed, in other words, the bit to be masked is set to be the same as the masked bit of the previous cycle.

As shown in FIG. 25, the edge recognition circuit 158 further includes a data detection circuit 1586. The data detection circuit 1586 is the same in the configuration and performs the same operations as the configuration and operations of the data detection circuit 1586 according to the third working example.

As shown in FIG. 26, the edge recognition circuit 158 further includes a shift-amount generation circuit 1587 and a clock control circuit 1588.

The shift-amount generation circuit 1587 includes a flip flop 1587a that stores an initial shift value (i_sft[*]) at the time of frame start and a flip flop 1587d that stores a correction shift value (c_sft[*]). At the time of the detection of the first fall edge in the frame, the "edges_f[n:0]" contains "1". This is set to be an initial value, and a bit value at which "1" exists in the "edges_f[n:0]" is input to the flip flop 1587a. That is, an initial value of the i_sft[*] corresponds to a phase difference between the clock superimposed on the Manchester-coded signal (mc_si) at the time of frame start and the clock (clk1) having the same frequency and generated in the decoder 150 at the time of frame start.

The correction shift value (c_sft[*]) is a correction value in the reception of the frame. An adder 1587c calculates the sft[*] value indicating the shift amount by adding the correction shift value (c_sft[*]) to the initial shift value (i_sft[*]) at the time of frame start.

The shift-amount generation circuit 1587 further includes a correction circuit 1587e. The correction circuit 1587e has a terminal "D" to which a bit shift value (correction shift value) of the previous cycle is input and terminals "IN (−3, −2, −1, 0, +1, +2, +3)" to which the "edgec_r[6:0]" or the "edgec_f[6:0]" is input. The "edgec_r[6:0]" or the "edgec_f[6:0]" is referred to as edge correction input, and "1" is input to any one of the seven terminals IN. The correction circuit 1587e further has a terminal "Q1" from which a next bit shift value (correction shift value) is output and a terminal "Q2" from which a counter correction vale is output. The correction circuit 1587e uses the data that is input to the terminals IN and D, and outputs the data from the terminals Q1 and Q2 in accordance with a truth-value table shown in FIG. 20.

That is, in a case of shift by one cycle of the clock (clkup_p/clkup_n) of 800 MHz because of the jitter, if the data has not been previously corrected (c_sft[*]=0), "−1" or "+1" is taken as the input to the terminal IN, and "0" is input to the terminal D. At this time, "−1" or "+1" is output from the terminal Q1. Therefore, the next correction shift value (c_sft[*]) becomes "−1" or "+1". If the data has been already corrected (c_sft[*]=−1 or +1), "−1" or "+1" is taken as the input to the terminal IN, and "−1" or "+1" is input to the terminal D. At this time, "0" is output from the terminal Q1. Therefore, the next correction shift value (c_sft[*]) becomes "0" (meaning no correction).

The clock control circuit 1588 generates a signal (cdivc) for use in controlling a frequency dividing ratio of the clock generation circuit 157 as similar to the clock control circuit 1588 according to the third working example. A frequency dividing ratio of the frequency (400 MHz) of the clock (clkup_p) and a baud rate (100 MHz) is normally set. That is, in the "division-by-four" case, the cdiv value becomes "3". However, the clock control circuit 1588 temporarily increases/decreases this value on the basis of the counter correction value that is input from the terminal Q1 of the correction circuit 1587e.

In this process, if the signs of the edge correction input and the previous correction shift value are the same as each other, this means shifting by one cycle of 400 MHz, and therefore, the range of the clock (clk1) temporarily increases/decreases by one cycle of the clock (clkup_p) of 400 MHz. This control is based on the counter correction value that is input to a terminal "cor" of the clock control circuit 1588, and the cdiv value is generated by addition of the counter correction value to a value ("3" in the "division-by-four" case) that is determined by the frequency dividing ratio.

In a case of shift by two cycles of the clock (clkup_p/clkup_n) of 800 MHz, only the cdiv value is adjusted without the change of the c_sft[*] value. In a case of shift by three cycles of the clock (clkup_p/clkup_n) of 800 MHz, both the cdiv value and the c_sft[*] value are adjusted.

Note that the clock control circuit 1588 includes two-bit register UBRS [1:0] as similar to the third working example. The "division-by-four" (8 cycles), "division-by-five" (10 cycles) and "division-by-six" (12 cycles) can be set as the frequency dividing ratio in the register UBRS [1:0]. In the "division-by-five" case, the cdiv value normally becomes "4", and the cdiv value is adjusted to be added with the counter correction value. In the "division-by-six" case, the cdiv value normally becomes "5", and the cdiv value is adjusted to be added with the counter correction value.

The clock generation circuit 157 generates the clock (clk1) by dividing the frequency of the clock (clkup_p) by the cdiv value as similar to the third working example.

Figure 28:
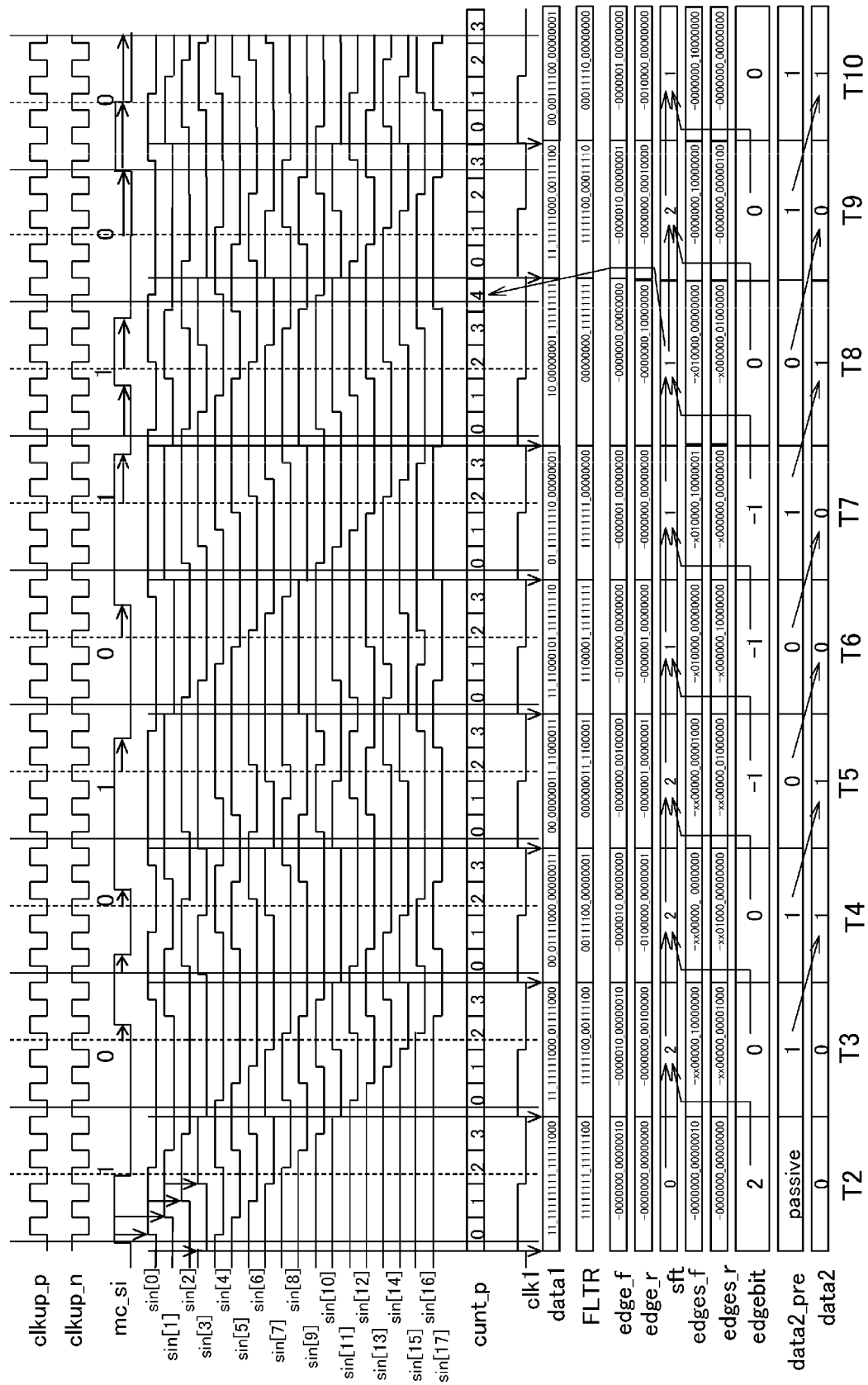
FIG. 28 is a timing chart showing an operation of a decoder according to the fourth working example.

An operation of the decoder according to the fourth working example will be explained with reference to FIG. 28. FIG. 28 is a timing chart showing the operation of the decoder according to the fourth working example. Each of FIGS. 18 to 24 is the timing chart showing the operations according to the third working example, and the same operations are also performed in the fourth working example.

FIG. 28 shows a waveform in a case of a transmission frequency that is slightly later than a reception frequency. A rightward arrow of the Manchester-coded signal (mc_si) indicates a waveform that is delayed by the later transmission frequency.

The first edge is detected in the sampling in the cycle T2, and the following data is generated in the cycle T2.

data1=11_11111111_11111000
FLTR=11111111_11111100
edge_f=−0000000_00000010
edge_r=−0000000_00000000

In the first sampling, the value of the flip flop 1587a is cleared to be "0" by an input signal to a not-illustrated clear terminal of the flip flop 1587a, and the i_sft value becomes "0". And, the value of the flip flop 1587d is cleared to be "0" by an input signal to a not-illustrated clear terminal of the flip flop 1587d, and the c_sft value becomes "0". Therefore, since the sft value is "0", the "edge_f=edges_f" is established. A bit at which the edge is detected at this time is the "edges_f[1]", and therefore, the detection bit of the "edge_f" becomes "2". Thus, "2" is set as the initial i_sft value at the flip flop 1587a. And, the c_sft value does not change and is "0". Therefore, a sft value of a next cycle T3 becomes "2". The "data2_pre" of the cycle T2 corresponds to the edge detection after the "passive" of the cycle T1, and therefore, becomes the "passive".

In cycles after the cycle T3, the shift circuits 1581 and 1582 generate the "edge_f" and the "edge_r" by shifting the "edges_f" and the "edges_r" by the sft value, respectively. The shift circuits 1581 and 1582 shift them rightward if the sft value is positive, and shift them leftward if the sft value is negative. The shift-amount generation circuit 1587 generates a sft value of a next cycle by adding the c_sft value of the previous cycle to the i_sft value of the previous cycle. The middle-edge detection range (edgec_r[6:0] and edgec_f[6:0]) corresponds to edges_r[10:4] and edges_f[10:4].

For example, in the cycle T3, the following data is generated.

data1=11_11111000_01111000
FLTR=11111100_00111100
edge_f=−0000010_00000010
edge_r=−0000000_00100000
edges_f=−xx00000_10000000 edges_r=−xx00000_00001000
edgec_f[6:0]=0001000
edgec_r[6:0]=0000000

In the cycle T3, "edges_f[7]" that is the middle position of "edges_f[10:4]" is "1". That is, since "edgec_f[3]" is "1" while the c_sft value of the previous cycle T2 is "0", the "c_sft value=0" is established on the basis of the truth-value table shown in FIG. 27. Since "1" is detected in the "edges_f", the data_1 value becomes "1", the data2_pre value becomes "1", and the data2 value of the next cycle T4 becomes "1".

The cycle T5 is influenced by the delay first. In the cycle T5, the following data is generated.
data1=00_00000011_11000111
FLTR=00000011_11000001
edge_f=−0000000_00100000
edge_r=−0000001_00000001
edges_f=−xx00000_00001000
edges_r=−xx0000_01000000
edgec_f[6:0]=0000000
edgec_r[6:0]=0000100

In the cycle T5, "edges_r[6]" that shifts rightward by one bit from the middle position of "edges_r[10:4]" is "1". That is, "edgec_r[2]" is "1", the c_sft value of the previous cycle T4 is "0", and therefore, a c_sft value becomes "−1" on the basis of the truth-value table shown in FIG. 27. Since the i_sft value is "2", a sft value of a next cycle T6 changes from "2" to "1". Since the "edgec_r[3]" is "1", the window cutout circuit 1583 masks the lowest-order bits (bit [0] and bit [1]) in the next cycle T6. That is, a bit [6:2] of the middle-edge detection range ("edgec_r[6:0]", "edgec_f[6:0]") is set to be the edge detection range.

Therefore, in the cycle T6, the following data is generated.
data1=11_11000101_11111110
FLTR=11100001_11111111
edge_f=−0100000_00000000
edge_r=−0000001_00000000
edges_f=−x010000_00000000
edges_r=−x000000_10000000
edgec_f[6:0]=00000MM
edgec_r[6:0]=00010MM In the cycle T6, "edges_r[7]" that is the middle position of "edges_r[10:4]" is "1". That is, "edgec_r[3]" is "1", the c_sft value of the previous cycle T5 is "−1", and therefore, a c_sft value becomes "−1" on the basis of the truth-value table shown in FIG. 27. Since the i_sft value is "2", a sft value of a next cycle T7 does not change and is "1".

Therefore, in the cycle T7, the following data is generated.
data1=01_11111110_00000001
FLTR=11111111_00000000
edge_f=−0000001_00000000
edge_r=−0000000_00000000
edges_f=−x010000_10000000
edges_r=−x000000_00000000
edgec_f[6:0]=00010MM
edgec_r[6:0]=00000MM In the cycle T7, "edges_f[7]" that is the middle position of "edges_f[10:4]" is "1". That is, "edgec_f[3]" is "1", the c_sft value of the previous cycle T6 is "−1", and therefore, a c_sft value becomes "−1" on the basis of the truth-value table shown in FIG. 27. Since the i_sft value is "2", a sft value of a next cycle T8 does not change and is "1".

Therefore, in the cycle T8, the following data is generated.
data1=10_00000001_11111111
FLTR=00000000_11111111
edge_f=−0000000_00000000
edge_r=−0000000_10000000
edges_f=−x010000_00000000
edges_r=−x000000_01000000
edgec_f[6:0]=00000MM
edgec_r[6:0]=00001MM In the cycle T8, "edges_r[6]" that shifts rightward by one bit from the middle position of "edges_r[10:4]" is "1". That is, "edgec_r[2]" is "1", the c_sft value of the previous cycle T7 is "−1", and therefore, a c_sft value becomes "0" on the basis of the truth-value table shown in FIG. 27. Since the i_sft value is "2", a sft value of a next cycle T9 changes from "1" to "2". Further, the c_sft value of the previous cycle T7 is "−1", and therefore, a counter correction value becomes "+1" on the basis of the truth-value table shown in FIG. 27. That is, the cdiv value becomes "4" by addition of "+1" to "3", the range of the cycle T8 increases to five cycles of the clock (clkup_p), and the cycles of the clock (clk1) are temporarily expanded.

In the third working example, if baud rate tolerance that is the difference between the reception and transmission frequencies occurs, the sft[*] value is continuously added/reduced, and therefore, a resource for supporting the continuation is necessary. The baud rate tolerance occurs in a case of incomplete match of the frequency between the clock superimposed on the Manchester-coded signal (mc_si) and the clock (clk1) having the same frequency and generated in the decoder. In the fourth working example, the correction value for the shift value is only ±1. Therefore, even if the baud rate tolerance occurs between the reception side and the transmission side, it is only necessary to prepare the sft[*] value and the c_sft[*] value depending on the number of samplings per cycle regardless of the frame length. Therefore, the fourth working example does not need the resource depending on the frame length, and thus, can support the operation by using the minimum resources in comparison with the third working example.

In the foregoing, the invention of the application made by the inventors has been concretely described on the basis of the embodiments and working examples. However, it is needless to say that the invention of the present application is not limited to the foregoing embodiments and working examples, and various modifications can be made.

For example, the explanation for the embodiments and working examples has been made in the case in which the logical value of the Manchester-coded signal is "1" in the shift from the high potential to the low potential in one time slot and the logical value of the same is "0" in the shift from the low potential to the high potential in one time slot. However, the embodiments and working examples are also applicable to the Manchester-coded signal having the logical value being "0" in the shift from the high potential to the low potential in one time slot or being "1" in the shift from the low potential to the high potential in one time slot.

What is claimed is:

1. A semiconductor device comprising:
a data reception circuit configured to receive data, the data including first data and second data, the first data being received at a first time, the second data being received at a second time; and
an edge recognition circuit configured to:
measure a first period taken from the reception of the first data to the reception of the second data;

determine, based on the measured first period, a data detection range within which an edge contained in the second data received by the data reception circuit is to be detected; and detect the edge contained in the determined data detection range.

2. The semiconductor device according to claim 1,
wherein the data received by the data reception circuit further includes third data,
wherein the first data, the second data, and the third data are sequentially received in this order by the data reception circuit, and
wherein the edge recognition circuit is configured to determine a data detection range within which an edge contained in the third data is detected, based on the first period and a predetermined interval.

3. The semiconductor device according to claim 2,
wherein, when the first period is shorter than the predetermined interval, the edge recognition circuit is configured to set the data detection range to be a range from the second time to a third time, and
wherein the third time is later than a time that is the first period after the second time.

4. The semiconductor device according to claim 3, wherein the edge recognition circuit is configured to set a beginning time of the data detection range into a period that starts from the second time and that is longer than the first period.

5. The semiconductor device according to claim 2,
wherein, when the first period is longer than the predetermined interval, the edge recognition circuit is configured to set the data detection range to be a range from the second time to a fourth time, and
wherein the fourth time is earlier than a time that is the first period after the second time.

6. The semiconductor device according to claim 5, wherein the edge recognition circuit is configured to set a beginning time of the data detection range to a period shorter than the first period counted from the second time.

7. The semiconductor device according to claim 2, wherein the edge recognition circuit is configured not to change the data detection range if the first period is equal to the predetermined interval.

8. The semiconductor device according to claim 2, wherein the edge recognition circuit is configured to determine the predetermined interval based on a value of a jitter and a value of a data cycle received by the data reception circuit.

9. The semiconductor device according to claim 1, wherein data that is received by the data reception circuit is an asynchronous Manchester-coded signal.

10. The semiconductor device according to claim 1,
wherein the edge recognition circuit includes a counter, and
wherein the counter is configured to be triggered by a middle edge serving as an edge indicating a data value of edges contained in the data received by the data reception circuit to measure time taken from the reception of the first data to the reception of the second data.

11. The semiconductor device according to claim 2, wherein the edge recognition circuit is configured to output an error when a plurality of edges are detected in a range in which an edge is detected, if a range of a first edge detection or a previous edge detection is not corrected.

12. The semiconductor device according to claim 11 further comprising:
a reception circuit having a reception buffer,
wherein the edge recognition circuit decodes and outputs the received data, and
wherein the reception circuit is configured not to update the reception buffer by the output data from the edge recognition circuit if receiving the error.

13. A semiconductor device comprising:
a data reception circuit configured to receive an asynchronous Manchester-coded signal; and
an edge recognition circuit configured to set an edge detection range in which an edge contained in the asynchronous Manchester-coded signal that is received by the data reception circuit is detected,
wherein the edge recognition circuit is configured to set a detection range for an edge of a next cycle based on a detection position of an edge of a previous cycle.

14. The semiconductor device according to claim 13, wherein the edge recognition circuit is configured to change the detection range for the edge of the next cycle by temporarily changing the number of samplings per bit when correction in a delay direction continues at the time of the detection of a plurality of continuous edges or when correction in an advance direction continues at the time of the detection of the plurality of continuous edges.

15. The semiconductor device according to claim 14, wherein the edge recognition circuit is configured to change the detection range for the edge of the next cycle by temporarily changing the number of samplings per bit when the correction in the delay direction continues without the correction in the advance direction for a certain time at the time of the detection of the plurality of continuous edges or when the correction in the advance direction continues without the correction in the delay direction for the certain time at the time of the detection of the plurality of continuous edges.

16. The semiconductor device according to claim 13,
wherein the data reception circuit includes:
a shift register configured to sample input data at a sampling period;
a clock generation circuit having a counter in synchronization with a clock for sampling the edge;
a data register configured to store the sampled input data of the shift register in parallel on the basis of a clock generated by the clock generation circuit; and
an edge detection circuit configured to detect an edge on the basis of an output of the data register,
wherein the edge recognition circuit includes:
a shifter configured to shift an output of the edge detection circuit; and
a window cutout circuit configured to cut out data inside an edge detection range from an output of the shifter, and
wherein the edge recognition circuit is configured to set a shift amount of the shifter and a cutout range of the window cutout circuit on the basis of a detection position of an edge of a previous cycle.

17. The semiconductor device according to claim 16, wherein the edge recognition circuit is configured to temporarily change the number of samplings per bit by setting a cycle of a clock generated by the clock generation circuit on the basis of the detection position of the edge of the previous cycle.

18. A decoding method comprising:
receiving first data;
receiving second data;
measuring time taken from the reception of the first data to the reception of the second data; and determining a data detection range in which an edge contained in later-received third data is detected, based on the measured time.

19. The decoding method according to claim 18,
wherein no change of the data detection range is set, advancement correction for setting an end of the data detection range to be early is set, or delay correction for setting a beginning of the data detection range to be late is set, and,
wherein if the advancement correction is performed to a previous cycle, a data detection range in an advancement direction is shortened in a next cycle.

20. The decoding method according to claim 19, wherein, if the delay correction is performed to the previous cycle, a data detection range in a delay direction is shortened in the next cycle.

* * * * *